(12) United States Patent
Suzuki et al.

(10) Patent No.: US 9,178,115 B2
(45) Date of Patent: Nov. 3, 2015

(54) SEMICONDUCTOR LIGHT EMITTING APPARATUS, IMAGE DISPLAYING APPARATUS, MOBILE TERMINAL, HEAD-UP DISPLAY APPARATUS, IMAGE PROJECTOR, HEAD-MOUNTED DISPLAY APPARATUS, AND IMAGE FORMING APPARATUS

(71) Applicant: Oki Data Corporation, Tokyo (JP)

(72) Inventors: Takahito Suzuki, Gunma (JP); Taishi Kaneto, Gunma (JP); Satoshi Tanaka, Gunma (JP); Kenichi Tanigawa, Gunma (JP)

(73) Assignee: OKI DATA CORPORATION, Tokyo (JP)

( * ) Notice: Subject to any disclaimer, the term of this patent is extended or adjusted under 35 U.S.C. 154(b) by 367 days.

(21) Appl. No.: 13/762,719

(22) Filed: Feb. 8, 2013

(65) Prior Publication Data

US 2013/0208026 A1 Aug. 15, 2013

(30) Foreign Application Priority Data

Feb. 10, 2012 (JP) ................................ 2012-027453
Feb. 10, 2012 (JP) ................................ 2012-027652

(51) Int. Cl.
*G09G 5/10* (2006.01)
*H01L 33/36* (2010.01)
*H01L 25/075* (2006.01)
*H01L 33/62* (2010.01)

(52) U.S. Cl.
CPC ............ *H01L 33/36* (2013.01); *H01L 25/0753* (2013.01); *H01L 33/62* (2013.01); *H01L 2224/48091* (2013.01); *H01L 2224/48137* (2013.01); *H01L 2224/48464* (2013.01); *H01L 2224/73265* (2013.01)

(58) Field of Classification Search
None
See application file for complete search history.

(56) References Cited

U.S. PATENT DOCUMENTS

| | | | |
|---|---|---|---|
| 2007/0146235 A1* | 6/2007 | Nolan et al. | 345/7 |
| 2008/0158686 A1* | 7/2008 | Chechelniker | 359/631 |
| 2009/0034285 A1* | 2/2009 | Lee et al. | 362/555 |
| 2010/0149153 A1* | 6/2010 | Yamamoto et al. | 345/211 |
| 2010/0320483 A1 | 12/2010 | Kadotani et al. | |
| 2011/0092005 A1* | 4/2011 | Horng et al. | 438/28 |
| 2011/0233587 A1 | 9/2011 | Unno | |

FOREIGN PATENT DOCUMENTS

| | | |
|---|---|---|
| DE | 10 2007 059 133 A1 | 6/2009 |
| EP | 1 553 641 A1 | 7/2005 |
| JP | 62-92488 | 4/1987 |
| JP | 11-150303 | 6/1999 |
| JP | 2002-141558 A | 5/2002 |
| JP | 2002-278481 A | 9/2002 |
| JP | 2007-517378 | 6/2007 |
| JP | 2008-112883 | 5/2008 |
| JP | 2008-235894 | 10/2008 |

(Continued)

*Primary Examiner* — Nicholas Lee
(74) *Attorney, Agent, or Firm* — Rabin & Berdo, P.C.

(57) ABSTRACT

A semiconductor light emitting apparatus includes a substrate. A plurality of first electrode wirings are formed on the surface of the substrate. At least one second electrode wiring is formed on the surface of the substrate. A light emitting section is connected between a corresponding one of the plurality of first electrode wirings and the at least one second electrode wiring. The light emitting section includes a plurality of light emitting elements.

19 Claims, 44 Drawing Sheets

(56) References Cited

FOREIGN PATENT DOCUMENTS

| JP | 2009-522803 | 6/2009 |
| JP | 2009-260311 | 11/2009 |
| JP | 2010-502000 | 1/2010 |
| JP | 2011-216868 | 10/2011 |
| JP | 2011-258917 | 12/2011 |
| WO | WO 2010146783 | 12/2010 |
| WO | WO 2011/122846 A2 | 10/2011 |

* cited by examiner

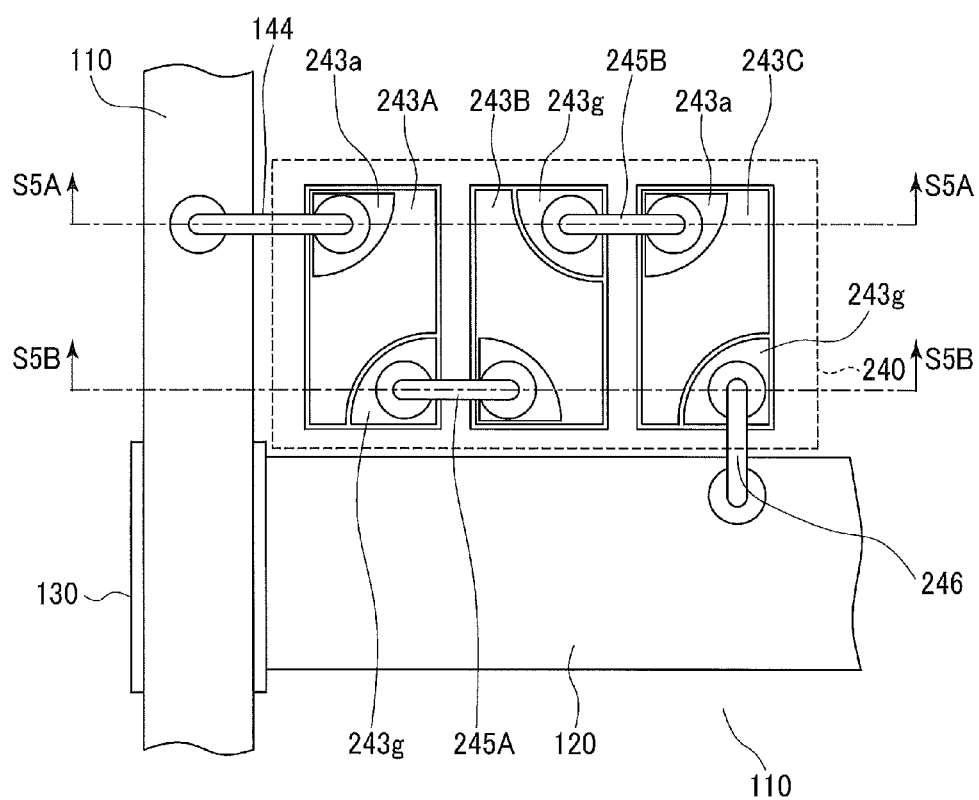

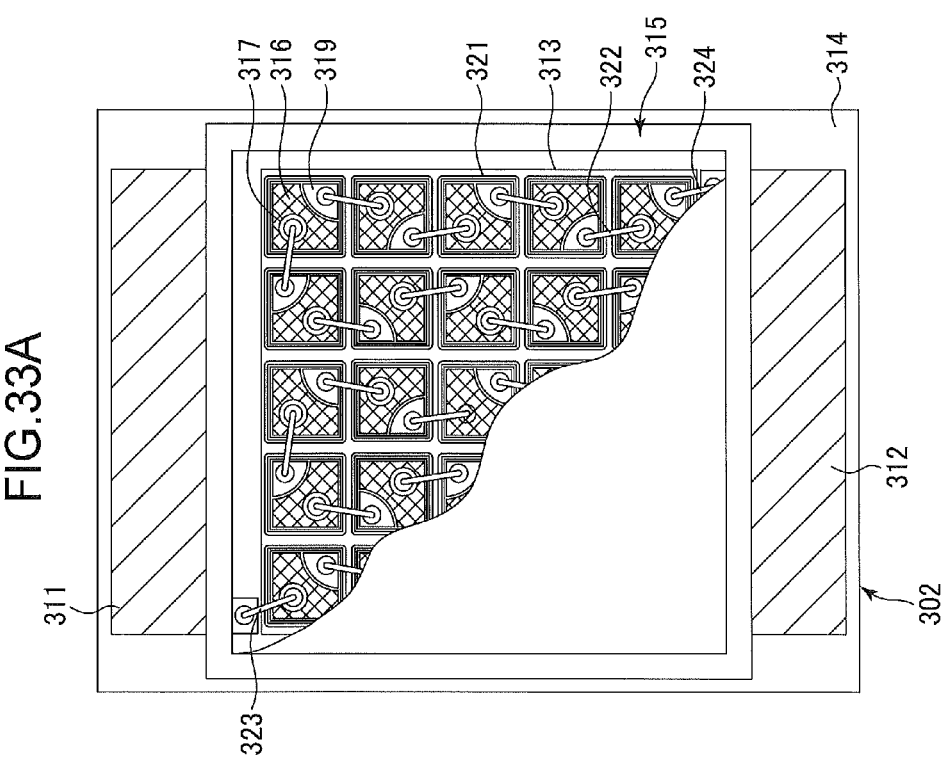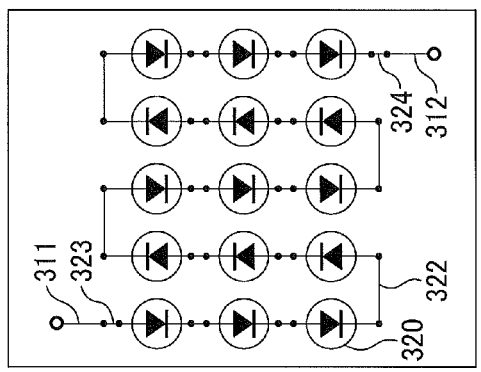

SEMICONDUCTOR LIGHT EMITTING APPARATUS, IMAGE DISPLAYING APPARATUS, MOBILE TERMINAL, HEAD-UP DISPLAY APPARATUS, IMAGE PROJECTOR, HEAD-MOUNTED DISPLAY APPARATUS, AND IMAGE FORMING APPARATUS

BACKGROUND OF THE INVENTION

1. Field of the Invention

The present invention relates to a semiconductor light emitting apparatus, an image displaying apparatus, a mobile terminal, a head-up display apparatus, an image projector, ahead mounted display apparatus, and an image forming apparatus.

2. Description of the Related Art

An existing semiconductor light emitting apparatus employs a plurality of light emitting diodes (LEDs) arranged in a one dimensional matrix or a two-dimensional matrix, each LED functioning as a minimum unit of an image, i.e., pixel. For example, the LEDs are integrated on a substrate, and are connected to wirings as first common electrodes and wirings as second common electrodes formed on the substrate. Each chip of LED is at a corresponding pixel position. One way of increasing light power of these LEDs is to increase the amount of injected current. However, larger currents flowing through the LEDs and the first and second wirings will seriously increase heat generated due to electrical resistances thereof. An increased amount of heat causes a decreased internal quantum efficiency of LED chips. Therefore, minimizing heat generation and dissipating heat efficiently are important factors in preventing temperature rise in the apparatus. Japanese Patent Publication No. 2002-278481 proposes a method for efficiently dissipating heat generated in a semiconductor light emitting apparatus. That is, a heat conductive material is prepared by kneading silicone rubber or epoxy resin with a metal oxide in powder form such as aluminum oxide or iron oxide, and is applied to the LED chips in intimate contact, thereby efficiently dissipating heat generated in the semiconductor light emitting apparatus.

However, the method disclosed in Japanese Patent Publication No. 2002-278481 suffers from the following drawbacks. If the light emitting chips have not a sufficient thickness or the surface of the light emitting chips has very good wettability, the heat conductive material climbs up to the upper surface of the light emitting chips, thereby blocking the light emitted from the light emitting chips, hence a decreased light extraction efficiency. The heat conductive material is usually applied using a dispenser. If the light emitting chips are densely integrated, the dispenser is required to dispense the heat conductive material very accurately. This increases the complexity of the manufacturing process, possibly decreasing the yield of the products.

SUMMARY OF THE INVENTION

The present invention was made to solve the aforementioned drawbacks.

An object of the invention is to minimizing heat generation from the light emitting sections when the light emitting sections are driven to emit required light power.

A semiconductor light emitting apparatus includes a substrate. A plurality of first electrode wirings are formed on the surface of the substrate. At least one second electrode wiring is formed on the surface of the substrate. A light emitting section is connected between a corresponding one of the plurality of first electrode wirings and the at least one second electrode wiring. The light emitting section includes a plurality of light emitting elements.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein:

FIG. 4 is a top view illustrating the outline of the configuration of a light emitting section which is a first modification to the light emitting section according to the first embodiment;

FIG. 33A is a top view illustrating a lamp type LED module according to a second modification to the twelfth embodiment;

FIG. 33B is a circuit symbol of the lamp type LED module shown in FIG. 33A;

DETAILED DESCRIPTION OF THE INVENTION

First Embodiment

Figure 1:
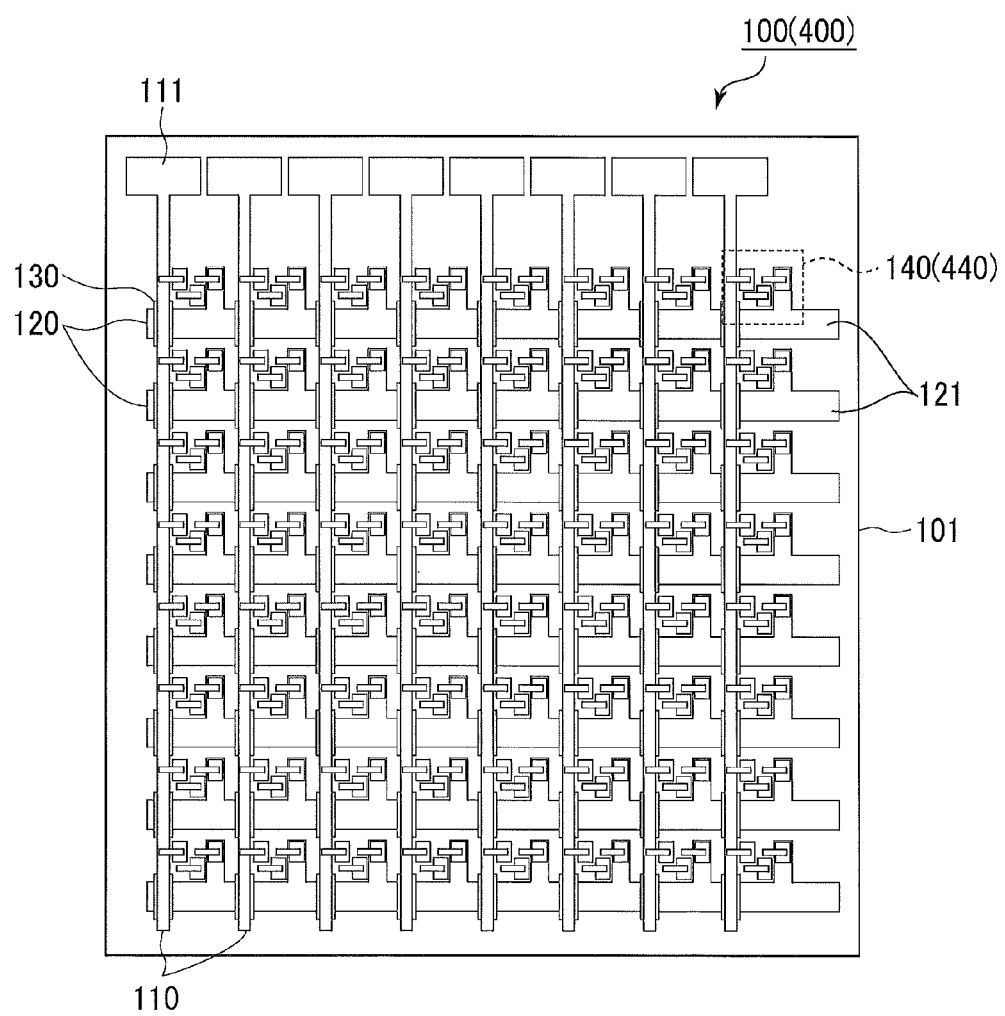
FIG. 1 is a top view illustrating the outline of a semiconductor light emitting apparatus according to a first embodiment.

FIG. 1 is a top view illustrating the outline of a semiconductor light emitting apparatus 100. The semiconductor light emitting apparatus 100 includes a substrate 101, a plurality of first electrode wirings 110 that extend vertically, a plurality of second electrode wirings 120 that extend horizontally, and a plurality of light emitting sections 140. Reference numerals in parentheses denote those in a second embodiment.

An integrated circuit is fabricated on the substrate 101 formed of, for example, glass or plastics. Alternatively, the substrate 101 may take the form of an electrically conductive substrate such as an Si substrate or a metal substrate that is coated with an inorganic insulating film such as $SiO_2$, SiN or $Al_2O_3$ or an organic insulating film such as epoxy, nobolak, or polyimide, thereby insulating the surface of the substrate 101.

The first electrode wirings 110 are formed by depositing a metal material, whose major composition is, for example, Au or Al, on the substrate 101 by photolithography, vapor deposition, or sputtering. A part of the first electrode wiring 110 serves as a first electrode wiring pad 111. Specifically, a part of each first electrode wiring 110 extends toward the outer edge of the substrate 101, and has the pad 111 at a location close to the perimeter of the substrate 101.

Likewise, the second electrode wirings 120 are formed by depositing a metal material, whose major composition is, for example, Au or Al, on the substrate 101 by a combination of photolithography, vapor deposition, and sputtering. A part of each second electrode wiring serves as a second electrode wiring pad 121. Specifically, a part of each second electrode wiring 120 extends toward the outer edge of the substrate 101, and has the pad 121 at a location close to the perimeter of the substrate 101.

Interlayer dielectric films 130 are formed at areas in which the first electrode wiring 110 and the second electrode wiring 120 intersect, electrically isolating the first and second electrode wirings from each other. The interlayer dielectric film 130 may be formed of an inorganic insulating film such as $SiO_2$, SiN or $Al_2O_3$ or an organic insulating film such as nobolak resin, acrylic resin or polyimide resin.

The light emitting sections 140 are arranged so that each light emitting section 140 is positioned at an intersection of the first electrode wiring 110 and the second electrode wiring 120, and serves as a minimum unit of an image, i.e., a pixel. The light emitting section 140 has a thickness greater than 300 μm. Each light emitting section 140 includes a plurality of LEDs connected in series, and is connected between the first electrode wiring 110 and the second electrode wiring 120.

Figure 2:
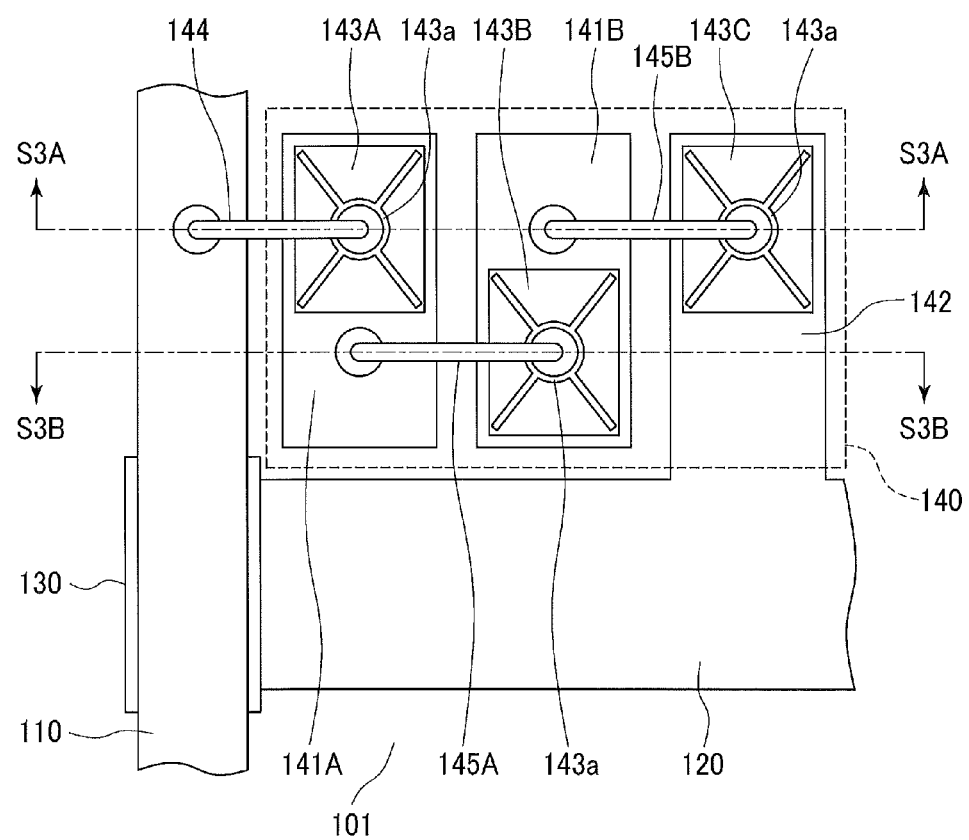
FIG. 2 is a top view illustrating the outline of a light emitting section.

FIG. 2 is a top view illustrating the outline of the light emitting section 140. The light emitting section 140 includes first die bond pads 141A and 141B, second die bond pad 142, bare chip LEDs 143A, 143B, and 143C, first bonding wire 144, and second bonding wires 145A and 145B. The first bonding wire 144 serves as a first connection for connecting the first electrode wiring 110 to the bare chip LED 143A at the most upstream end with respect to the flow of current through the light emitting section 140. The first die-bond pads 141A and 141B and the second bonding wires 145A and 145B serve as a second connection for connecting between adjacent bare chip LEDs 143. The second die bond pad 142 serves as a third connection for connecting the second electrode wiring 120 to the bare chip LED 143C at the most downstream end with respect to the flow of current.

The first die bond pads 141A and 141B are formed by depositing a metal material, whose major composition is, for example, Au or Al, on the substrate 101 by a combination of photolithography, vapor deposition, and sputtering. The first die bond pads 141A and 141B are not connected to the first electrode wiring 110, second electrode wiring 120, or other die bond pad.

By combining photolithography with vapor deposition or combining photolithography with sputtering, a metal material, whose major composition is Au or Al, is deposited on the substrate to form the second die bond pad 142. The second die bond pad 142 is continuous to the second electrode wiring 120. For example, the second die bond pad 142 is formed at the end of the second electrode wiring 120 when the second electrode wiring 120 is formed.

The bare chip LED 143A is disposed on the first die bond pad 141A, the bare chip LED 143B is disposed on the first die bond pad 141B, and the bare chip LED 143C is disposed on the second die bond pad 142. While each light emitting section 140 of the first embodiment includes three bare chip LEDs 143A-143C, at least two bare chip LEDs should be used.

Figure 3A:
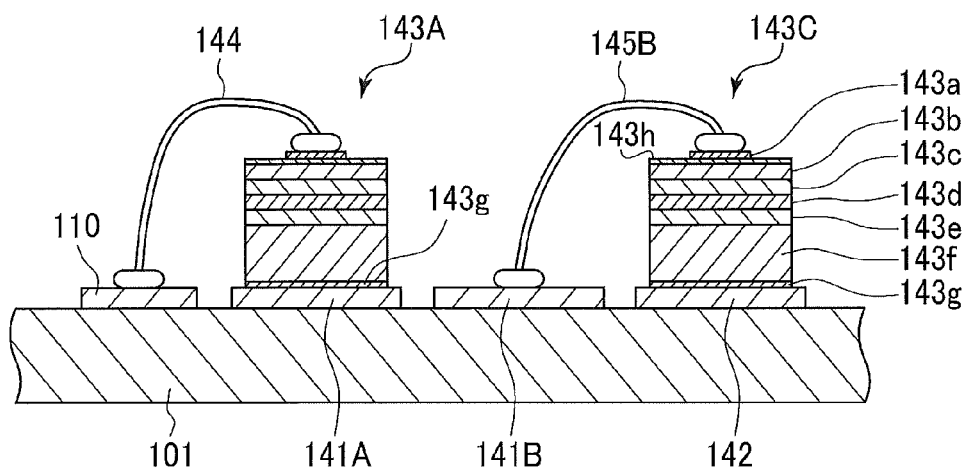
FIG. 3A is a general cross-sectional view taken along a line S3A-S3A in FIG. 2.
Figure 3B:
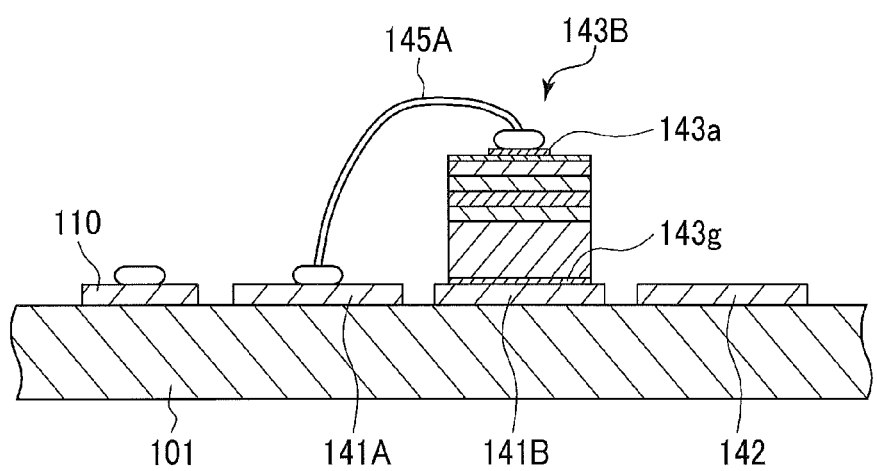
FIG. 3B is a general cross-sectional view taken along a line S3B-S3B in FIG. 2.

FIG. 3A is a general cross-sectional view taken along a line S3A-S3A in FIG. 2. FIG. 3B is a general cross-sectional view taken along a line S3B-S3B in FIG. 2.

Referring to FIGS. 3A and 3B, the bare chip LEDs 143A-143C each include at least a first electrode 143$a$, a first contact layer 143$b$, a first cladding layer 143$c$, a light emitting layer 143$d$, a second cladding layer 143$e$, a second contact layer 143$f$, and a second electrode 143$g$. The bare chip LEDs 143A-143C each may include a transparent conductive film 143$h$ between the first electrode 143$a$ and the second contact layer 143$b$, thereby allowing the current to diffuse efficiently.

The respective semiconductor layers of the bare chip LEDs 143A-143C can be grown by known metal organic chemical vapor deposition (MOCVD) or molecular beam epitaxy (MBE). The bare chip LEDs 143A-143C may be formed of a nitride material or a GaAs material. If the bare chip LEDs 143A-143C are formed of a nitride material, the first contact layer 143$b$ may be formed of, for example, p-GaN. The first cladding layer 143$c$ may be formed of p-$Al_xGa_{1-x}N$ ($0 \leq x \leq 1$). The light emitting layer 143$d$ may be of a multi-quantum well structure (MQW) in which a plurality of quantum wells are stacked, each quantum well including a well layer formed of $In_yGa_{1-y}N$ ($0 \leq y \leq 1$) and a barrier layer formed of $In_zGa_{1-z}N$ ($0 \leq z \leq 1$). The second cladding layer 143$e$ may be formed of n-$Al_{x1}Ga_{1-x1}N$ ($0 \leq x1 \leq 1$), and the second contact layer 143$f$ may be n-GaN. The transparent conductive film 143$h$ may be formed of indium tin oxide (ITO) or indium zinc oxide (IZO).

If the bare chip LEDs 143A-143C are formed of GaAs materials, the first contact layer 143$b$ may be formed of, for example, p-GaP, $(Al_yGa_{1-y})_{y1}In_{1-y1}As_{y2}P_{1-y2}$, or $(Al_zGa_{1-z})_{z1}In_{1-z1}As_{z2}P_{1-z2}$. The first cladding layer 143$c$ may be formed of p-$(Al_xGa_{1-x})_{x1}In_{1-x1}As_{x2}P_{1-x2}$ ($0 \leq x$, $x1 \leq 1$, $x+x1=1$, $0 \leq x2 \leq 1$). The light emitting layer 143$d$ may be of a multi-quantum well structure (MQW) in which a plurality of quantum wells are stacked, each quantum well including a well layer formed of $(Al_yGa_{1-y})_{y1}In_{1-y1}P$ ($0 \leq y$, $y1 \leq 1$, $y+y1=1$) ($0 \leq y$, $y1 \leq 1$, $y+y1=1$), and a barrier layer formed of $(Al_zGa_{1-z})_{z1}In_{1-z1}P$ ($0 \leq z, z1 \leq 1, z+z1=1$) ($0 \leq z, z1 \leq 1, z+z1=1$). The second cladding layer 143$e$ may be formed of n-$(Al_wGa_{1-w})_{w1}In_{1-w1}As_{w2}P_{1-w2}$ ($0 \leq w$, $w1 \leq 1$, $w+w1=1$, $0 \leq w2 \leq 1$), and the second contact layer 143$f$ may be n-GaAs. The transparent conductive film 143$h$ may be formed of ITO or IZO.

After the wafer process has completed, a dicing process or a cleavage process is performed on the wafer, thereby obtaining individual bare chips, i.e., the bare chip LEDs 143A-143C.

The second electrode 143$g$ of the bare chip LED 143A is die-bonded to the first die bond pad 141B. A die bonding is performed using a conductive paste: the second electrode 143$g$ of the bare chip LED 143A is die bonded to the first die bond pad 141A, the second electrode 143$g$ of the bare chip LED 143B is die bonded to the second die bond pad 141B, and the second electrode 143$g$ of the bare chip LED 143C is die bonded to the second die bond pad 142. Thus, the respective second electrodes 143$g$ are electrically connected to the corresponding second die bond pads. The first bonding wire 144 electrically connects the first electrode wiring 110 and the first electrode 143$a$ of the bare chip LED 143A. The second bonding wires 145A and 145B electrically connect between the first die bond pads 141A and 141B and the first electrode 143$a$ of the bare chip LEDs 143B and 143C, respectively. The light emitting section 140, constituted of a plurality of light emitting elements or light emitting diodes (LEDs), is configured as described above.

As described above, the semiconductor light emitting apparatus 100 employs the light emitting sections 140, each light emitting section 140 being constituted of a plurality of LEDs connected in series. This configuration is effective in reducing the amount of heat generated by the series-connected LEDs and the resistance of the wirings. This configuration is also effective in reducing the amount of heat generated by the driver circuits that drive the light emitting apparatus 100. Therefore, heat generation may be minimized in an integrated circuit that incorporates such driver circuits and the semiconductor light emitting sections 140. The semiconductor light emitting apparatus 100 incorporating the light emitting sections 140 implements a semiconductor light emitting apparatus in which the heat generated by the light emitting apparatus and the driver circuits is minimized. Consequently, the first embodiment improves the luminance of the light emitting sections 140 and prolongs the lifetime thereof.

Figure 5A:
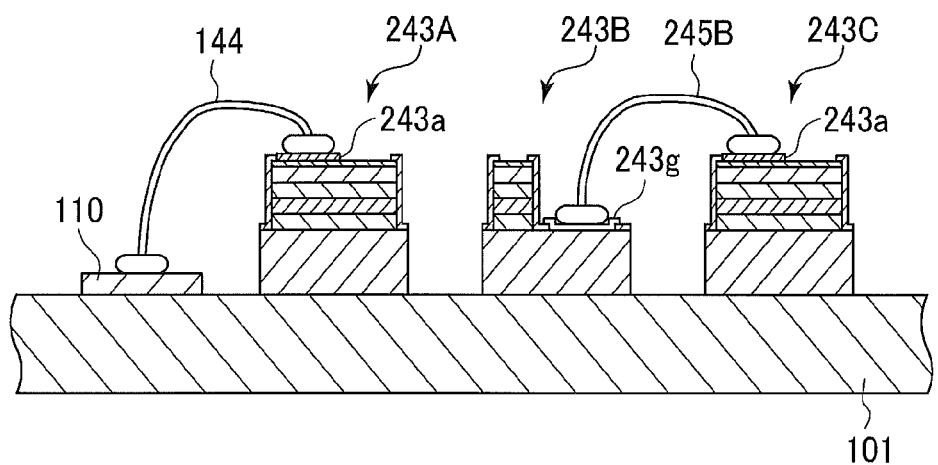
FIG. 5A is a cross-sectional view taken along a line S5A-S5A in FIG. 4.
Figure 5B:
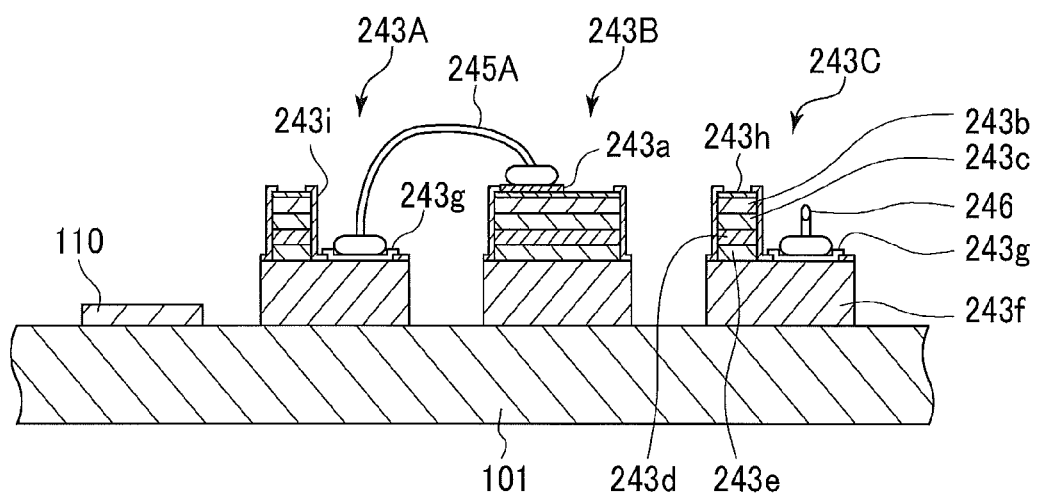
FIG. 5B is a cross-sectional view taken along a line S5B-S5B in FIG. 4.

FIG. 4 is a top view illustrating the outline of the configuration of a light emitting section 240 which is a first modification to the light emitting section 140. The light emitting section 240 includes bare chip LEDs 243A-243C, a first bonding wire 144, second bonding wires 245A and 245B, and a third bonding wire 246. The light emitting section 240 has a thickness greater than 300 μm. FIG. 5A is a cross-sectional view taken along a line S5A-S5A in FIG. 4. FIG. 5B is a cross-sectional view taken along a line S5B-S5B in FIG. 4. The first bonding wire 144 serves as a first connection that connects the first electrode wiring 110 and the bare chip LED 243A at the most upstream end with respect to the flow of current through the light emitting section 240. Second bonding wires 245A and 245B serve as a second connection that connects between adjacent bare chip LEDs 243A-243C. The third bonding wire 246 serves as a third connection that connects the second electrode wiring 120 and the bare chip LED 243C at the most downstream end with respect to the flow of current.

Referring to FIG. 5B, the bare chip LEDs 243A-243C each include a first contact layer 243b, a first cladding layer 243c, a light emitting layer 243d, a second cladding layer 243e, and a second contact layer 243f, all being formed on the substrate 101. Dry etching or wet etching is performed on the first contact layer 243b, first cladding layer 243d and second cladding layer 243e, which are in a region in which a second electrode 243g is to be formed, thereby exposing the second contact layer 243f. The second electrode 243g is then formed on the exposed surface of the second contact layer 243f. The side surfaces of the first contact layer 243b, first cladding layer 243c, light emitting layer 243d, and second cladding layer 243e that are exposed due to the etching are protected by a protection film 243i of $SiO_2$, SiN, or $Al_2O_3$. The protection film 243i may be formed by sputtering or plasma chemical vapor deposition. A transparent conductive film 243h is formed on the upper surface of a mesa-shaped region and a first electrode 243a is formed on the transparent conductive film 243h. Thus, the bare chip LEDs 243A-243C each have the first electrode 243a and the second electrode 243g facing upward.

The first bonding wire 144 electrically connects the first electrode wiring 110 to the first electrode 243a of the bare chip LED 243A. The second bonding wire 245A electrically connects the second electrode 243g of the bare chip LED 243A to the first electrode 243a of the bare chip LED 243B. The second bonding wire 245B electrically connects the second electrode 243g of the bare chip LED 243B to the first electrode 243a of the bare chip LED 243C. The third bonding wire 246 electrically connects the electrode 243g of the bare chip LED 243C to the second electrode wiring 120. As described above, the light emitting section 240 can be configured which includes a plurality of LEDs are connected in series.

Unlike the light emitting section 140 illustrated in FIGS. 2 and 3, the bare chip LEDs 243A-243B of the light emitting section 240 may be formed on the substrate 101 without forming the first die bond pads 141A and 141B and the second die bond pad 142. The bonding wirings 144, 245A, 245B, and 246 are directly connected to the first electrode 243a and the second electrode 243g, formed on the bare chip LEDs 243A-243C, so that the bare chip LEDs 243A-243C may be connected in series.

Figure 6:
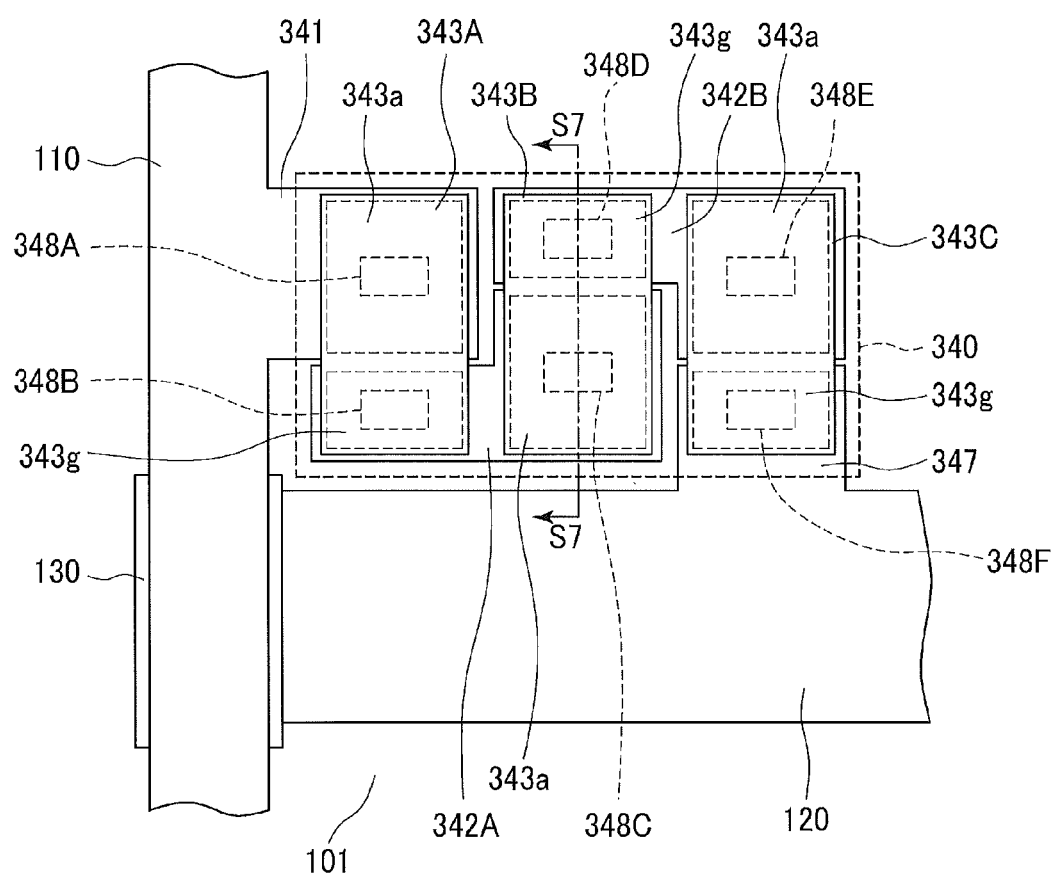
FIG. 6 is a top view illustrating the general configuration of a light emitting section which is a second modification to the light emitting section according to the first embodiment.
Figure 7:
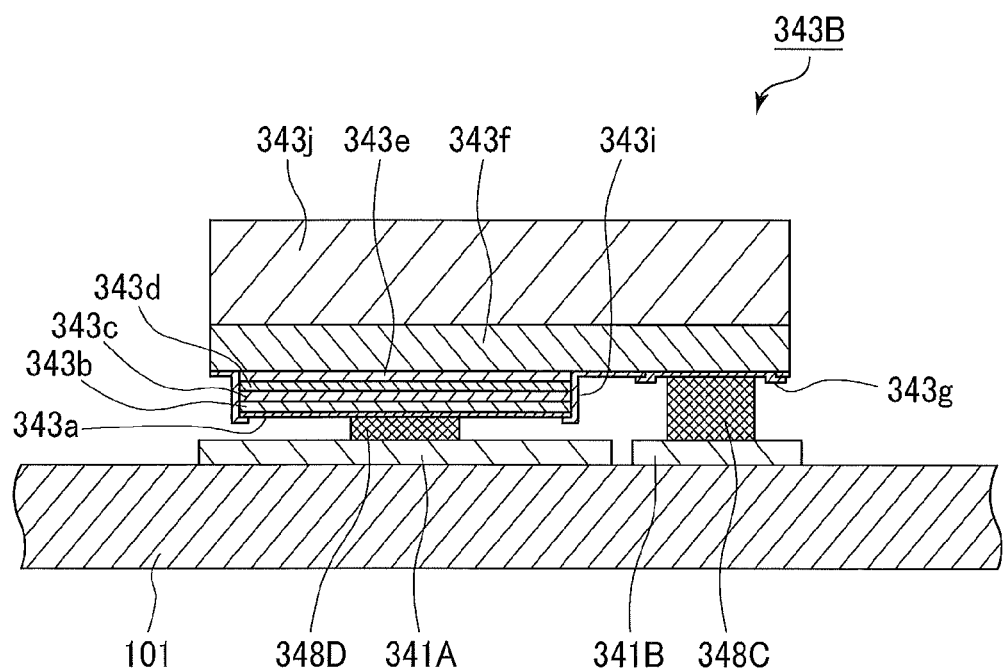
FIG. 7 is a cross-sectional view taken along a line S7-S7 in FIG. 6.

FIG. 6 is a top view illustrating the general configuration of a light emitting section 340 which is a second modification to the light emitting section 140. FIG. 7 is a cross-sectional view taken along a line S7-S7 in FIG. 6. The light emitting section 340 includes a first junction pad 341, second junction pads 342A and 342B, bare chip LEDs 343A-343C, third junction pad 347, and bumps 348A-348F. The light emitting section 340 has a thickness greater than 300 μm. The first junction pad 341 and bumps 348A serve as a first connection that connects the first electrode wiring 110 to the bare chip LED 343A located at the most upstream end with respect to the flow of current through the light emitting section 340. The second junction pad 342A and 342B and bumps 348B-348E serve as a second connection that connects the adjacent bare chip LEDs 343A-343C. The third junction pad 347 and bump 348F serve as a third connection that connects the second electrode wiring 120 to the bare chip LED 343C at the most downstream end with respect to the flow of current.

By combining photolithography with vapor deposition or combining photolithography with sputtering, a metal material, whose major composition is Au or Al, is deposited on the substrate 101 to form the first junction pad 341. The first junction pad 341 is continuous to the first electrode wiring 110. For example, the first junction pad 341 is formed at the end of the first electrode wiring 110 when the first electrode wiring 110 is formed.

By using a combination of photolithography with vapor deposition or sputtering, a metal material, whose major composition is Au or Al, is deposited on the substrate 101 to form the second junction pads 342A and 342B. The second junction pads 342A and 342B are not continuous to the first electrode wiring 110, second electrode wiring 120, and other junction pads.

By using a combination of photolithography with vapor deposition or sputtering, a metal material, whose major composition is Au or Al, is deposited on the substrate to form the third junction pad 347. The third junction pad 347 is continuous to the second electrode wiring 120. For example, the third junction pad 347 is formed at the end of the second electrode wiring 120.

Referring to FIG. 7, the bare chip LEDs 343A-343C each include a first contact layer 343b, a first cladding layer 343c, a light emitting layer 343d, a second cladding layer 343e, and a second contact layer 343f, which are formed on a growth substrate 343j. The first contact layer 343b, first cladding layer 343c, light emitting layer 343d, and second cladding layer 343e in the region in which a second electrode 343g is to be formed, are etched by dry etching or wet etching so that the second contact layer 343f is exposed. The second electrode 343g is formed on the exposed second contact layer 343f. The side surfaces of the first contact layer 343b, first cladding layer 343c, light emitting layer 343d, and second cladding layer 343e that are exposed due to the etching are protected by a protection film 343i of $SiO_2$, SiN, or $Al_2O_3$. The protection film 343i may be formed by sputtering or plasma chemical vapor deposition. The first electrode 343a is formed on the upper surface of a mesa-shaped region.

By flip chip bonding, the first electrode 343a of the bare chip LED 343A is electrically connected to the first junction pad 341A via the conductive bumps 348A.

By flip chip bonding, the second electrode 343g of the bare chip LED 343B is electrically connected to the second junction pad 342A via the conductive bumps 348B.

By flip chip bonding, the first electrode 343a of the bare chip LED 343B is electrically connected to the second junction pad 342A via the conductive bumps 348C.

By flip chip bonding, the second electrode 343g of the bare chip LED 343B is electrically connected to the second junction pad 342B via the conductive bumps 348D.

By flip chip bonding, the first electrode 343a of the bare chip LED 343C is electrically connected to the second junction pad 342B via the conductive bumps 348E.

By flip chip bonding, the second electrode 343g of the bare chip LED 343C is electrically connected to the third junction pad 347 via the conductive bumps 348F.

The light emitting section 340 of the aforementioned configuration requires that the light power is taken out from the back side of the bare chip LEDs 343A-343C. Thus, the growth substrate 343j of the bare chip LEDs 343A-343C is formed only of a nitride material such as a sapphire substrate transparent to the light. The bare chip LEDs 343A-343C of the aforementioned configuration have no electrode that blocks the emitted light, hence high light extraction efficiency.

Figure 8:
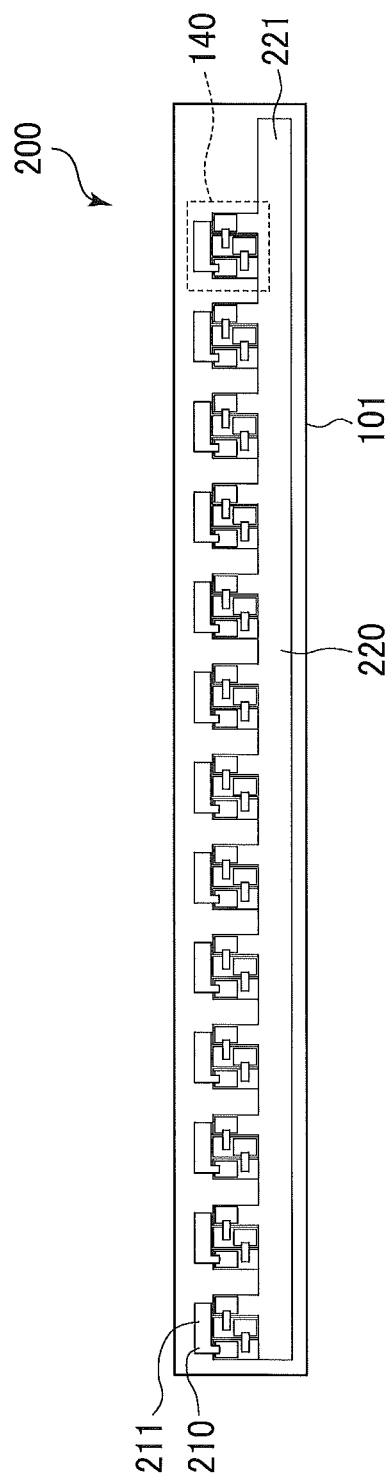
FIG. 8 is a top view illustrating the general configuration of a light emitting apparatus according to the second modification.

FIG. 8 is a top view illustrating the general configuration of a light emitting apparatus 200 according to a second modification to the light emitting apparatus 100. The semiconductor light emitting apparatus 200 includes a substrate 101, a plurality of the first electrode wiring 210, a second electrode wiring 220 that extends in a direction, and a plurality of light emitting sections 140.

The semiconductor light emitting apparatus 100 shown in FIG. 1 has the light emitting sections 140 arranged in a two dimensional area while the semiconductor light emitting apparatus 200 shown in FIG. 8 has the light emitting sections 140 arranged in a one dimensional area.

Apart of the first electrode wirings 210 serves as a first electrode wiring pad 211. Specifically, the first electrode wirings 210 extend close to, but not to, the perimeter of the substrate 101, so that the end portion of the first electrode wiring 210 is the first electrode wiring pad 211. Likewise, a part of the second electrode wiring 220 serves as a second electrode wiring pad 221. Specifically, the second electrode wiring 220 extends close to, but not to, the perimeter of the substrate 101, so that the end portion of the second electrode wiring 220 is the first electrode wiring pad 221.

Second Embodiment

Referring back to FIG. 1, the semiconductor light emitting apparatus 400 according to a second embodiment includes a substrate 101, a plurality of first electrode wirings 110 extending in a column direction, a plurality of second electrode wirings 120 extending in a row direction, and a plurality of light emitting sections 440 arranged in a matrix. The second embodiment differs in the configuration of the light emitting sections 440 from the first embodiment.

Figure 9:
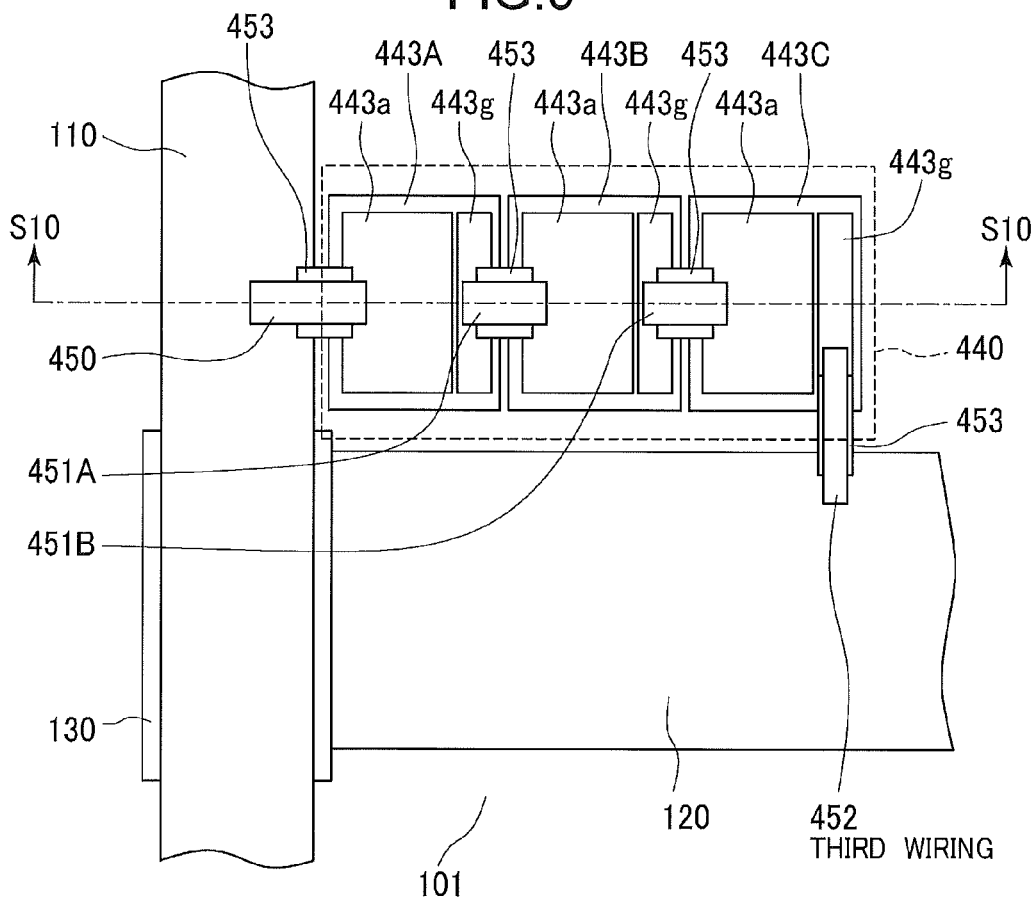
FIG. 9 is a top view illustrating the outline of the light emitting section according to a second embodiment.
Figure 10:
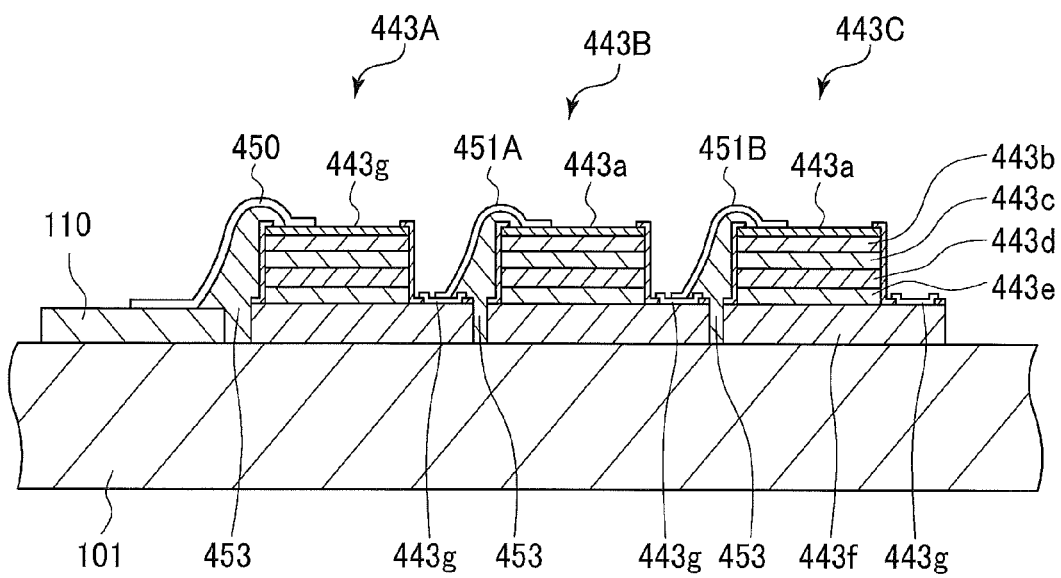
FIG. 10 is a cross-sectional view taken along a line S10-S10 in FIG. 9.

FIG. 9 is a top view illustrating the outline of the light emitting section 440 according to the second embodiment. The light emitting section 440 includes thin film LEDs 443A-443C, a first junction wiring 450, second junction wirings 451A and 451B, and a third junction wiring 452. FIG. 10 is a cross-sectional view taken along a line S10-S10 in FIG. 9.

The first junction wiring 450 serves as a first connection that connects the first electrode wiring 110 to the thin film LED 443A at the most upstream end with respect to the flow of current through the light emitting section 440. The second junction wiring 451 serves as a second connection that connects adjacent thin film LEDs 443A-443C together. The third junction wiring 452 serves as a third connection that connects the second electrode wiring 120 to the thin film LED 443C at the most downstream end with respect to the flow of current.

Referring to FIG. 10, the thin film LEDs 443A-443C each include a first electrode 443a, a first contact layer 443b, a first cladding layer 443c, a light emitting layer 443d, a second cladding layer 443e, a second contact layer 443f, and a second electrode 443g. That is, the layer structure of the thin film LEDs 443A-443C is the same as that of the bare chip LED 240 shown in FIGS. 4 and 5.

The thin film LEDs 443A-443C are, for example, diced into individual chips having a thickness equal to or smaller than 10 µm. The thin film LEDs 443A-443C preferably have a thickness smaller than 5 µm. The thin film LEDs 443A-443C are formed on a growth substrate and are then removed from the growth substrate either by grinding the substrate from its back side or releasing the thin film LEDs from the substrate.

Grinding can be done by lapping the growth substrate from the back surface, leaving only the thin film LEDs behind. Releasing can be done in the following manners. If the growth substrate is formed of sapphire transparent to the fourth harmonic wave ($\lambda$=266 nm) of Nd-YGA laser, a known laser-lift-off method may be employed to burn the interface between the growth substrate and the thin film LED 443A-443C, thereby releasing the thin film LEDs 443A-443C. If the growth substrate is a GaAs substrate, a sacrificial layer is first formed on the growth substrate by epitaxial growth, and the thin film LEDs 443A-443C are then formed on the sacrificial layer. The sacrificial layer can be chemically etched. Dry etching or wet etching is performed on the semiconductor layer of thin film LEDs to a depth where the sacrificial layer is exposed. The sacrificial layer is then preferentially etched away, thereby releasing the thin film LEDs 443A-443C from the growth substrate. The sacrificial layer may be formed of AlAs and the etchant may be hydrofluoric acid (HF). The thin film LEDs 443A-443C may be attached to the substrate 101, for example, by means of an epoxy adhesive or intermolecular force.

The first junction wiring 450 electrically connects the first electrode wiring 110 to the first electrode 443a of the thin film LED 443A. The second junction wiring 451A electrically connects the second electrode 443g of the thin film LED 443A to the first electrode 443a of the thin film LED 443B. The second junction wiring 451B electrically connects the second electrode 443g of the thin film LED 443B to the first electrode 443a of the thin film LED 443C. The third junction wiring 452 electrically connects the second electrode 443g of the thin film LED 443B to the second electrode wiring 120.

Bridge insulating films 453 are formed on the substrate 101, and a material that can be shaped by photolithography is formed on the insulating film 453, thereby forming the junction wirings 450, 451A, and 451B. The material for the bridge insulating film 453 includes a photosensitive nobolak resin, a photoconductive acrylic resin, a photoconductive Freon resin, or a photosensitive polyimide. The junction wirings 450, 451A, and 451B may also be formed by a process that involves etching.

As described above, the second embodiment does not use wire bonding or flip chip mounting to interconnect the first electrode wiring 110, thin film LEDs 443A, 443B, and 443C, and the second electrode wiring 120 as opposed to the first embodiment. Instead, the bridge insulating wiring 453 and the junction wiring 450, 451A, 451B, and 452 are formed as follows: A thin film electrode layer is first formed on the substrate. The thin film electrode layer is then shaped into individual wirings either by a combination of photolithography and vapor deposition or by a combination of photolithography and sputtering.

Wire bonding and flip chip mounting used in the first embodiment are detrimental in implementing a densely integrated circuit. Instead of wire bonding or flip chip mounting used in the first embodiment, the second embodiment employs photolithography advantageous in micro-fabrication, thereby achieving higher definition images than the semiconductor light emitting apparatus 100 according to the first embodiment.

Third Embodiment

Figure 11:
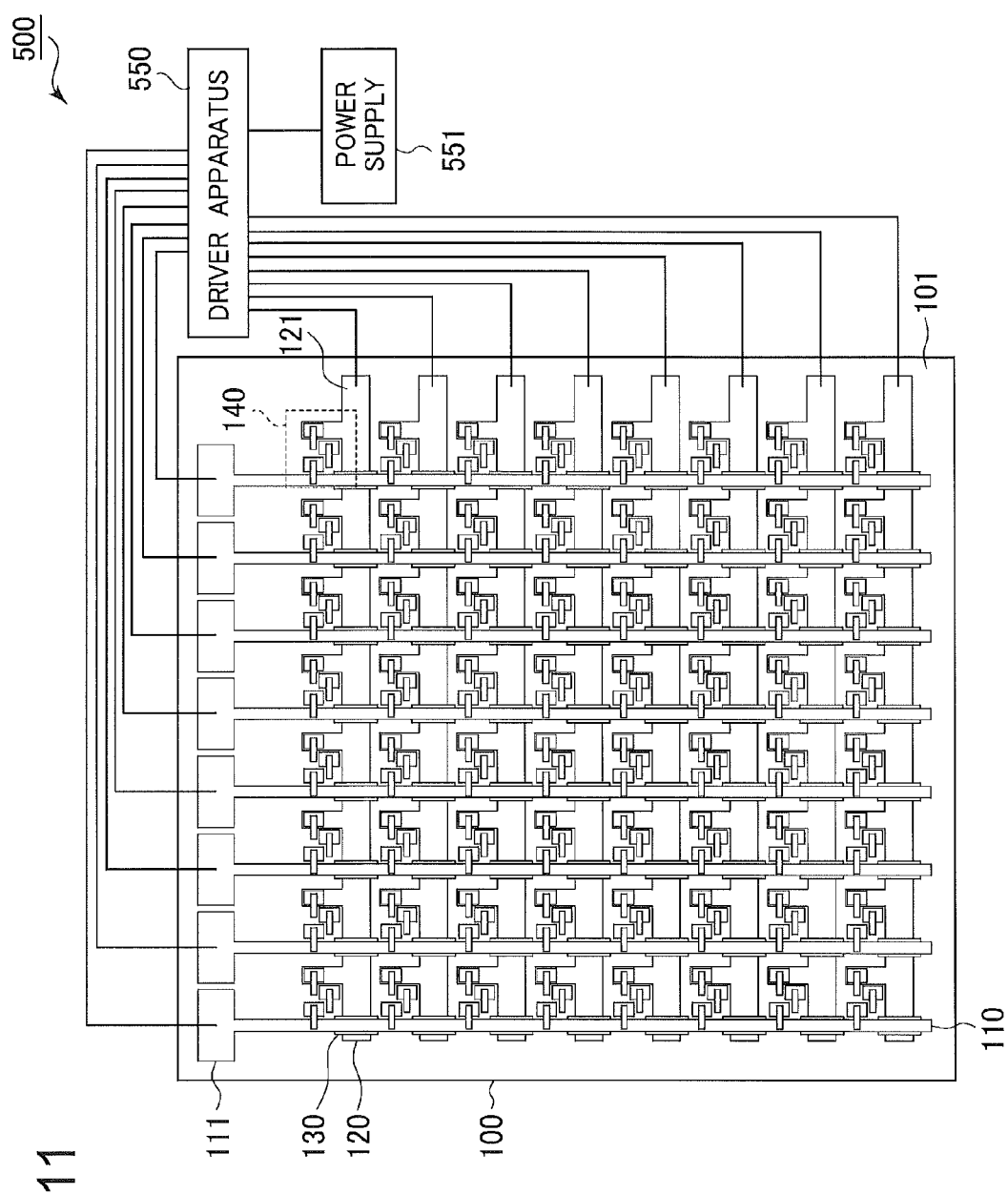
FIG. 11 is a top view illustrating the outline of the configuration of an image displaying apparatus according to a third embodiment.

FIG. 11 is a top view illustrating the outline of the configuration of an image displaying apparatus 500 according to a third embodiment. The image displaying apparatus 500 includes the semiconductor light emitting apparatus 100 according to the first embodiment, a driver apparatus 550 that drives the light emitting apparatus 100 to display an image, and a power supply 551.

The driver apparatus 550 supplies a signal voltage to one of the first electrode wiring pads 111 connected to an LED or pixel to be energized, and connects a corresponding one of the second electrode wiring pads 121 to the ground, thereby causing the LED to emit light. The driver apparatus 550 supplies the signal voltage to all of the first electrode wiring pads 111 in sequence so that the corresponding LEDs are energized in sequence, thereby scanning the row of the LEDs sequentially to form an image for one line. Likewise, the driver apparatus 550 supplies the signal voltage to all of the first electrode wiring pads 111 in sequence while the second electrode wiring pads 121 are grounded in sequence, thereby scanning an m-by-n matrix formed of the LEDs horizontally from left to right and vertically from top to bottom to complete an entire image formed of the LEDs. If the image displaying apparatus 500 is configured to display only a black-and-white image, each pixel is implemented by a single LED that emits white light. If the image displaying apparatus 500 is configured to display a mono color image, each pixel is implemented with an LED that emits red, green, or blue light. The circuits in the driver apparatus 550 may be integrated partially or entirely on the substrate 101.

The power supply 551 supplies electronic power to the driver apparatus 550.

Figure 12:
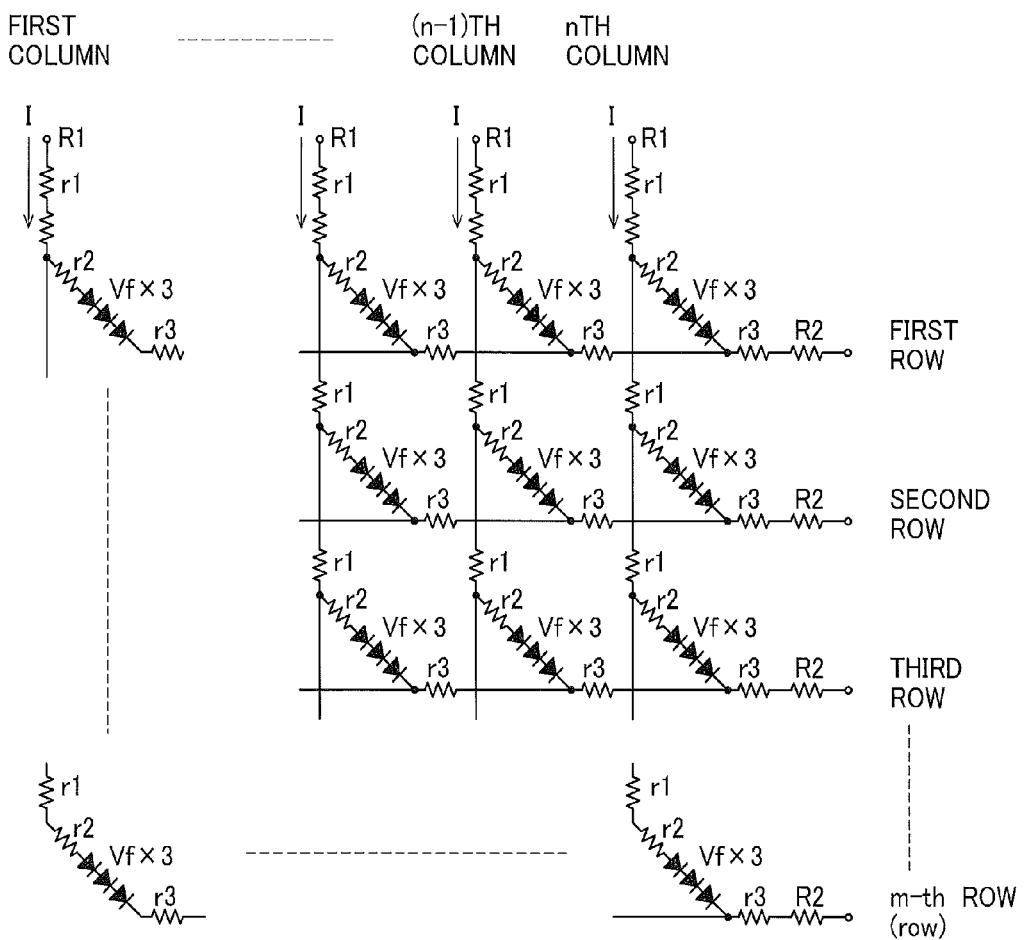
FIG. 12 is a partial equivalent circuit illustrating the semiconductor light emitting apparatus of the image displaying apparatus shown in FIG. 11.

FIG. 12 is an electrical equivalent circuit illustrating the semiconductor light emitting apparatus 100 of the image displaying apparatus 500 shown in FIG. 11. The light emitting sections 140 are arranged in a two-dimensional m-by-n matrix, m being not smaller than 2 and n being not smaller than 2. The first row is the closest row to the first electrode wiring pad 111. The m-th row is the farthest row from the first electrode wiring pad 111. The nth column is the closest column to the second electrode wiring pad 121. The first column is the farthest column from the second electrode wiring pad 121. A resistance R1 is the resistance of the first electrode wiring pad 111 in the form of the thin film wiring through which the injected current flows toward the first light emitting section 140 in the first row. A resistance R2 is the resistance of the second electrode wiring pad 121 in the form of the thin film wiring through which the injected current flows from the first light emitting section 140 in the nth column. A resistance r1 is the resistance of the first electrode wiring 110 between light emitting sections in adjacent rows in a column. A resistance r3 is the resistance of the second electrode wiring 120 between light emitting sections in adjacent columns in a row. It is to be noted that the resistance r1 is also present in the first row and the resistance r3 is also present in the m-th column. A drive voltage Vf is applied across each bare chip LED 143A, 143B, or 143C to inject current I thereinto. FIG. 12 shows three bare chip LED 143A-143C connected in series. Thus, the drive voltage for the series connection of these bare chip LEDs 143A-143C is 3×Vf.

In FIG. 12, assume that all of the bare chip LEDs 143 are energized simultaneously. The light emitting section 140 at the m-th row and first column of the matrix requires the highest drive voltage of all of the bare chip LEDs in the matrix.

$$V\max=I(R1+mr1+r2)+3Vf+n(n+1)Ir3/2+nIR2 \quad (1)$$

Contrary, the light emitting section 140 at the first row and the nth column requires the lowest drive voltage Vmin of all of the bare chip LEDs in the matrix.

$$V\min=I(R1+r1+r2)+3Vf+nI(r3+r2) \quad (2)$$

The power supply 551 should be capable of supplying a supply voltage high enough to supply electric power, assuming that one of the LEDs requires the highest drive voltage Vmax. However, the larger the difference between the Vmax and the Vmin is, the larger the electric power is supplied to the LED having the Vmin. Therefore, the difference between the Vmax and Vmin should be as small as possible for efficient utilization of supplied electric power.

By the use of a series connection of a plurality of bare chip LEDs 143A-143C, the semiconductor light emitting apparatus 100 provides sufficient luminance at smaller current, greatly reducing the injected current I. As a result, the difference between the Vmax and the Vmin can be smaller, hence the electric power drawn from the driver apparatus 550 can be smaller. For example, if the driver apparatus 550 is integrated partially or entirely on the substrate 101, the heat generated from the driver apparatus 550 can be greatly reduced. Thus, the light emitting sections 140 can provide high luminance and long life without deteriorating the characteristics of the light emitting sections 140.

While the third embodiment employs the semiconductor light emitting apparatus 100 according to the first embodiment, the semiconductor light emitting apparatus 400 according to the second embodiment may also be employed.

Fourth Embodiment

Figure 13:
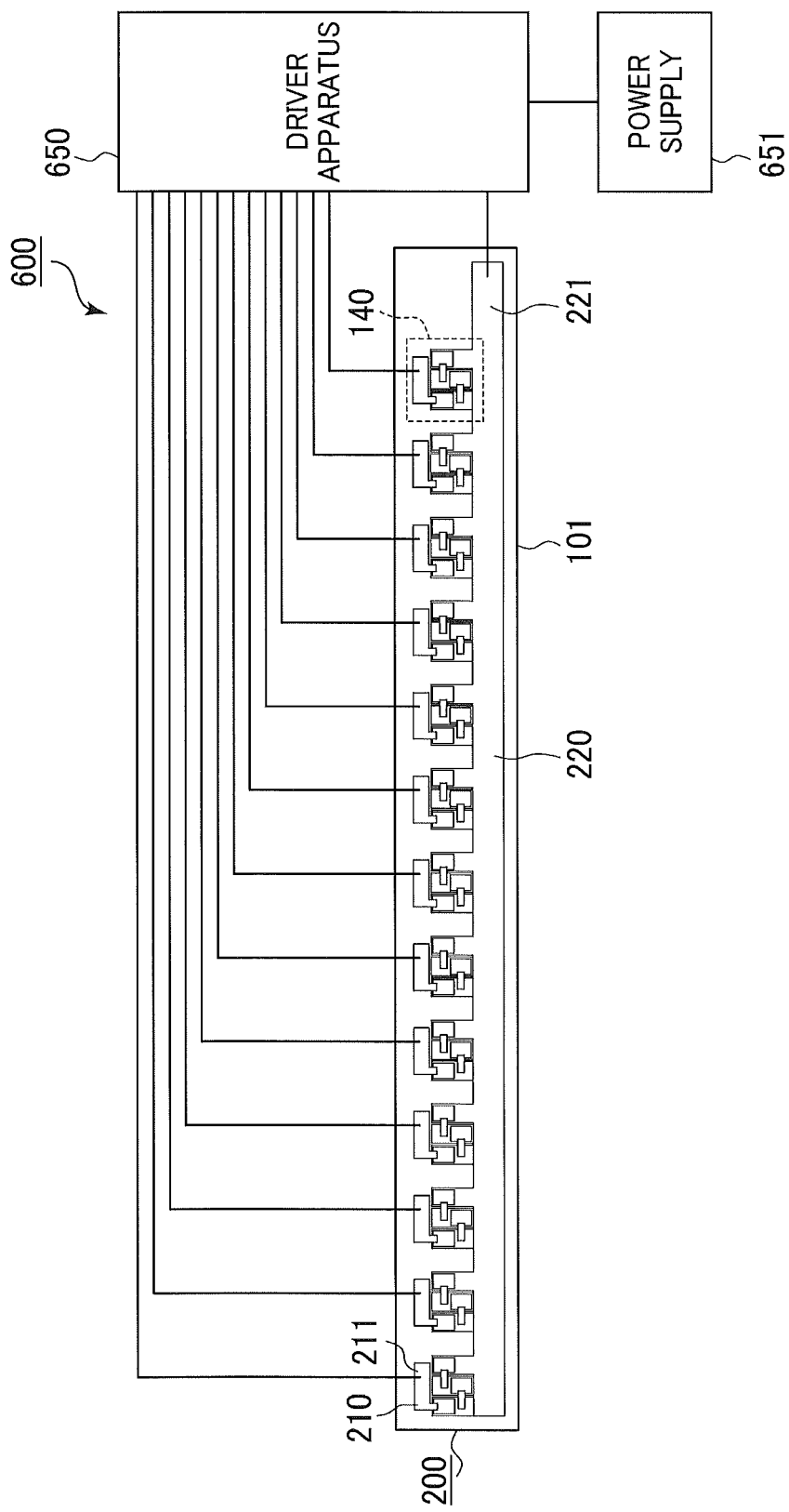
FIG. 13 is a top view illustrating the outline of the configuration of an image displaying apparatus according to a fourth embodiment.

FIG. 13 is a top view illustrating the outline of the configuration of an image displaying apparatus 600 according to a fourth embodiment. The image displaying apparatus 600 includes the semiconductor light emitting apparatus 200 shown in FIG. 8, the driver apparatus 650 that drives the semiconductor light emitting apparatus 200, and a power supply 651.

The equivalent circuit includes n (n is equal to or larger than 2) light emitting sections 140 aligned in one dimension. The first column is the farthest from the second electrode wiring pad 221 and the nth column is the closest to the second electrode wiring pad 221. The driver apparatus 650 is connected to the first electrode wiring pad 211 and the second electrode wiring pad 221. The driver apparatus 650 supplies a signal to the first electrode wiring pads 211 of the LEDs in sequence, and connects the second electrode wiring pad 221 to the ground, thereby supplying current in sequence through the light emitting sections to form an image of one line. Likewise, the current is supplied through all of the lines in sequence, thereby scanning the semiconductor light emitting apparatus 200 horizontally from left to right to complete an image of one frame of the semiconductor light emitting apparatus 200. If the image display apparatus 600 is a mono color image displaying apparatus, all of the light emitting sections 140 emit red light, all of the light emitting sections 140 emit green light, or all of the light emitting sections 140 emit blue light. If the image display apparatus 600 is a full color image displaying apparatus, a plurality of groups light emitting sections 140 are aligned in line, each group including the red light emitting section 140, green light emitting section 140, and blue light emitting section 140. The circuits in the driver apparatus 650 may be integrated partially or entirely on the substrate 101.

The power supply 650 supplies electric power to the driver apparatus 650.

Figure 14:
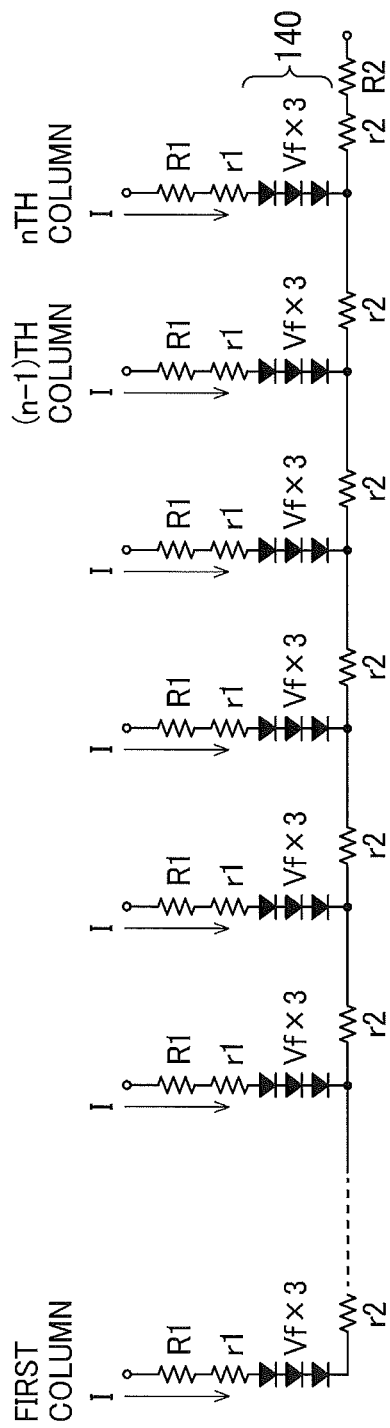
FIG. 14 is an equivalent circuit, illustrating the outline of the semiconductor light emitting apparatus used in the image displaying apparatus shown in FIG. 13.

FIG. 14 is an electrical equivalent circuit, illustrating the outline of the semiconductor light emitting apparatus 200 used in the image displaying apparatus 600 shown in FIG. 13. A resistance R1 is the resistance of the first electrode wiring pad 111 in the form of the thin film wiring through which the injected current I flows toward the first light emitting section 140 in the first row. A resistance R2 is the resistance of the second electrode wiring pad 121 in the form of the thin film wiring through which the injected current I flows from the first light emitting section 140 in the nth column to the second electrode wiring pad 221. A resistance r2 is the resistance of the second electrode wiring 120 between light emitting sections in adjacent columns. It is to be noted that a resistance r1 is the resultant resistance of the series connection of three light emitting elements (LEDs). A drive voltage Vf is applied across each bare chip LED 143A, 143B, or 143C to inject current I thereinto. FIG. 13 shows three bare chip LEDs 143A-143C connected in series. Thus, the drive voltage for the series connection of these bare chip LEDs 143A-143C is 3×Vf.

In FIG. 13, assume that all of the bare chip LEDs 143 are energized simultaneously. The light emitting section 140 at the first column of the matrix requires the highest drive voltage of all of the bare chip LEDs in the matrix.

$$V\max=I(R1+r1)+3Vf+n(n+1)Ir2/2+nIR2 \quad (3)$$

Contrary, the light emitting section 140 at the nth column requires the lowest drive voltage Vmax of all of the bare chip LEDs in the matrix.

$$V\min=I(R1+r1)+3Vf+nI(r2+R2) \quad (4)$$

The power supply 651 should be capable of supplying a supply voltage high enough to supply electric power to each light emitting section 140, assuming that that one of the LEDs requires the highest drive voltage Vmax. The larger the difference between the Vmax and the Vmin is, the larger the electric power is supplied to the LED having the Vmin. Therefore, the difference between the Vmax and Vmin should be as small as possible for efficient utilization of supplied electric power.

By the use of a series connection of a plurality of bare chip LEDs 143A-143C, the semiconductor light emitting apparatus 200 provides sufficient luminance even at smaller currents, greatly reducing the injected current I. As a result, the difference between the Vmax and the Vmin can be smaller, hence the electric power drawn from the driver apparatus 550 can be smaller. For example, if the driver apparatus 650 is integrated partially or entirely on the substrate 101, the heat generated from the driver apparatus 650 can be greatly reduced—hence a smaller amount of heat generated by the entire system. Thus, the light emitting sections 140 can provide high luminance and long life without deteriorating the characteristics thereof.

While the fourth embodiment employs the semiconductor light emitting apparatus 200 according to the modification to the first embodiment, the semiconductor light emitting apparatus according to the second embodiment in which the light elements 440 are arranged in a one dimensional area may also be employed.

Fifth Embodiment

Figure 15A:
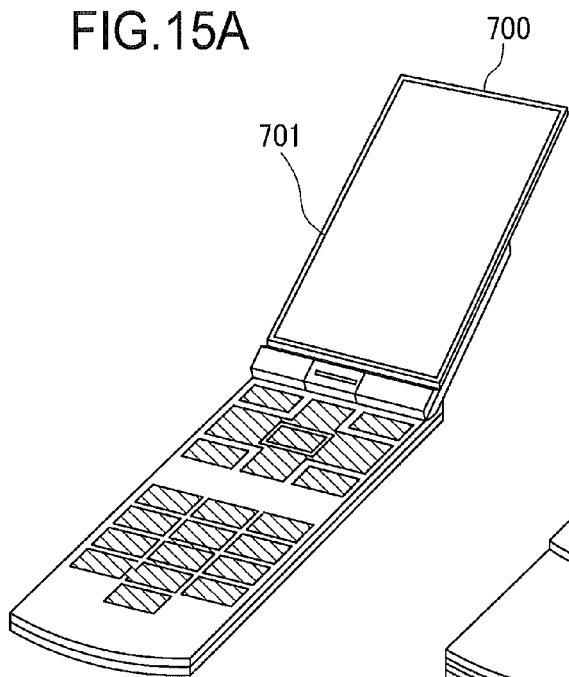
FIG. 15A illustrates the mobile terminal when it is opened.
Figure 15B:
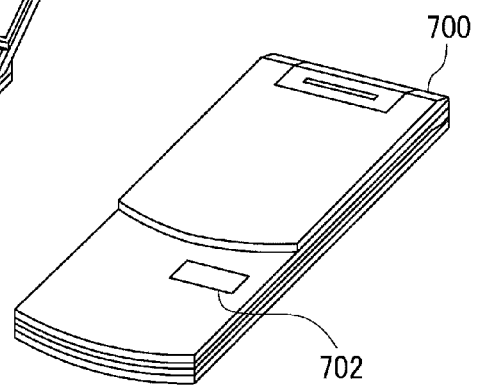
FIG. 15B illustrates the mobile terminal when it is folded in half.

FIGS. 15A and 15B are perspective views of a mobile terminal 700 according to a fifth embodiment. FIG. 15A illustrates the mobile terminal 700 when it is opened. FIG. 15B illustrates the mobile terminal 700 when it is folded in half. The mobile terminal 700 includes the image displaying apparatus 500 according to the third embodiment or the image displaying apparatus 600 according to the fourth embodiment.

The mobile terminal 700 includes a main monitor 701 and an auxiliary monitor 702. The main monitor 701 usually displays information about dial operation, address book, edition and content of emails, browsing of the internet contents, and reception of One Seg. The auxiliary monitor 702 displays time, condition of incoming radio wave, and partial information about incoming calls. The main monitor 701 and auxiliary monitor 702 can be implemented with the image displaying apparatus 500 or 600.

The mobile terminal 700 is often used outdoors. If the main monitor 701 and auxiliary monitor 702 have insufficient luminance, their viewability is poor, necessitating blocking the environmental light from entering before the user can properly read the displayed information. When the main monitor 701 and the auxiliary monitor 702 are a conventional liquid crystal display (LCD), if the back light output is increased in an attempt to increase the luminance, power consumption will also increase, resulting in significantly increased amount of heat. Employing the image displaying apparatus 500 or 600 increases the luminance at greatly reduced amount of injected current, hence decreased amount of heat. Thus, the luminance of the LEDs can be increased as a whole without sacrificing the light extraction efficiency of the LEDs. In addition, a smaller amount of heat generated affects less the other circuits surrounding the LEDs.

As described above, implementing the main monitor 723 and auxiliary monitor 702 with the image displaying apparatus 500 according to the third embodiment or the image displaying apparatus 600 according to the fourth embodiment reduces heat generated by the series resistances in the wirings and light emitting sections 140 or 440 while also providing a sufficient luminance. The heat generated by the driver apparatuses 550 and 650 can also be decreased greatly so that the heat generated in the apparatus with the driver apparatus 550 or 650 integrated on the substrate 101 can be reduced greatly. As a result, when the image displaying apparatus 500 or 600 is used, sufficient luminance can be obtained even the apparatus is used outdoors, with the reduced amount of heat—hence improved luminance characteristics and useable lifetime.

Sixth Embodiment

Figure 16:
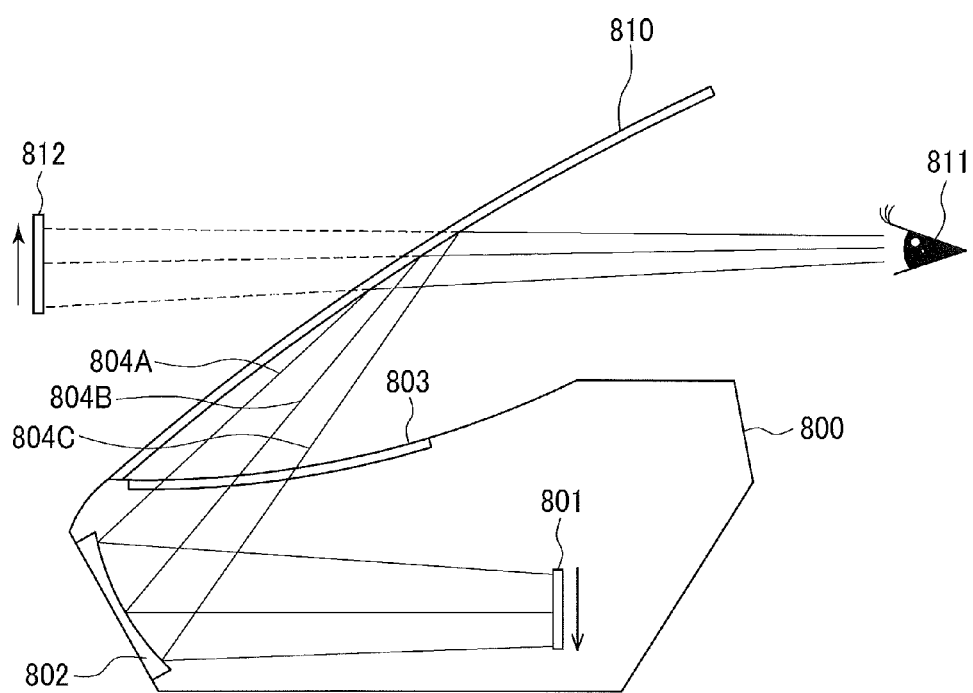
FIG. 16 is a cross-sectional view illustrating the outline of the configuration of a head up display apparatus (HUD) according to a sixth embodiment.

FIG. 16 is a cross-sectional view illustrating the outline of the configuration of a head up display apparatus (HUD) 800 according to a sixth embodiment. The HUD 800 includes an HUD light source 801 that employs the image displaying apparatus 500 according to the third embodiment or the image displaying apparatus 600 according to the fourth embodiment. The HUD apparatus 800 also includes a concave mirror 802 as a projector.

The HUD light source 801 is positioned at a distance from the concave mirror 802 shorter than the focal distance of the concave mirror. The magnification of the concave mirror 802 is determined by the position of the HUD light source 801 relative to the concave mirror 802.

The concave mirror 802 projects through a transparent cover 803 a magnified image of the image emitted from the HUD light source 801 on a windshield 810 of a car, which in turn reflects the magnified image into the eyes of the viewer 811, so that the viewer 811 can see a virtual erect image.

Reference numerals 804A-804C shown in FIG. 16 denote the light path from the HUD light source to the eyes of the viewer 811. The windshield 810 reflects the virtual erect image from the concave mirror 802, thereby forming a virtual inverted image. Therefore, the light source 801 is designed to emit an inverted image so that the viewer can see a magnified erect image. The viewer sees a virtual image 812 behind the windshield 810.

As described above, employing the image displaying apparatus 500 according to the third embodiment or the image displaying apparatus 600 according to the fourth embodiment is effective in minimizing the amount of generated heat when a current is injected into the LEDs for obtaining a desired luminance. Thus, the luminance may be increased effectively without sacrificing the LED light extraction efficiency, while preventing the surrounding integrated circuits from being affected by the generated heat. Furthermore, the heat sink may be smaller or simplified. Conventionally, a HUD is expensive and may be mounted only on luxury cars since it requires a relatively large instrument panel. However, the HUD according to the sixth embodiment requires a relatively small space and therefore may be mounted on economy cars having a relatively small instrument panel. The HUD 800 according to the sixth embodiment can be smaller than conventional HUDs, implementing a popup HUD as an add-on in a car.

As described above, a desired luminance level may be obtained at relatively small current so that heat generated in the light emitting sections 140 and the resistances in the first and second electrode wirings 120 may be greatly reduced. This leads to a reduction of heat generated in the driver apparatus 550 and 650 that drive the image displaying apparatus 500 and 600, respectively. Thus, the HUD 800 is capable of displaying a vivid image with minimum heat generation independently of the environmental conditions, thereby providing improved luminance characteristics and long lifetime. A reduced size of the heat sink leads to a reduced size of the HUD 800, making the HUD 800 free from the size of the instrument panel to which the HUD 800 is mounted.

Seventh Embodiment

Figure 17:
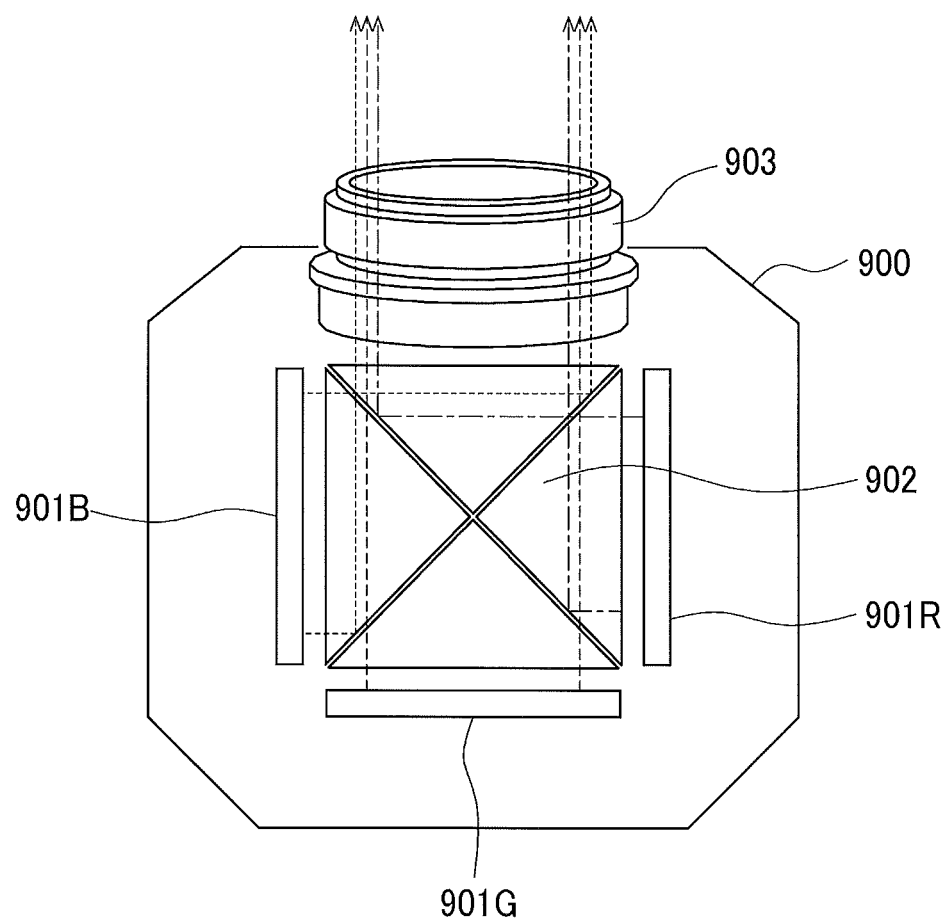
FIG. 17 illustrates the outline of the configuration of a projector as an image projector according to a seventh embodiment.

FIG. 17 illustrates the outline of the configuration of a projector 900 as an image projector 900 according to a seventh embodiment. The projector 900 includes the image displaying apparatus 500 according to the third embodiment or the image displaying apparatus 600 according to the fourth embodiment.

The projector 900 includes a red image light source 901R, a green image light source 901G, a blue image light source 901B, a cross dichroic prism 902, and a lens 903. The cross dichroic prism 902 and lens 903 constitute a projection section that projects the red, green, and blue light emitted from the red-, green-, and blue-light sources 901R, 901G, and 901B, respectively, onto a screen.

The red-, green-, and blue-light sources 901R, 901G, and 901B employs the image display apparatus 500 or 600 that emit light of a corresponding color onto a screen.

The image displaying apparatus 901R, 901G, and 901B are disposed to face corresponding surfaces of the cross dichroic prism 902. The cross dichroic prism 902 guides the images emitted from the image displaying apparatus 901R, 901G, and 901B in a direction in which the images are projected, thereby synthesizing the images of the respective colors into a full color image. The lens 903 is positioned in front of the dichroic prism 902 in the direction in which the image is projected onto the screen. The lens 903 determines the magnification and focus of the color image emitted from the cross dichroic prism 902, and forms the image on the screen.

The image displaying apparatus 901R, 901G, and 901B are implemented with the image displaying apparatus 500 according to the third embodiment or the image displaying apparatus 600 are capable of producing a full color image with minimum heat generation, while still providing a desired luminance level. This improves the light extraction efficiency of the LEDs, preventing the surrounding circuits from being affected by the generated heat. The heat sink may be smaller, being effective in reducing the overall size of the projector 900. Thus, the projector 900 may be smaller than conventional projectors and a portable projector may be realized.

As described above, a desired luminance level may be obtained at relatively small current so that heat generated in the light emitting sections 140 and the resistances in the first and second electrode wirings 120 may be greatly reduced. This leads to a reduction of heat generated in the driver apparatus 550 and 650 that drive the image displaying apparatus 500 and 600, respectively. Thus, the projector 900 is capable of displaying a vivid image with minimum heat generation independently of the environmental conditions, thereby providing improved luminance characteristics and prolonging the lifetime of the projector 900. A reduced size of the heat sink leads to a reduced size of the projector 900, implementing a head up display that is not constrained by the size of the instrument panel to which the head up display is mounted.

The seventh embodiment has been described in terms of the image displaying apparatus 500 or 600 configured to display a monochromatic image. However, if the image displaying apparatus 500 and 600 are to display a full color image, then the cross dichroic prism 902 is not required.

Eighth Embodiment

Figure 18:
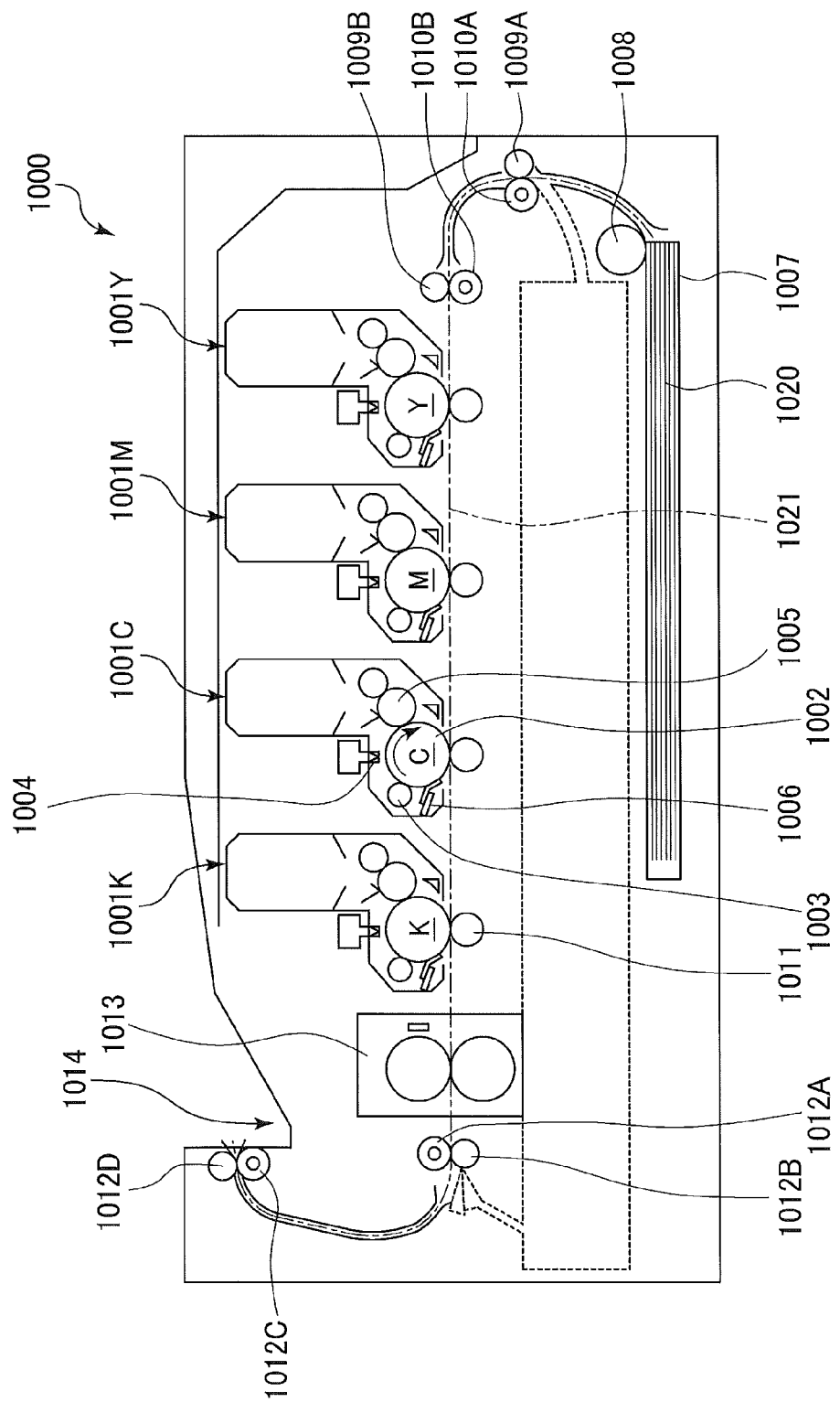
FIG. 18 is a cross-sectional view illustrating the outline of the configuration of an LED printer as an image forming apparatus according to an eighth embodiment.

FIG. 18 is a cross-sectional view illustrating the outline of the configuration of an LED printer 1000 as an image forming apparatus according to an eighth embodiment.

The LED printer 1000 includes four process units 1001Y, 1001M, 1001C, and 1001K arranged in tandem along a transport path 1021 of a medium 1020. The four process units 1001Y, 1001M, 1001C, and 1001K form yellow, magenta, cyan, and black images, respectively, by an electrophotographic process. Each process unit includes a photoconductive drum 1002 as an image bearing body, a charging unit 1003 that charges the surface of the photoconductive drum 1002, and an exposing unit 1004 that selectively illuminates the charged surface of the photoconductive drum 1002 to form an electrostatic latent image. The exposing unit 1004 may be implemented with the semiconductor light emitting source 200 (FIG. 8) which is a modification to the first embodiment. If the LED printer 1000 is to print a black-and-white image, each light emitting section 140 of the semiconductor light emitting apparatus 200 emits light corresponding to each dot to be printed. If the LED printer 1000 is to print a full color image, each light emitting section 140 of the semiconductor light emitting apparatus 200 of the process unit for a corresponding color emits light for each dot.

The LED printer 1000 includes a developing device 1005 that supplies the developer to the electrostatic latent image formed on the surface of the photoconductive drum 1002, and a cleaning device 1006 that removes the developer remaining on the surface of the photoconductive drum 1002 after transfer of the image onto the medium 1020. The photoconductive drum 1002 is driven in rotation, by a drive mechanism (not shown) including a drive source and gears, in a direction shown by an arrow. A paper cassette 1007 holds a stack of medium 1020 such as paper. A hopping roller 1008 feeds the medium 1020 on a sheet-by-sheet basis into a transport path. Pinch rollers 1009A and 1009B and registry rollers 1010A and 1010B are disposed downstream of the hopping roller 1008. The pinch rollers and registry rollers cooperate with each other to correct skew of the medium 1020, and feed the medium 1020 in a timed relation with the image formation by the photoconductive drum 1002. The hopping roller 1008 and registry rollers 1010A and 1010B are driven in rotation by a drive source (not shown) in an interlocked manner.

Transfer rollers 1011 are disposed to face corresponding photoconductive drums 1002, and are formed of an electrically semi conductive rubber material. The high voltages applied to the transfer rollers 1011 and photoconductive drums are selected so that an electric field is developed across each transfer roller 1011 and a corresponding photoconductive drum 1002. The toner image formed on the photoconductive drum 1002 is thus transferred onto the medium 1020 with the aide of the electric field. Discharging rollers 1012A-1012D discharge the medium 1020 after fixing the toner image on the medium 1020. The hopping roller 1008 feeds the medium 1020 on a sheet-by-sheet basis from the paper cassette 1007 into the transport path. The medium 1020 passes the registry rollers 1010A and 1010B and the registry roller 1009A and 1009B and then passes through the four process units in sequence so that the toner images of corresponding colors are transferred onto the medium in registration. When the medium passes through the respective process units, the medium 1020 passes a contact area or a transfer point between the photoconductive drum 1002 and a corresponding transfer roller 1011 so that a toner image of a corresponding color is transferred onto the medium 1020. Then, the medium 1020 passes through a fixing unit 1013 where the toner image on the medium 1020 is fixed. The medium 1020 is then discharged by the discharge rollers 1012A-1012D onto a stacker 1014.

The use of the semiconductor light emitting apparatus 200, which is a modification to the first embodiment, improves the luminance of the exposing unit 1014 and therefore increases printing speed with minimum heat generation as compared with a conventional light emitting apparatus. Thus, the luminance may be improved without sacrificing light extraction efficiency.

According to the eighth embodiment, heat generated in the light emitting sections 140 and the resistances in the first and second electrode wirings 120 may be greatly reduced. This leads to a reduction of heat generated in the driver apparatus that drive the semiconductor light source 200, so that an apparatus with the driver apparatus integrated on the substrate 101 will not generate a large amount of heat. The improvement of the luminance characteristics will also improve the printing speed of the LED printer 1000 and prolong the lifetime of the LED printer.

Ninth Embodiment

Figure 19:
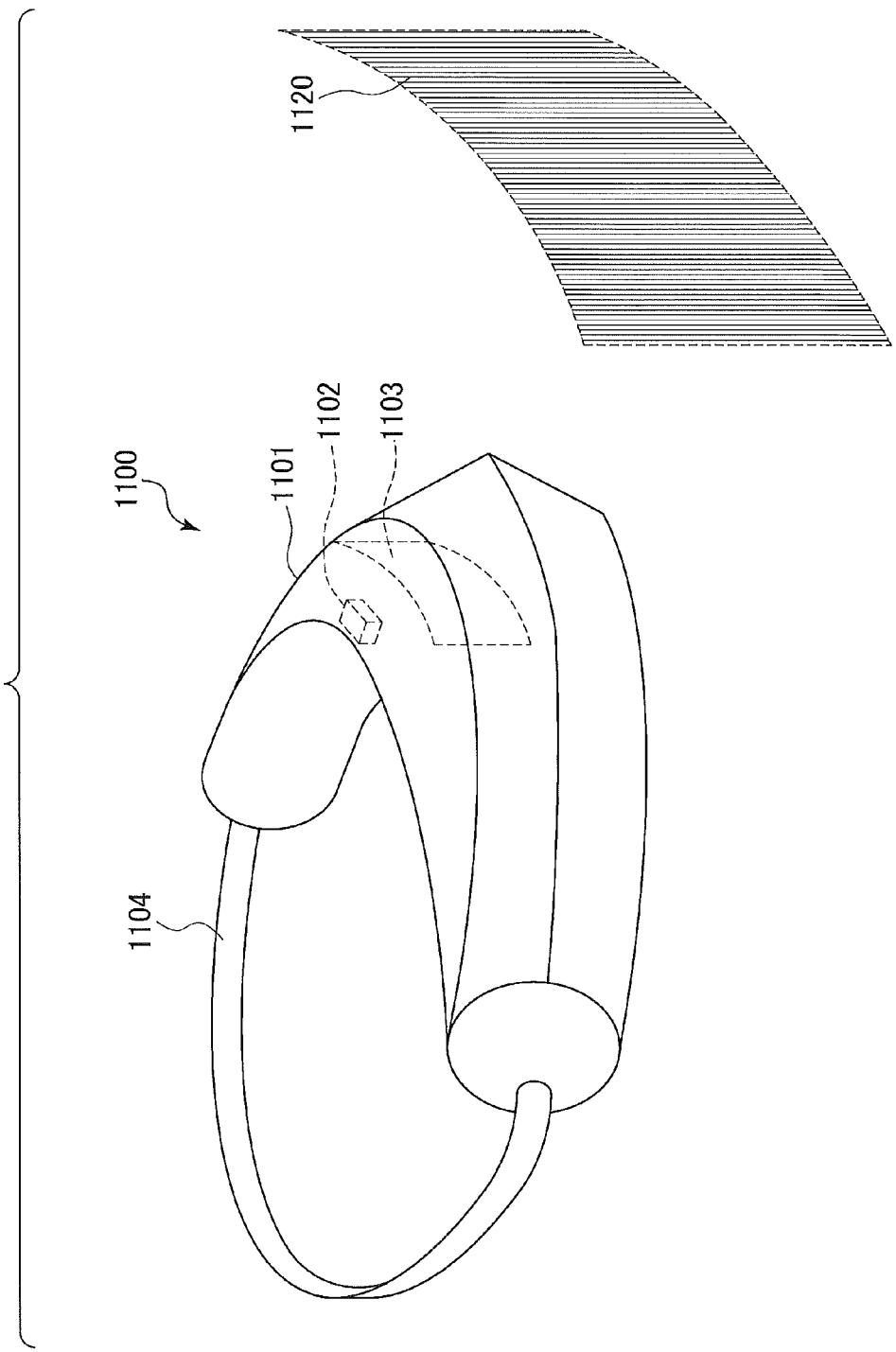
FIG. 19 is a perspective view illustrating the outline of the configuration of a head-mounted display (HMD)

FIG. 19 is a perspective view illustrating the outline of the configuration of a head-mounted display (HMD) 1100. The HMD 1100 incorporates the image displaying apparatus 600 according to the fourth embodiment (FIG. 13).

The HMD 1100 includes a body 1101, a support 1103 that supports the apparatus 1101 in front of the user's eyes, an image forming unit 1102, and a reflector 1103.

The reflector 1103 is positioned forward of the image forming unit 1102. The reflector 1103 makes a virtual erect image 1120 of the image emitted from the image forming unit 1102 so that the user views the magnified virtual image 1120. If the reflector 1103 is not transmissive, the HMD 1100 can be a non-transmissive HMD. If the reflector 1103 is a half-mirror, the HMD 1100 can be a transmissive HMD.

Figure 20:
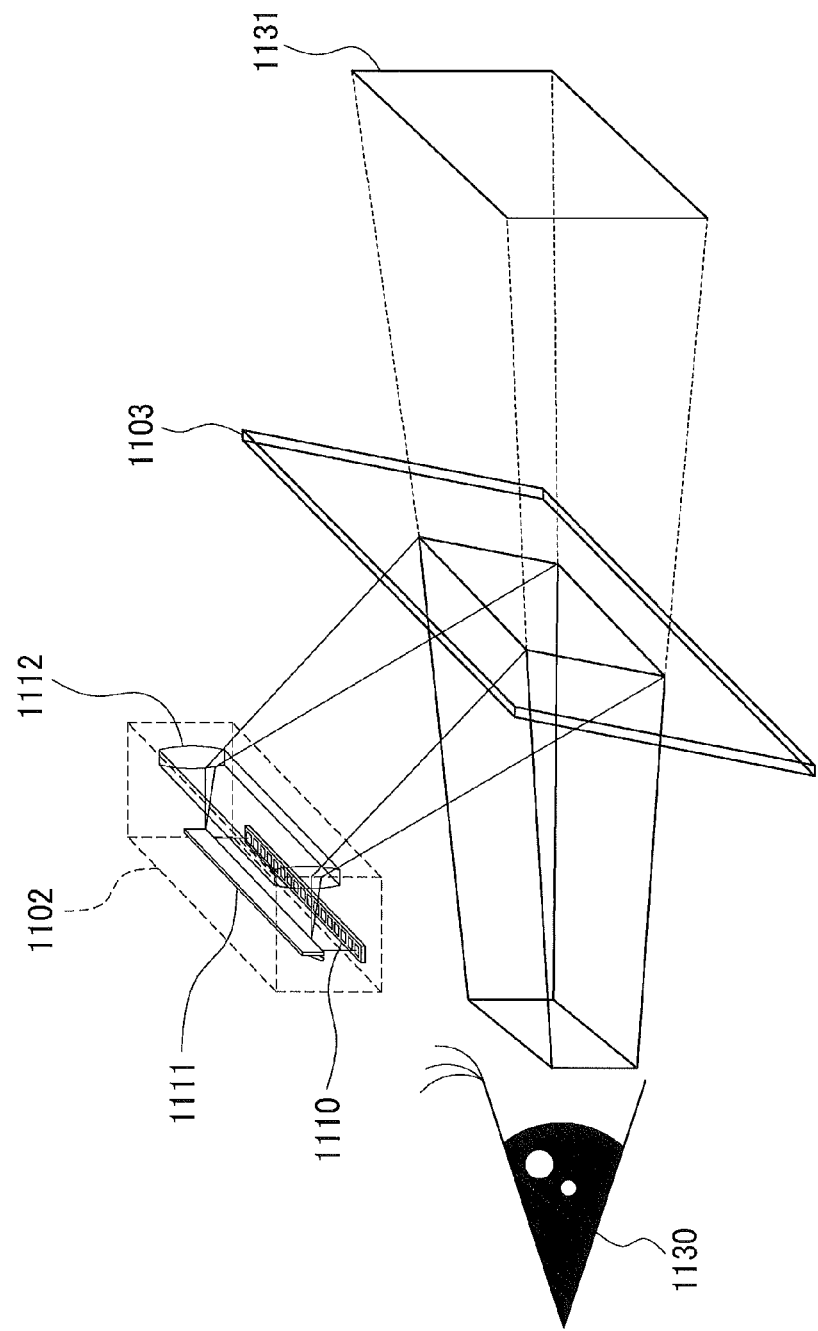
FIG. 20 is a perspective view illustrating the outline of the configuration of the image forming unit.

FIG. 20 is a perspective view illustrating the outline of the configuration of the image forming unit 1102. The image forming unit 1102 includes an image displaying light source 1110, a scanning mirror 1111, and a convex lens 1112. The image displaying light source 1110 generates an image for each line, and may be implemented with the image displaying apparatus 600 according to the fourth embodiment. The scanning mirror 1111 is disposed above the image displaying light source 1110, and scans the image lines in sequence horizontally from left to right and vertically from top to bottom, thereby forming a two dimensional image. The convex lens 1112 forms the two dimensional image created by the scanning mirror 1111 on the reflector 1103. The mirror 1111 is positioned between the convex lens 1112 and the focal plane of the convex lens 1112. Adjusting the distance of the mirror 1111 from the convex lens 1112 enables adjusting of the magnifying factor of the image.

The scanning mirror 111 is positioned between the convex lens 1112 and the focal plane of the convex lens 1112. The light exiting the convex lens 1112 is reflected by the reflector 1103 so that the user's eyes 1130 see a magnified virtual erect image 1131 positioned behind the reflector 1103. The convex lens 1112 shown in FIG. 20 may be replaced by a concave mirror that would function as a turning mirror.

The image displaying light source 1110 is capable of producing an image with minimum heat generation, while still providing a desired luminance level. This improves the light extraction efficiency of the LEDs, preventing the surrounding circuits from being affected by the generated heat. The heat sink may also be smaller, being effective in reducing the overall size of the image forming unit 1102 so that the HMD 1100 may be smaller and lighter than conventional projectors and a portable projector may be realized.

As described above, a desired luminance level may be obtained at a relatively small current so that heat generated in the light emitting sections 140 and the resistances in the first and second electrode wirings 120 may be greatly reduced. This leads to a reduction of heat generated in the driver apparatus 650 that drives the image displaying apparatus 200. Therefore, heat generation may be minimized in an integrated circuit that incorporates the driver apparatus 650 integrated on the substrate 110. Consequently, the HMD 1100 improves the luminance of the light emitting sections 140 and prolongs the lifetime thereof. Also, a significant reduction of heat generation leads to a head-mounted display that is smaller and lighter than conventional apparatus.

The image forming unit 1102 of the HMD 1100 may be replaced with the image displaying apparatus 500 according to the third embodiment.

Tenth Embodiment

{Configuration}

Figure 21:
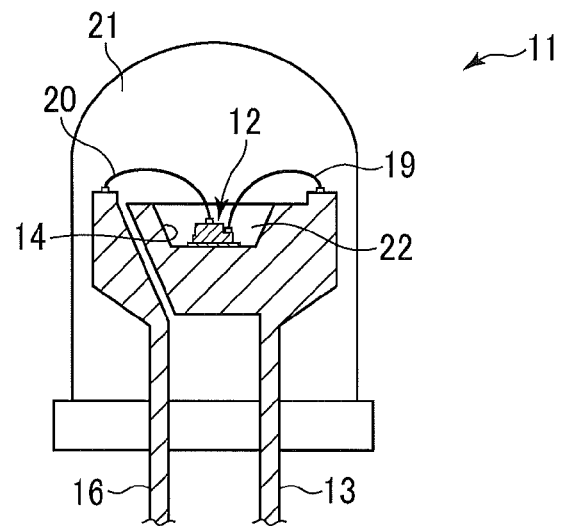
FIG. 21 is a cross sectional view of a conventional lamp type LED module.
Figure 22:
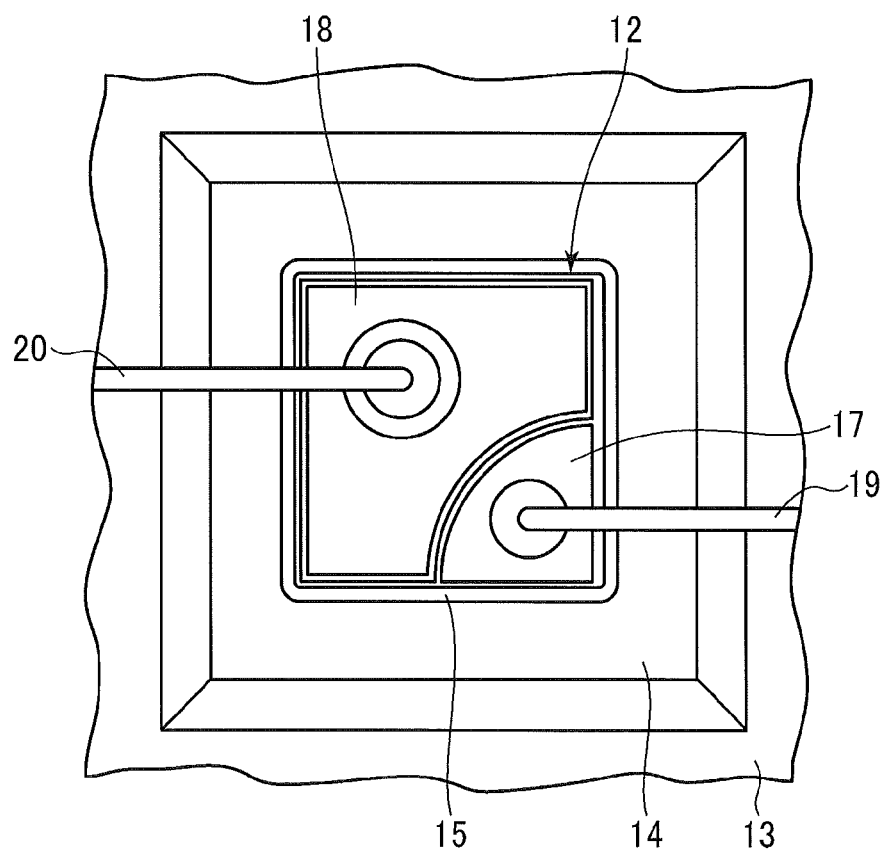
FIG. 22 is a top view illustrating the outline of a light emitting section of the conventional lamp type LED module.
Figure 23:
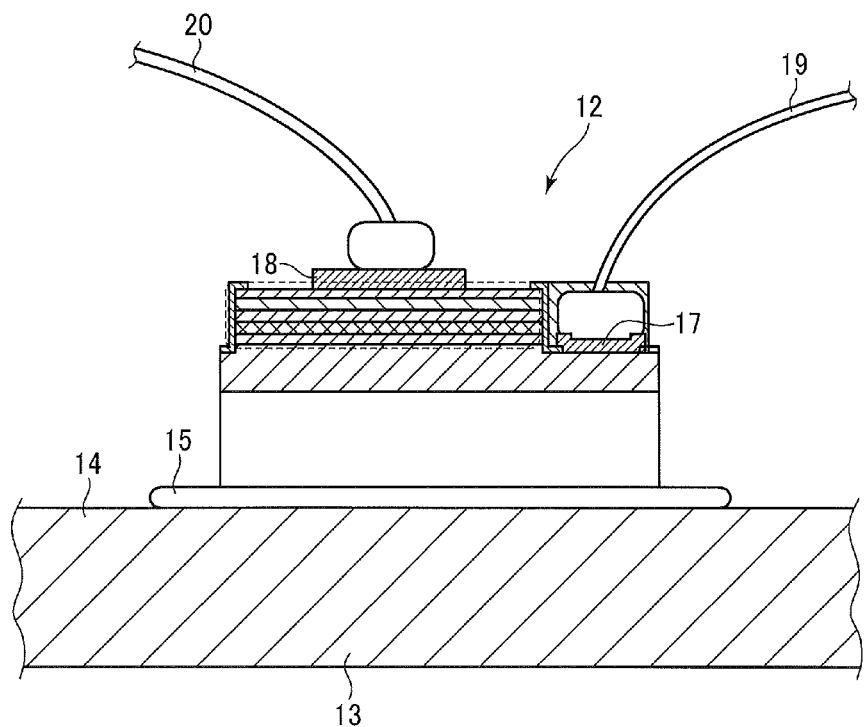
FIG. 23 is a general cross-sectional view of the light emitting section of the conventional lamp type LED module.

FIG. 21 is a cross sectional view of a conventional lamp type LED module 1100. FIG. 22 is a top view illustrating the outline of a light emitting section of the conventional lamp type LED module 1100. FIG. 23 is a general cross-sectional view of the light emitting section of the conventional lamp type LED module 1100.

Figure 24A:
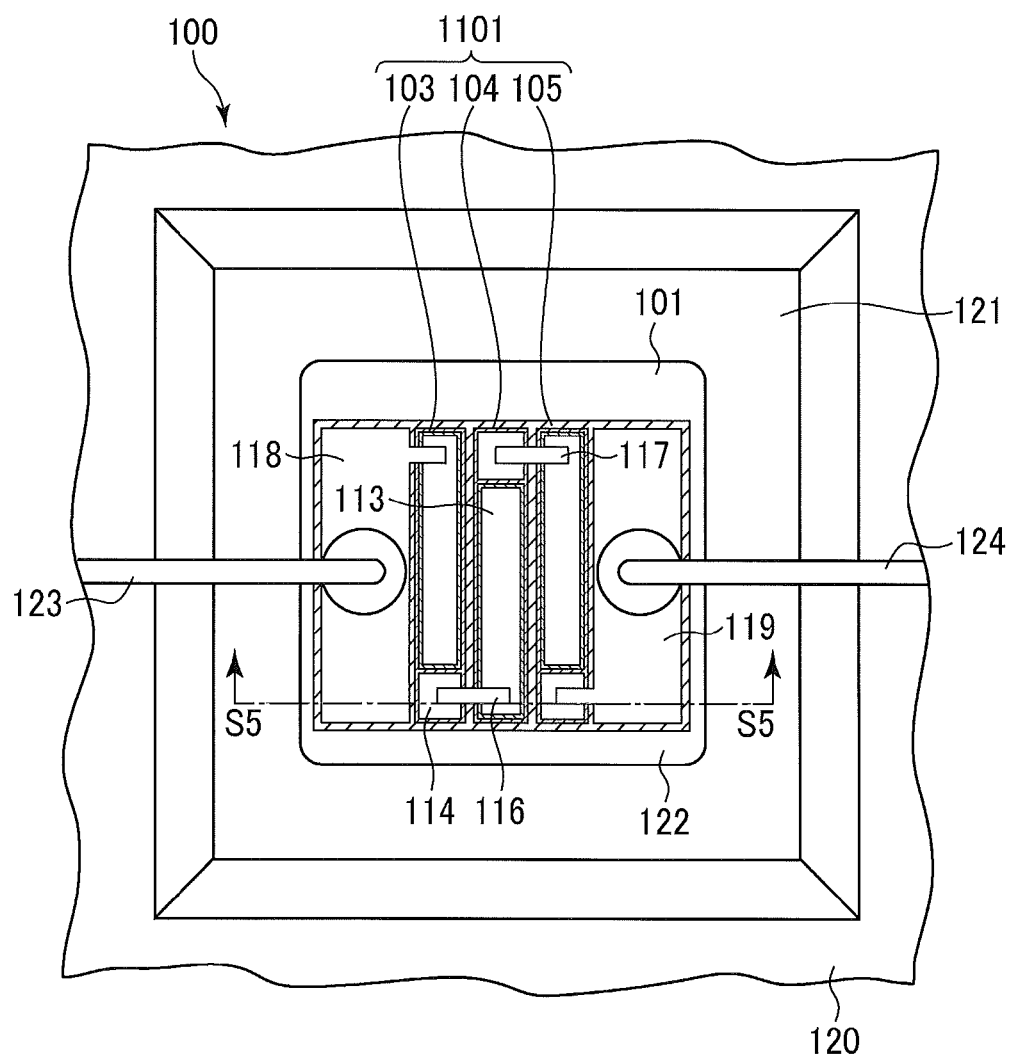
FIG. 24A is a top view of a lamp type LED module, illustrating a light emitting section of the lamp type LED module according to a tenth embodiment.
Figure 24B:
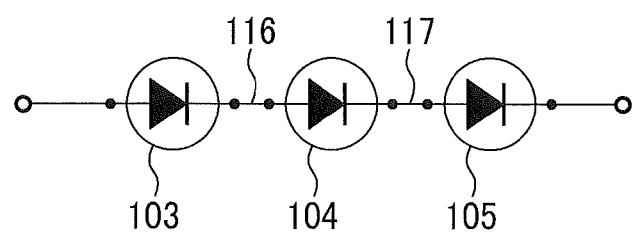
FIG. 24B is a circuit symbol of the light emitting section.
Figure 25:
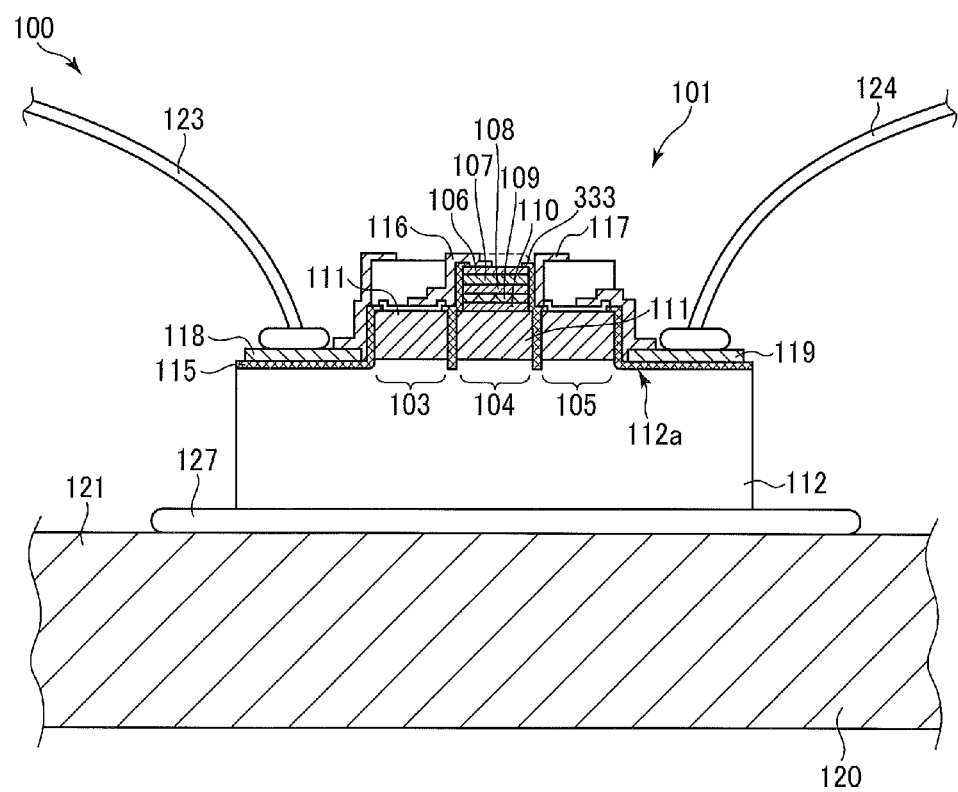
FIG. 25 is a cross-sectional view of the LED bare chip taken along a line S5-S5 in FIG. 24A.
Figure 26:
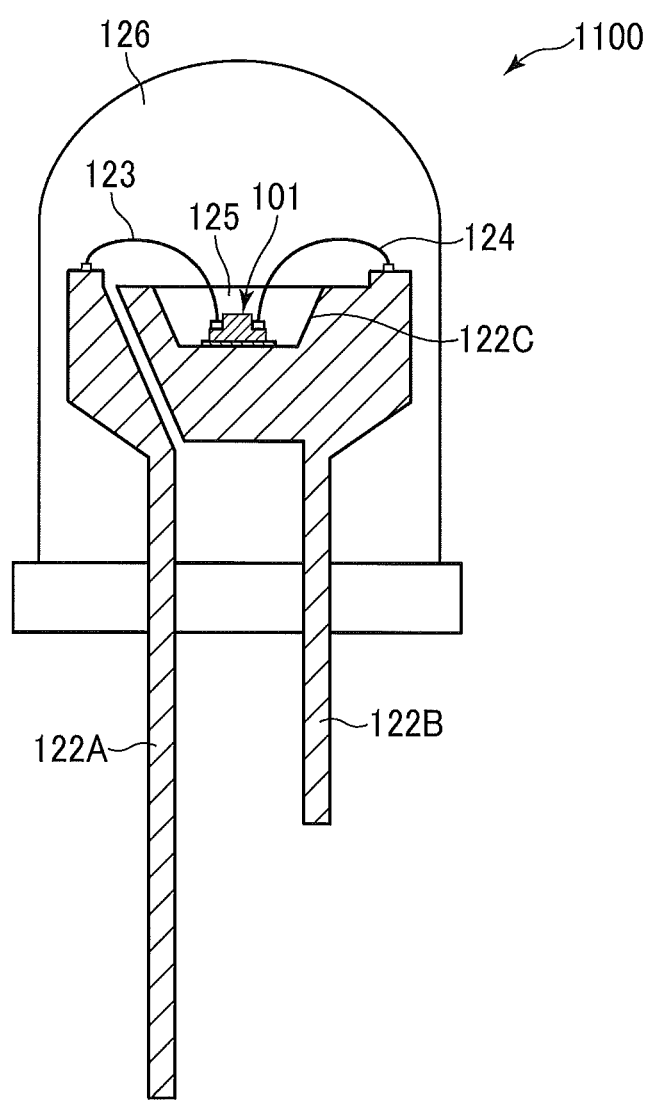
FIG. 26 is a longitudinal cross-sectional view of the LED module illustrating the outline of the LED module.

FIG. 24A is a top view of the lamp type LED module 1100, illustrating a light emitting section 1101 of the lamp type LED module 1100. FIG. 24B is a circuit symbol of the light emitting section 1101. FIG. 25 is a cross-sectional view of the LED bare chip 101 taken along a line S5-S5 in FIG. 24A. FIG. 26 is a longitudinal cross-sectional view of the LED module 1100 illustrating the outline of the LED module 1100.

Referring to FIGS. 24A, 24B, 25, and 26, the light emitting section 1101 includes a plurality of semiconductor light emitting elements, i.e., LED 103, LED 104, and LED 105, a junction wiring 116, and a junction wiring 117. The junction wirings 116 and 117 are in the form of a thin film wiring layer.

The LEDs 103, 104, and 105 are aligned on a major surface 112a of a substrate 112. Each LED has an anode electrode 106 and a cathode electrode 114.

Each of the junction wirings 116 and 117 electrically connects the cathode electrode of one of adjacent LEDs aligned in a row to the anode electrode of the other of the adjacent LEDs. Therefore, the adjacent LEDs are preferably disposed so that the cathode of one of the adjacent LEDs and the anode of the other of the adjacent LEDs are positioned horizontally side by side. The top surface of the adjacent LEDs need not be in flush with each other.

Any number of LEDs may be connected in series within a light emitting section 1101. The light emitting sections 1101 may be arranged in matrix form with a plurality of rows and columns, each row including a plurality of light emitting sections and each column including a plurality of light emitting sections.

Referring to FIG. 25, each light emitting section 1101 includes bare chip LEDs 103-105 connected in series. Each bare chip LED includes a transparent conductive film 106, an anode contact layer 107, an anode cladding layer 108, a light emitting layer 109, a cathode cladding layer 113, a cathode contact layer 111, an insulating growth substrate 112, which are stacked in this order from top to bottom.

The individual semiconductor layers of the LEDs 103-105 may be formed by known metal organic chemical vapor deposition (MOCVD) or molecular beam epitaxy (MBE).

The transparent conductive film 106 may be formed of indium tin oxide (ITO) or indium zinc oxide (IZO).

The anode contact layer 107 may be formed of, for example, p-GaN.

The anode cladding layer 108 may be formed of, for example, p-$Al_xGa_{1-x}N$ ($0 \le x \le 1$).

The light emitting layer 109 may be in a multi-quantum well structure (MQW) in which a plurality of quantum wells are stacked, each quantum well including a well layer formed of $In_yGa_{1-y}N$ ($0 < y \le 1$) and a barrier layer $InG_{1-z}N$ ($0 \le z \le 1$).

The cathode cladding layer 113 may be formed of n-$Al_{x1}Ga_{1-x1}N$ ($0 \le x1 \le 1$).

The cathode contact layer 111 may be formed of n-GaN.

The substrate 112 may be an insulating growth substrate, for example, a sapphire substrate.

The bare chip LEDs 1101 may be fabricated as follows: The cathode contact layer 111, cathode cladding layer 113, light emitting layer 109, anode cladding layer 108, anode contact layer 107, and transparent conductive film 106 are formed in this order on the substrate 112. This layered structure is then selectively dry-etched from the transparent conductive film 106 down to the cathode cladding layer 113 so that the cathode contact layer 111 is exposed. The structure left behind is a light emitting region 333.

Next, the selectively etched structure is further dry-etched to a depth at which the substrate 112 is partial etched away, so that the light emitting region of the LEDs 103-105 becomes individual islands completely independent of one another. In this manner, the LEDs 103-105 on the substrate 112 are electrically completely independent of one another.

Next, an interlayer dielectric film 115, formed of Si, $SiO_2$ or $Al_2O_3$, is formed on the surface of the LEDs 103-105 by chemical vapor deposition (CVD) or sputtering. The interlayer dielectric film 115 is then dry-etched using $CF_4$ or wet-etched using hydrofluoric acid or hot phosphoric acid, so that the upper surface of the cathode contact layer 111 is exposed. By a combination of photolithography and vapor deposition or a combination of photolithography and sputtering, a cathode electrode 114 is patterned to form a stacked layer of titanium and aluminum (Ti/Al) or a stacked layer of titanium, aluminum, nickel, and gold (Ti/Al/Ni/Au).

Next, the junction wiring 116 for connecting the cathode electrode 114 of the LED 103 to the transparent conductive film 106 of the LED 104, and the junction wiring 117 for connecting the cathode electrode 114 of the LED 104 to the transparent conductive film 106 of the LED 105 are formed of a metal material that contains Au or Al as a major composition. The junction wirings 116 and 117 are patterned by a combination of photolithography and vapor deposition or a combination of photolithography and sputtering. At the same time that the junction wirings 116 and 117 are formed, an anode electrode pad 118 is formed on an interlayer dielectric film 115, the anode electrode pad 118 having a size that can be wire-bonded to the transparent conductive film 106 of the LED 103. Likewise, a cathode electrode pad 119 is formed on the interlayer dielectric film 115, the cathode electrode pad 119 having a size that can be wire-bonded to the cathode electrode 114.

After obtaining the plurality of LEDs connected in series as described above, a dicing process or a cleavage process is performed on the wafer, thereby obtaining individual bare chips, i.e., light emitting sections 1101 having a plurality of LEDs connected in series. As shown in FIGS. 24A, 24B, 25, and 26, using a transparent bonding resin 127, for example, epoxy or silicone, the light emitting sections are mounted in a reflection cup 122C, which is formed on a cathode lead frame 122B formed of iron or an alloy of iron and copper. The cathode lead frame 122B may be plated with silver (Ag) which is a highly reflective material, thereby increasing the reflection efficiency of the reflection cup 122C.

By using a bonding wire 123, an anode lead frame 122A is interconnected to the anode electrode pad 118 of the light emitting section 1101 having a plurality of LEDs. By using a bonding wire 124, the cathode lead frame 122B is interconnected to the cathode electrode pad 119 of the light emitting section 1101 having series-connected LEDs.

If the lamp type LED module 1100 is to be used as a white light source, series-connected blue light emitting diodes are used as the light emitting section 1101 and the reflection cup 122C is filled with YAG (yttrium, aluminum, and garnet) as a fluorescent material 125, so that the YAG fluorescent material converts the blue light into yellow light, thereby producing white light as a combination of the blue light and the yellow light. If the light emitting section 1101 is formed of series-connected ultraviolet light emitting diodes, the reflection cup 122C is filled with a 3-wavelength fluorescent material as the fluorescent material 125, thereby producing white light. The fluorescent material 125 may be filled using a dispenser.

The cathode lead frame 122B and anode lead frame 122A are housed in a lens case 126 formed of an epoxy resin, thereby providing a lamp type LED module 1100.

{Modification}

Figure 27:
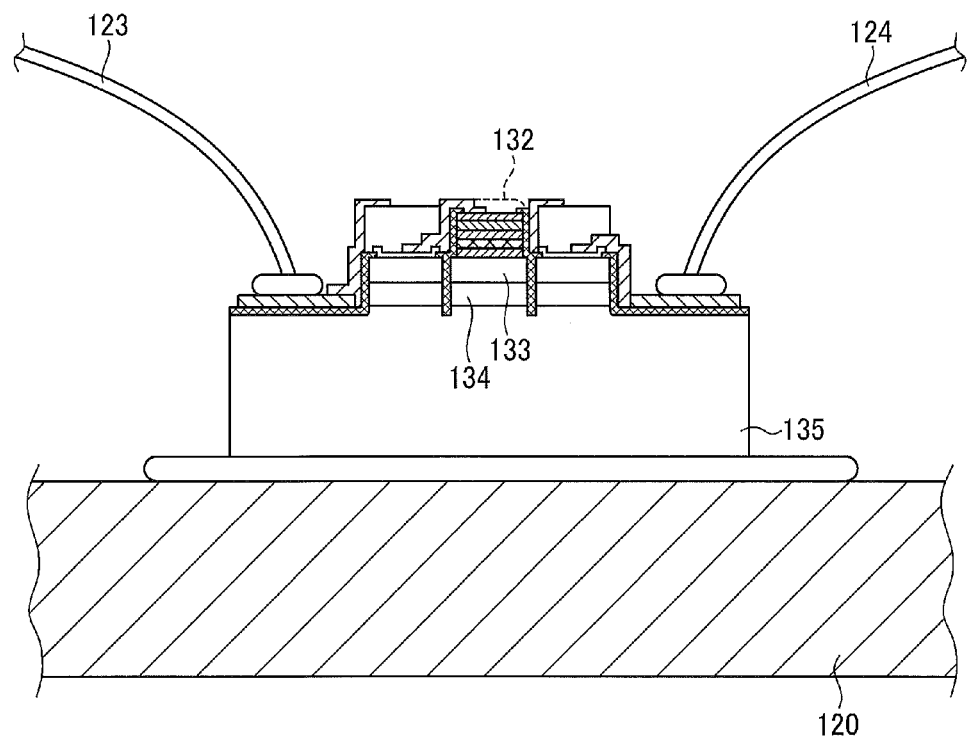
FIG. 27 is a longitudinal cross-sectional view illustrating the outline of a modification to the light emitting section of the lamp type LED module.

FIG. 27 is a longitudinal cross-sectional view illustrating the outline of a modification to the light emitting section 1101 of the lamp type LED module 1100. Although the tenth embodiment has been described in terms of the light emitting section 1101 formed of a nitride material, the light emitting section 1101 may also be formed of a GaAs material. The modification will now be described.

The modification differs from the tenth embodiment in the configuration of semiconductor layer. Specifically, a light emitting element 132 is in a layer structure constituted of a transparent conductive film 127, an anode contact layer 128, an anode cladding layer 129, a light emitting layer 130, and a cathode cladding layer 131. This layer structure and a cathode contact layer 133 are the same as the tenth embodiment. The modification further includes an isolation layer 134 formed between the layer structure and a growth substrate 135.

The semiconductor layer of the modification may be grown by known MOCVD or MBE just as in the basic configuration (FIG. 25). The transparent conductive film 127 may be formed by ITO or IZO. The anode contact layer 128 may be formed of p-GaP. The anode cladding layer 129 may be formed of p-$Al_xGa_{1-x}As$ ($0 \le x \le 1$). The light emitting layer 130 may be in a multi-quantum well structure (MQW) in which a plurality of quantum wells are stacked, each quantum well including a well layer formed of $(Al_yGa_{1-y}As)_{y1}In_{1-y1}P$ ($0 \le y$, $y1 \le 1$, $y+y1=1$) and a barrier layer formed of $(Al_zGa_{1-z})_{z1}In_{1-z1}P$ ($C \le z$ $z1 \le 1$, $z+z1=1$). The cladding layer 131 may be formed of n-$Al_{w2}Ga_{1-w}As$ ($0 \le w \le 1$). The isolation layer 134 is formed of, for example, p-$Al_uGa_{1-u}As$ ($0 \le u \le 1$). The semiconductor growth substrate 135 may be a p-type GaAs substrate or an n-type GaAs substrate.

{Operation of Tenth Embodiment}

In order for the lamp type LED module 1100 to operate, the anode lead frame 122A and cathode lead frame 122B of the lamp type LED module 1100 are connected to an output terminal for an anode wiring and an output terminal for a cathode wiring, respectively, which are disposed on an external host substrate. Current is injected into the anode lead frame 122A from a circuit built on the external host substrate via the anode bonding wire 123. Since the light emitting sections 1101 each include the LEDs 103-105 formed on the insulating growth substrate or formed on a semiconductor growth substrate with the isolation layer 134 interposed therebetween, the light emitting sections are electrically independent of one another. The current injected into the LED 103 flows through the LEDs 103, 104, and 105, thereby causing the LEDs 103, 104, and 105 to emit light. Thus, a substantially equal amount of current to a conventional single LED effectively produces an amount of light substantially three times larger amount of light power.

{Effects of Tenth Embodiment}

The LEDs 103-105 may be connected in series using the junction wirings 116 and 117 that can be formed by, for example, photolithography capable of accurate, high precision patterning. Thus, the LEDs 103-105 eliminate the need for using relatively large bonding pads that would otherwise be required for connecting conventional bare chip LEDs in series, thereby greatly reducing the chip size.

A series connection of a plurality of LEDs in a chip greatly reduces the number of die bonding connections or wire bonding connections, thereby simplifying the mounting process.

From a point of view of wire bonding or die bonding, the distance between adjacent LEDs may be shortened greatly and therefore high density package is possible, allowing more semiconductor light emitting elements to be housed in the reflection cup 122C. Thus, the lamp type LED module 1100 having a high light power may be implemented even if the overall size remains unchanged.

As described above, the high density package makes it possible to confine the light emitting section 1101 in a small area so that the light emitting section 1101 may be positioned at a location where the lens case 126 can most efficiently focus the light emitted from the light emitting section 1101. Therefore, the lamp type LED module 1100 may provide a high light output without sacrificing distribution of luminous intensity.

The configuration also eliminates the need for connecting the bonding wire directly to the anode electrode of the LED, thereby implementing the lamp type LED module 1100 with a high light output as compared with the prior art without sacrificing light extraction efficiency.

The use of the light emitting section 1101 according to the tenth embodiment implements a small size lamp type LED module with a higher light output as compared to the prior art.

Eleventh Embodiment

{Configuration}

Figure 28A:
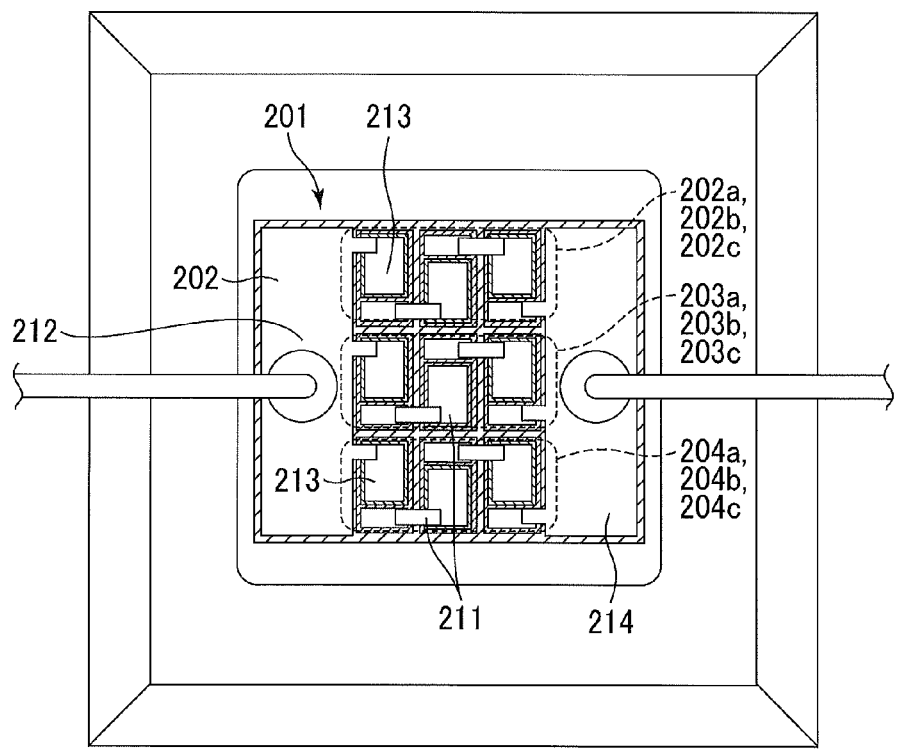
FIG. 28A is a top view illustrating the outline of a light emitting section according to an eleventh embodiment.
Figure 28B:
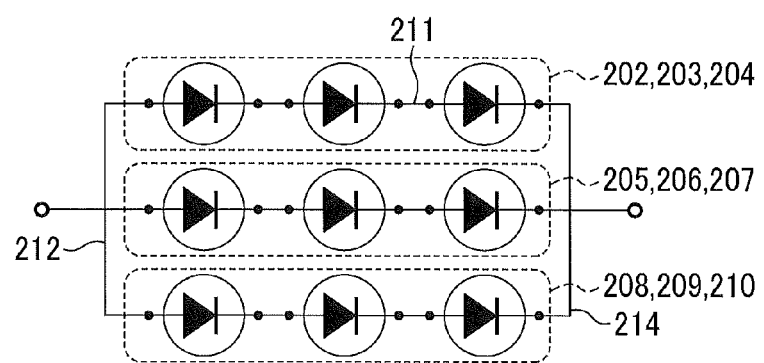
FIG. 28B is a circuit symbol of the light emitting section.

FIG. 28A is a top view illustrating the outline of a light emitting section 201 according to an eleventh embodiment. FIG. 28B is a circuit symbol of the light emitting section 201. Just as in the tenth embodiment, an isolation layer is formed on a semiconductor substrate, and a plurality of LEDs 202a-204c are formed on the isolation layer. Alternatively, the plurality of LEDs 202a-202c may be formed directly on an insulating substrate. A group of LEDs 202a-202c, a group of LEDs 203a-203c, and a group of LEDs 204a-204c are electrically completely isolated from one another before they are interconnected in parallel. Each group includes three LEDs connected in series.

In manufacturing, just as in the tenth embodiment, the LEDs 202a-202c, 203a-203c, and 204a-204c are connected in series using junction wirings. The anode electrode pad 212 is connected to the transparent conductor films 213 of the LEDs 202a, 203a, and 204a. Likewise, the cathode electrode pad 214 is connected to the cathode electrodes 215 of the LEDs 202c, 203c, and 204c. In this manner, the light emitting section 201 can be manufactured which has a parallel connection of groups of LEDs, each group including series-connected LEDs 202a-204c.

The light emitting section 201 may be formed of a nitride semiconductor material, or a GaAs semiconductor material.

The light emitting section 201 may be housed in a lamp type LED module 1100 just as in the tenth embodiment.

{Effects of Eleventh Embodiment}

Mounting the light emitting section 201 in a lamp type LED module eliminates the need for forming relatively large bonding pads on the LEDs which would otherwise be required in the conventional bare chip LEDs, and makes it possible to implement small size chips.

Employing a parallel circuit of series-connected LEDs 202a-202c, 203a-203c, and 24a-204c is effective in reducing the number of bonding wires and die bonding pads, thereby greatly simplifying the manufacturing process. From a point of view of wire bonding or die bonding, the distance between adjacent LEDs may be shortened greatly and therefore high density package is possible, allowing more semiconductor light emitting elements to be housed in the reflection cup 122C. Thus, the lamp type LED module 1100 having a high light power may be implemented even if the overall size remains unchanged.

The above-described high density packaging makes it possible to confine the light emitting section 1101 in a small area so that the light emitting section 1101 may be accurately positioned at a location where the lens case 126 can most efficiently focus the light emitted from the light emitting section 1101. Thus, the high density package implements a lamp type LED module with high light output without impairing the desired light distribution.

The configuration also eliminates the need for directly connecting the bonding wires on the anode electrodes of the LEDs, thereby implementing the lamp type LED module 1100 with a higher light output as compared with the prior art, without sacrificing light extraction efficiency.

Employing the parallel circuit of series-connected LEDs 202a-202c, 203a-203c, and 204a-204c is advantageous in that if one of the LEDs in one of these three groups becomes open and fails to emit light, the remaining two groups of LEDs can still emit light preventing the entire lamp type LED module from completely failing to emit light.

The use of the light emitting section 1101 according to the eleventh embodiment implements a lamp type LED module with a higher light output as compared to the prior art without sacrificing the light extraction efficiency.

Twelfth Embodiment

{Configuration and Operation}

Figure 29:
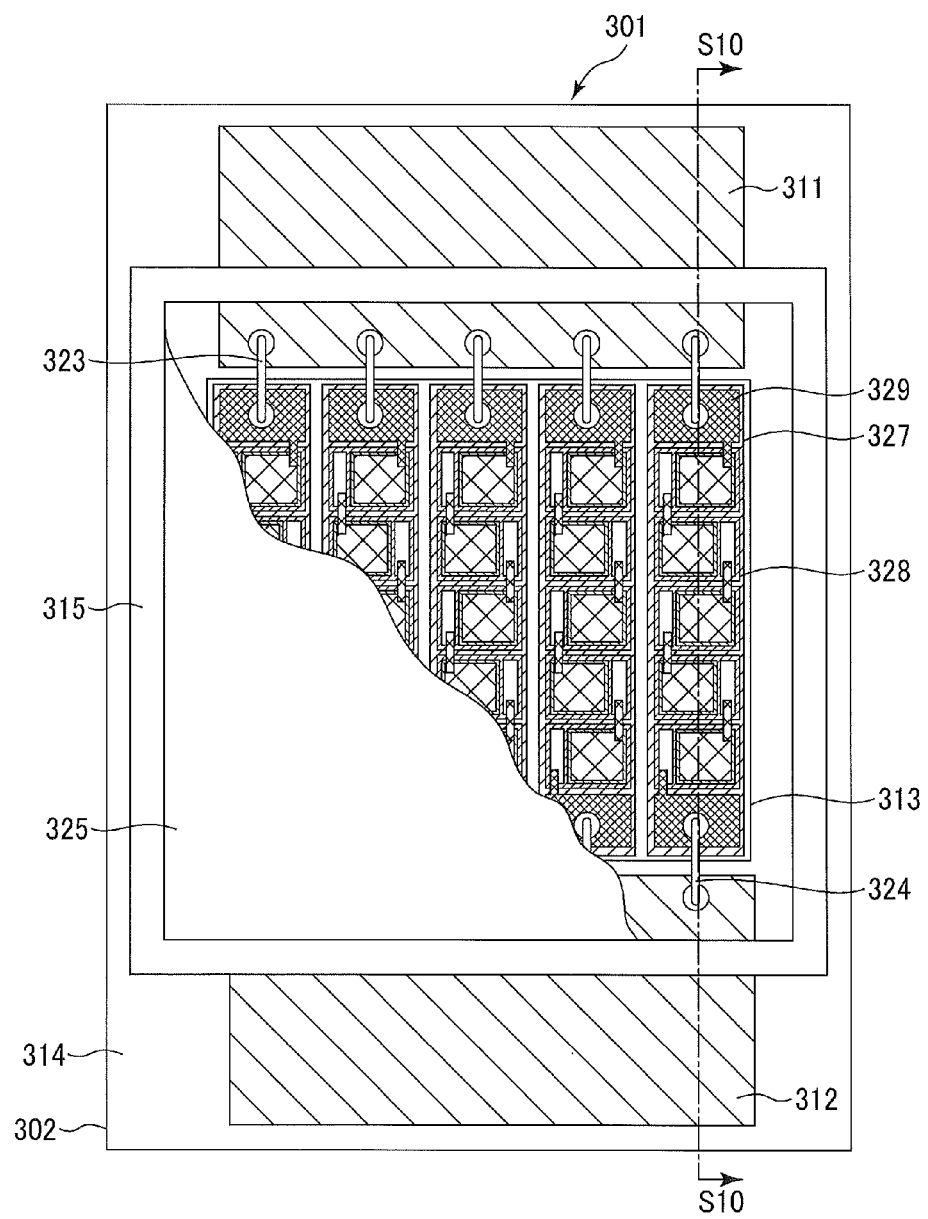
FIG. 29 is a top view partially cut away showing the outline of a lamp type LED module according to a twelfth embodiment.
Figure 30:
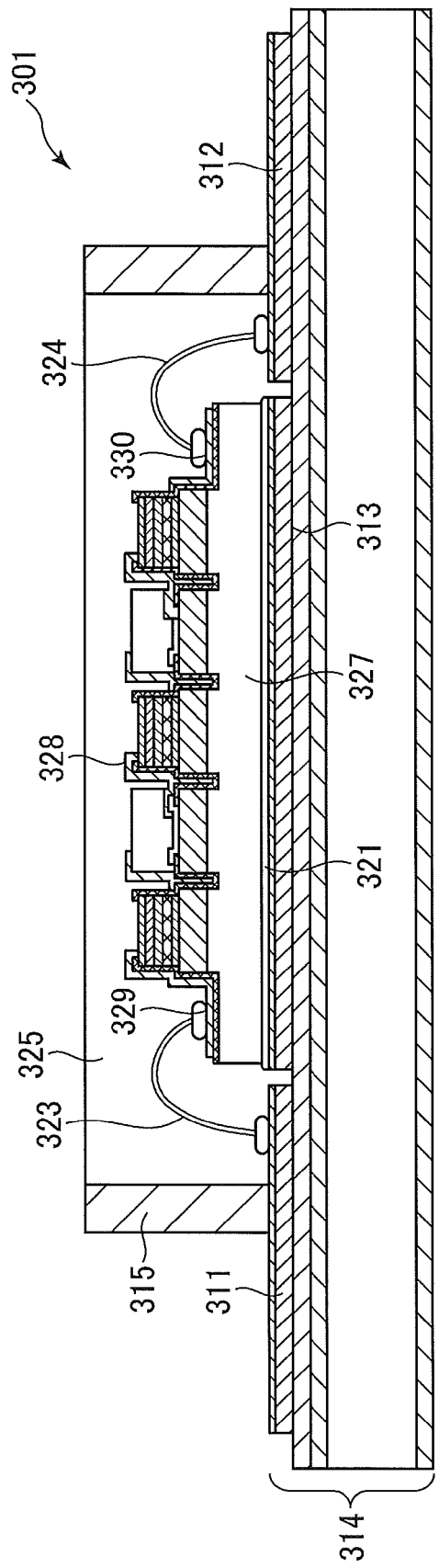
FIG. 30 is a cross-sectional view taken along a line S10-S10 in FIG. 29.
Figure 31:
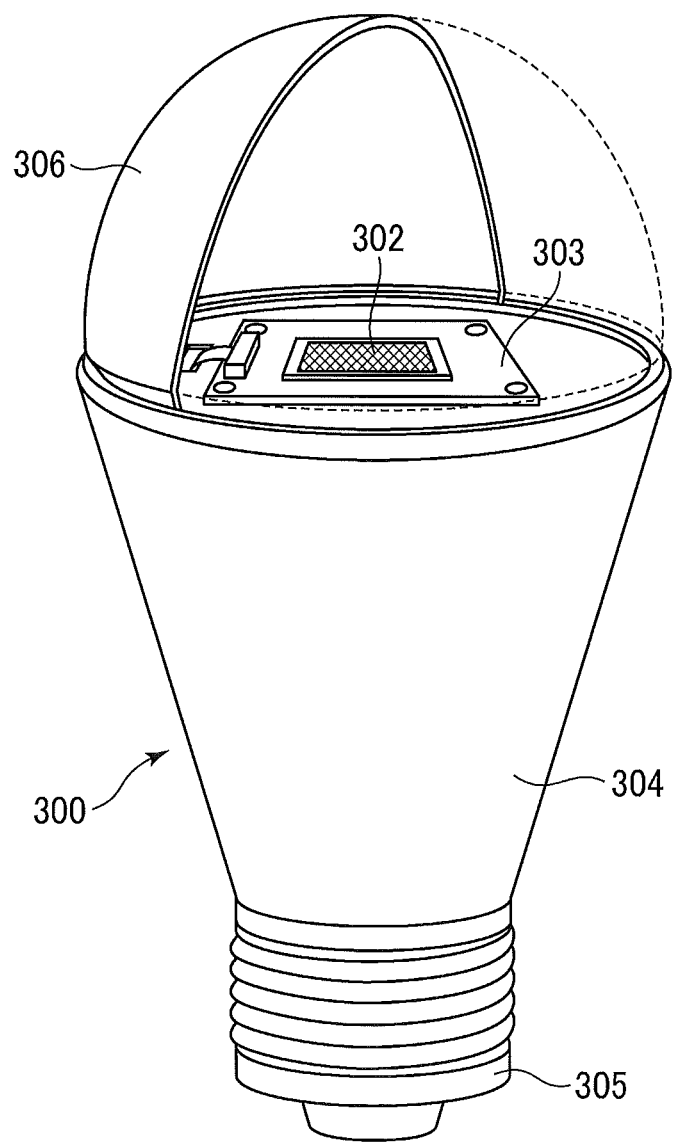
FIG. 31 is a perspective cut way view, showing the outline of an illumination apparatus (i.e., LED lamp)
Figure 32A:
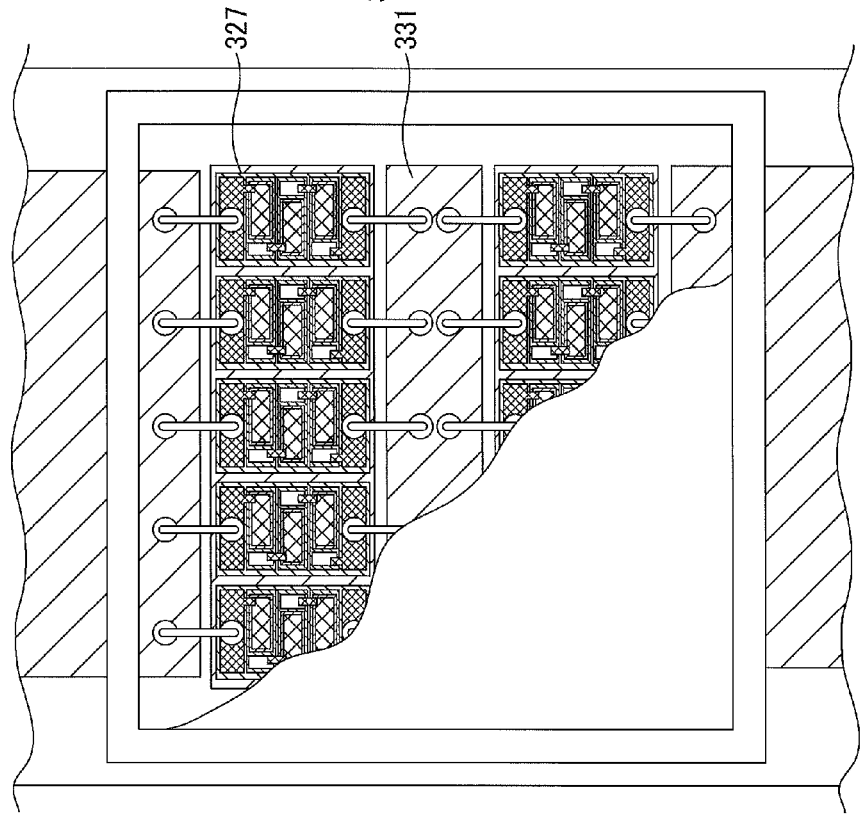
FIG. 32A is a top view illustrating a lamp type LED module according to a first modification to the twelfth embodiment.
Figure 32B:
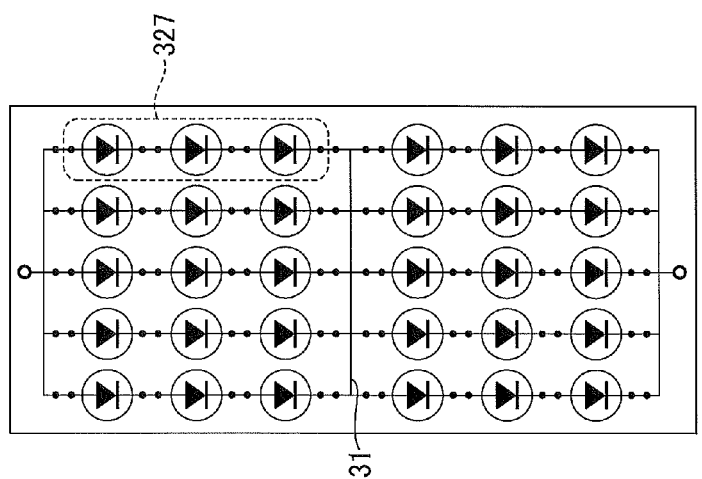
FIG. 32B is a circuit symbol of the lamp type LED module shown in FIG. 32A.
Figure 34B:
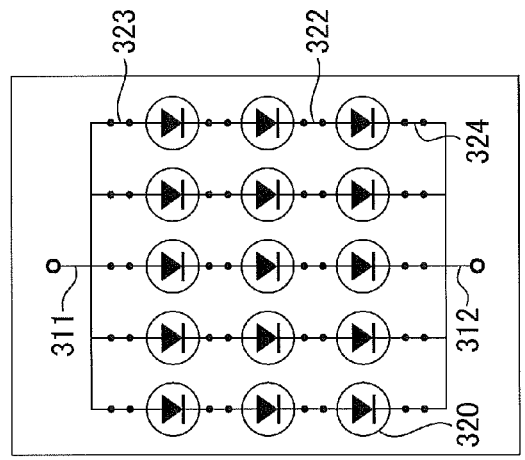
FIG. 34B is a circuit symbol of the lamp type LED module shown in FIG. 34A.
Figure 34A:
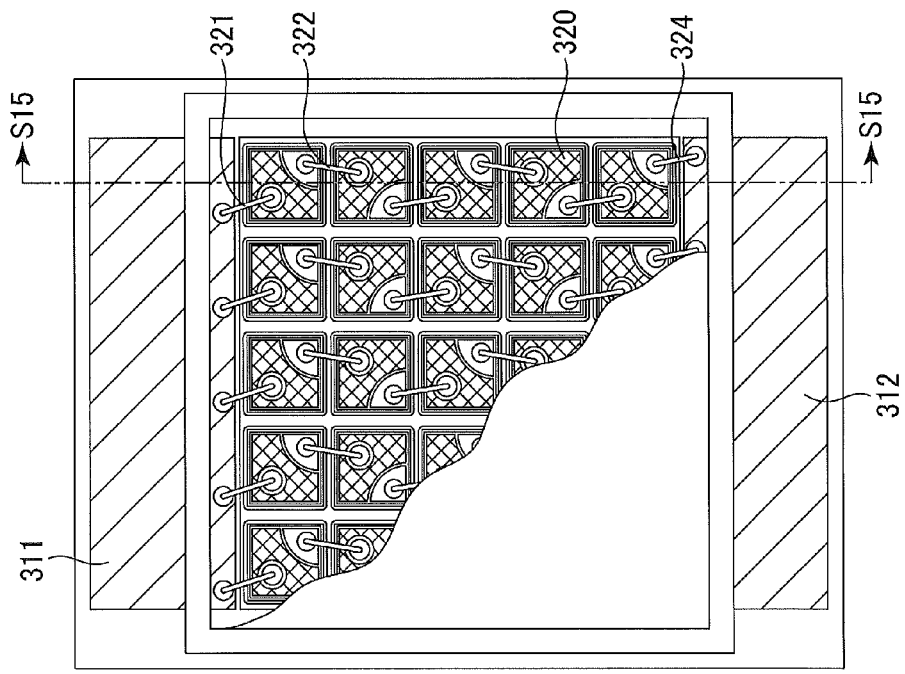
FIG. 34A is a top view illustrating the lamp type LED module according to the second modification.
Figure 35:
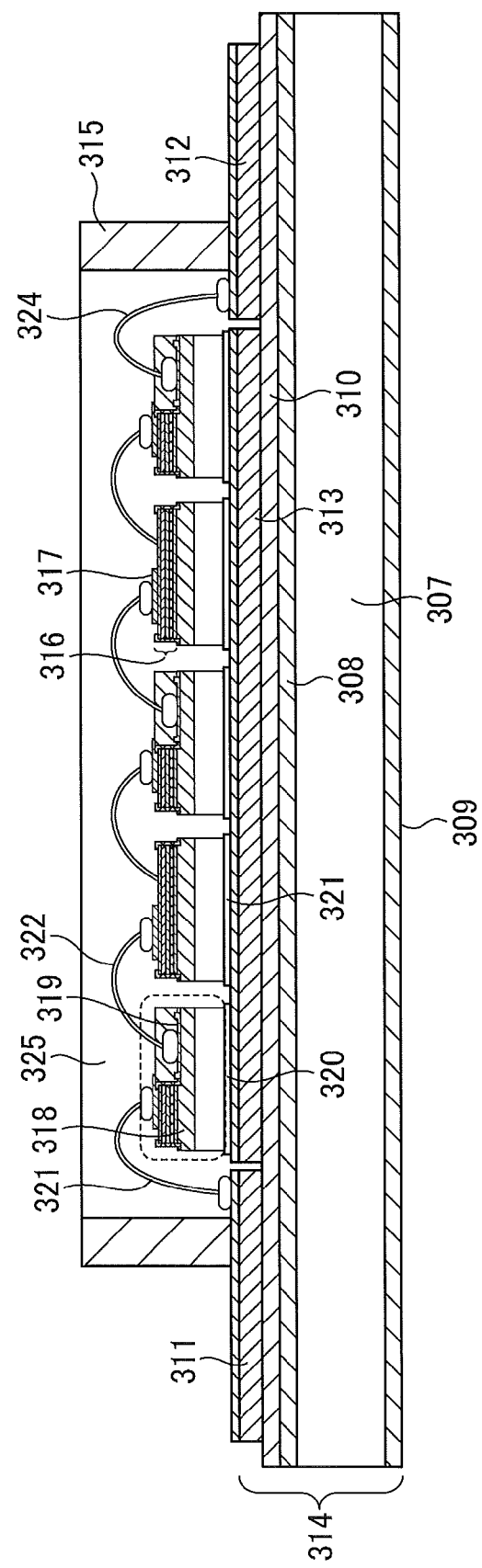
FIG. 35 is a cross-sectional view taken along a line S15-S15 in FIG. 34A.

FIG. 29 is a top view partially cut away showing the outline of a lamp type LED module 301 according to a twelfth embodiment. FIG. 30 is a cross-sectional view taken along a line S10-S10 in FIG. 29. FIG. 31 is a perspective cut way view, showing the outline of an illumination apparatus (i.e., LED lamp). FIG. 32A is a top view illustrating a lamp type LED module according to a first modification to the twelfth embodiment. FIG. 32B is a circuit symbol of the lamp type LED module shown in FIG. 32A. FIG. 33A is a top view illustrating a lamp type LED module according to a second modification to the twelfth embodiment. FIG. 33B illustrates a circuit symbol of the lamp type LED module shown in FIG. 33A. FIG. 34A is a top view illustrating the lamp type LED module according to the second modification. FIG. 34B is a circuit symbol of the lamp type LED module shown in FIG. 34A. FIG. 35 is a cross-sectional view taken along a line S15-S15 in FIG. 34A.

As shown in FIG. 31, an LED illumination apparatus 300 includes a circuit board 303 that supports the lamp type LED module 301 thereon. The circuit board 303 is disposed on a cover 304 that houses the electrical circuit therein. The electrical circuit drives the lamp type LED module 301. A base 305 is attached to one end portion of the cover 304 and a globe 306 is attached to the other end of the cover 304. The light scattering effect of the globe 306 causes radiation of soft light emitted from the lamp type LED module 301, the light having a wide distribution of luminous intensity.

The basic configuration of the lamp type LED module for the illumination apparatus will be described with reference to FIGS. 32A, 32B, 33A, 33B, 34A, 34B, and 35.

The lamp type LED module 301 is manufactured as follows: The major surfaces of a metal core 307 (FIG. 35) whose major composition is aluminum (Al) are coated with an alumite layer 308 and an alumite layer 309. The alumite layer 308 is coated with an insulating adhesive layer 310. An anode electrode pad 311 formed of a copper foil, a cathode electrode connection pad 312, a light emitting region reflection metal 313 are formed on the insulating adhesive layer 310, thereby forming a base substrate 314. The anode electrode connection pad 311 and the cathode electrode connection pad 312 may be gold-plated for intimate contact of the bonding wire. The light emitting region reflection metal 313 may be silver-plated for improved reflection efficiency. Further, banks 315 having a height of about 1 mm are formed to surround a plurality of bare chip LEDs. The banks 315 may be formed, for example, by dispensing epoxy resin.

A plurality of bare chip LEDs 320 are mounted on the light emitting region reflection metal 313 using a transparent bonding resin 321. The bare chip LED 320 includes a light emitting region 316 (FIG. 33A) with a transparent conductive film placed on a top thereof, an anode electrode pad 317 (FIG. 33A) formed on the light emitting region 316, and a cathode electrode pad 319 (FIG. 33A) formed on a cathode contact layer 318. The plurality of bare chip LEDs 320 (FIG. 34A) are interconnected in series using bonding wires. The anode electrode pad 317 of a first one of the plurality of bare chip LEDs is connected to the anode electrode connection pad 311 with a bonding wire 323 (FIG. 34A). The cathode electrode pad 312 of a last one of the plurality of bare chip LEDs is connected to the cathode electrode connection pad 312 with a bonding wire 324. Likewise, the remaining bare chip LEDs 320 are interconnected, thereby resulting in a parallel connection of groups of series-connected bare chip LEDs 320. A fluorescent material 325 such as VAG fluorescent material or 3-wavelength fluorescent material is dispensed into a space defined by the banks 315, thereby completing the lamp type LED module 301.

FIGS. 33A and 33B illustrate a different configuration from that shown in FIGS. 32A and 32B. A plurality of groups of bare chip LEDs are connected in series, each group including series-connected bare chip LEDs. The anode electrode pad 317 of the first bare chip LED 320 of the first group of the series-connected groups is connected to the anode electrode connection pad 311 using the bonding wire 323. The cathode electrode pad 319 of the last bare chip LED 320 of the last group of the series-connected groups is connected to the cathode electrode connection pad 312 using the bonding wire 324, thereby connecting the plurality of groups so that all of the bare chip LEDs are connected in series.

FIGS. 29 and 30 illustrate an example of a lamp type LED module 301 implemented with the semiconductor light emitting element according to the tenth and eleventh embodiments. The base substrate 314 may have the same configuration as those shown in FIGS. 32A, 32B, 33A, 33B, 34A, and 34B. A plurality of groups 327 of bare chip LEDs according to the twelfth embodiment are formed on the light emitting region reflection metal 313 of the base substrate 314 using the transparent bonding resin 321. FIGS. 33A and 33B illustrate five groups of bare chip LEDs, each group including five bare chip LEDs. This configuration in which a plurality of bare chip LEDs are connected in series is the same as those of the tenth and eleventh embodiments. The groups 327 of bare chip LEDs are formed on an insulating substrate or a semiconductor growth substrate with an isolation layer interposed between the bare chip LEDs and the semiconductor growth substrate, so that the bare chip LEDs are electrically isolated from one another. The respective bare chip LEDs are connected in series using junction wirings 328, thereby forming a group 327 of series-connected bare chip LEDs. The anode electrode pad 329 of the groups 327 of series-connected bare chip LEDs is connected to the anode electrode connection pad 311 formed on the base substrate 314 using the bonding wire 323. The cathode electrode pad 330 formed on the bare chip LED is connected to the cathode electrode pad 312 formed on the base substrate 314 using the bonding wire 324. The fluorescent material 325 is introduced into the space defined by the banks 315, thereby completing the lamp type LED module 301. FIG. 29 illustrates an example of a parallel connection of series-connected bare chip LEDs. This lamp type LED module 301 may also be implemented by connecting in series the groups of the series-connected bare chip LEDs, thereby configuring a single current path.

FIGS. 34A and 34B illustrate the lamp type LED module 301 according to the second modification to the twelfth embodiment. The second modification has the same configuration as the twelfth embodiment, i.e., a parallel connection of a plurality of groups of series-connected bare chip LEDs except that a relay electrode pad 331 (FIG. 12) is used to make a parallel circuit of groups of series-connected bare chip LEDs.

{Effects of Twelfth Embodiment}

The lamp type LED module 301 shown in FIGS. 29 and 30 employs a series circuit of a plurality of bare chip LEDs according to the tenth and eleventh embodiments or a parallel circuit of groups of series-connected bare chip LEDs according to the tenth and eleventh embodiments. This configuration allows a plurality of bare chip LEDs to be densely packed in a limited area, implementing a small size lamp type LED module 301 which still outputs an equivalent amount of light output to the prior art. This densely packed apparatus allows a large number of LEDs to be located in a limited area, thereby offering the lamp type LED module with a high light output.

Since groups 327 of a plurality of bare chip LEDs formed on the substrate are interconnected by means of junction wirings 328 (FIG. 30) which can be formed using photolithography, the number of interconnections by die bonding and wire bonding may be minimized, greatly reducing the mounting cost of bare chip LEDs.

As shown in FIG. 12, the parallel-connection of bare chip LEDs prevents the lamp type LED module from failing to emit light completely due to failure of a single LED, thus minimizing the change in light output.

Thirteenth Embodiment

{Configuration and Operation}

Figure 36:
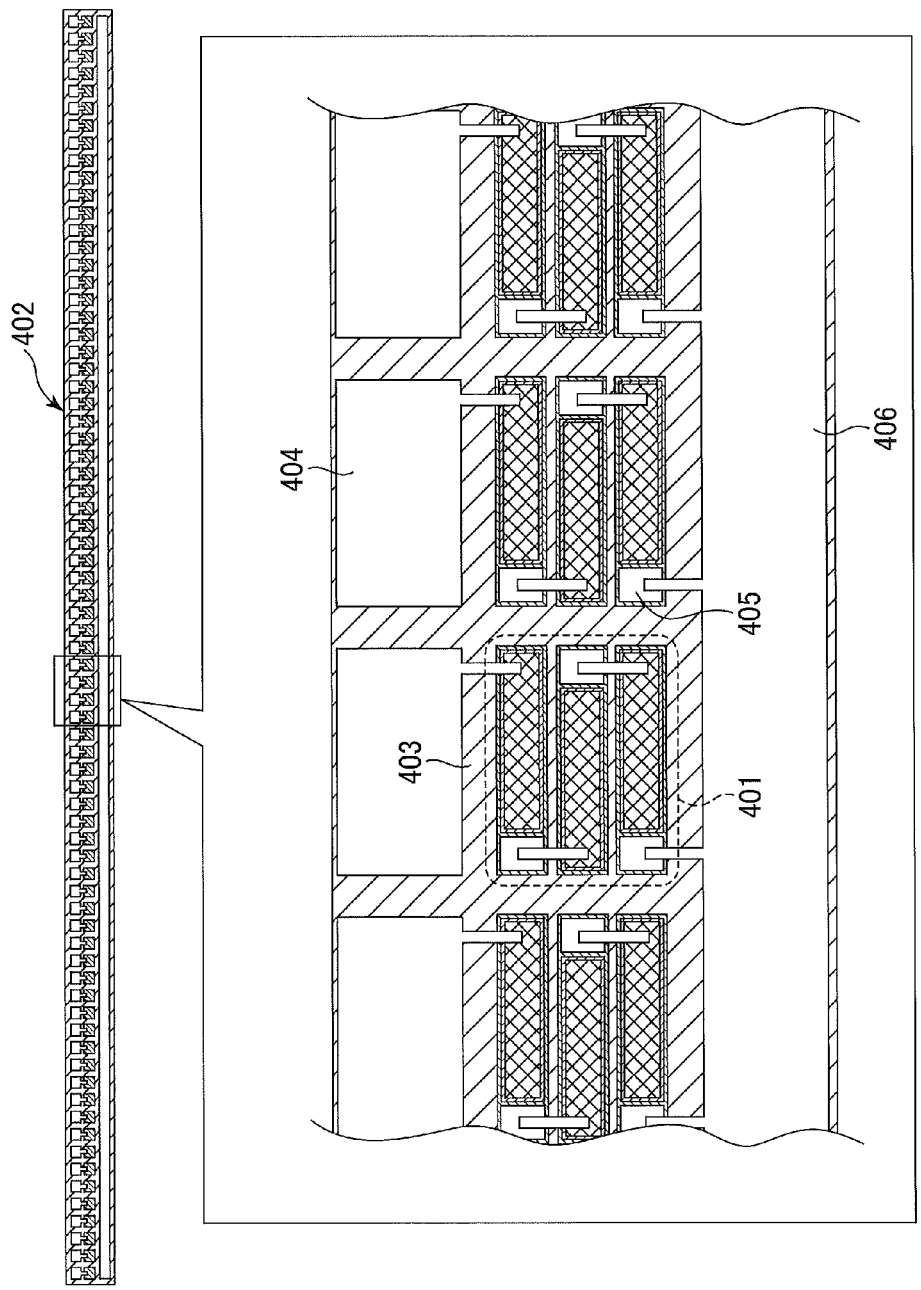
FIG. 36 is a top view illustrating the outline of an LED array light emitting apparatus according to a thirteenth embodiment.

FIG. 36 is a top view illustrating the outline of an LED array light emitting apparatus 402 according to a thirteenth embodiment.

In the thirteenth embodiment, just as in the tenth and eleventh embodiments, the semiconductor light emitting element may be formed of a nitride material or a GaAs material. The thirteenth embodiment will be described with respect to the LED array light emitting apparatus 402 in which an LED pixel 401 formed of series-connected three LEDs makes one pixel. The light emitting section 403, which is the first one of three series-connected LEDs and has a transparent conductive film on its top, is connected to an anode electrode pad 404 with a bonding wire. The anode electrode pad 404 is formed in the vicinity of the light emitting element 403. The last LED of the series-connected three LEDs has a cathode electrode 405 connected to a cathode common electrode pad 406. The cathode common electrode pad 406 is on a side of the LED pixel 401 opposite the anode electrode pad 404, and is in the vicinity of the last LED of the series-connected three LEDs. In this manner, the LED pixel 401 is formed of a plurality of LEDs connected in series. A plurality of LED pixels 401 are aligned in one dimensional array form, i.e., an LED array light emitting apparatus 402.

A driver circuit has an anode output terminal and a cathode output terminal, and drives the LED array light emitting apparatus 402. The anode output terminal is wire-bonded to the anode electrode pad 404 of the LED array light emitting apparatus 402. The cathode output terminal is wire-bonded to the cathode common electrode pad 406 of the LED array light emitting apparatus 402.

The LED array light emitting apparatus 402 according to the thirteenth embodiment operates as follows: The driver circuit outputs current from its anode output terminal to the LED pixels 401, the return current flowing out from the cathode common electrode pad 406 into the cathode output terminal of the driver circuit. The output current is fed into the individual anode electrode pads 404 one at a time in sequence.
{Effects of Thirteenth Embodiment}
The LED array light emitting apparatus 402 employs the LED pixels 401 each of which is formed of a plurality of LEDs connected in series. The light output of each pixel is substantially proportional to the number of series-connected LEDs, so that for the same amount of current, three LEDs, for example, produce three times larger light output than a single LED.

The LED pixels 401 may be interconnected by junction wirings which can be formed by photolithography. Thus, the LEDs pixels 401 are effective in realizing densely packed series-connected LEDs with the dot size remaining substantially unchanged, being suitable for implementing a high definition LED array light emitting apparatus 402.

Figure 37:
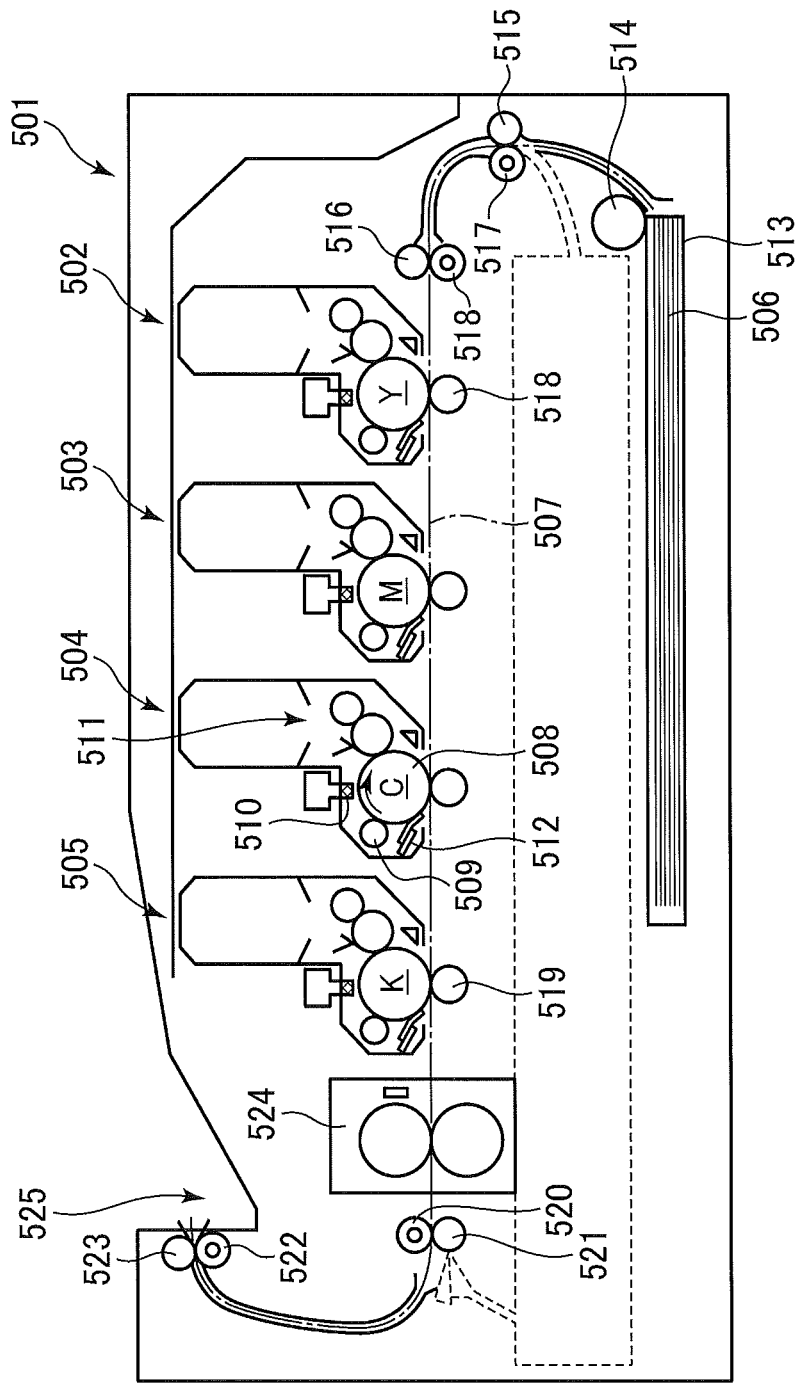
FIG. 37 illustrates the outline of an LED printer as an image forming apparatus according to a fourteenth embodiment.

As described above, a one-dimensional LED array with a high light output and high definition may be implemented for the same amount of injected current as the prior art.
Fourteenth Embodiment
{Configuration}
FIG. 37 illustrates the outline of an LED printer 501 as an image forming apparatus according to a fourteenth embodiment. The LED printer 501 employs the LED array light emitting apparatus 402 according to the thirteenth embodiment. The LED printer 501 includes four electrophotographic process units 502-505, each process unit forming an image of a corresponding color, i.e., yellow (Y), magenta (M), cyan (C), or black (K). The process units 502-505 are aligned in tandem along a transport path 507 of a medium 506. Each process unit includes a photoconductive drum 508 as an image bearing body, a charging unit 509 that charges the surface of the photoconductive drum 508, and an exposing unit 510 that illuminates the charged surface of the photoconductive drum 508 to form an electrostatic latent image. The charging unit 509 and exposing unit 510 are disposed around the photoconductive drum 508. The exposing unit 510 can be implemented with the LED array light emitting apparatus according to the thirteenth embodiment.

The LED printer 501 also includes a developing unit 511 that supplies toner to the electrostatic latent image formed on the photoconductive drum 508, and a cleaning unit 512 that removes residual toner from the surface of the photoconductive drum 508. The photoconductive drum 508 is driven in rotation by a drive mechanism and a gear train in a direction shown by an arrow. The LED printer 501 further includes a paper cassette 513 that holds a stack of the medium 506, and a hopping roller 514 that feeds the medium 506 to a transport path on a sheet-by-sheet basis. Registry rollers 517 and 518 are disposed downstream of the hopping roller 514 and cooperate with pinch rollers 515 and 516, respectively, to hold the medium 506 therebetween in a sandwiched relation, thereby correcting the skew of the medium 506. The hopping roller 514 and the registry rollers 517 and 518 are driven in rotation by a drive source not shown.

The LED printer 501 includes transfer rollers 519 that parallel the photoconductive drums 508, and are formed of a semi-conductive rubber material. The photoconductive drum 508 and the transfer roller 519 receive high voltages by which the toner image on the photoconductive drum 508 is transferred onto the medium 506. The LED printer 501 further includes a pair of discharge rollers 520 and 521 and a pair of discharge rollers 522 and 523 that cooperate with each other to discharge the printed medium 506.
{Operation}
The hopping roller 514 feeds the medium 506 held in the paper cassette 513 on a sheet-by-sheet basis. The recording medium 506 passes through the registry rollers 517 and 518 and pinch rollers 515 and 516 and then through the process units 502-505 in this order. In the respective process units 502-505, the medium 506 passes through a contact area between the photoconductive drum 508 and transfer roller 519 so that the toner images of corresponding colors are transferred onto the medium 506 in registration. The medium 506 then passes through a fixing unit 524 that fixes the toner images by heat and pressure. After fixing, the medium 506 is discharged onto a stacker 525 by the discharge rollers 520-523.
{Effects of Fourteenth Embodiment}
The exposing unit 510, which employs the LED array light emitting apparatus 402 according to the thirteenth embodiment, has a higher luminance than the prior art for the same amount of injected current. The increased luminance shortens illumination time required for the exposing unit to form an electrostatic latent image, increasing the printing speed of the LED printer 501.

Figure 38:
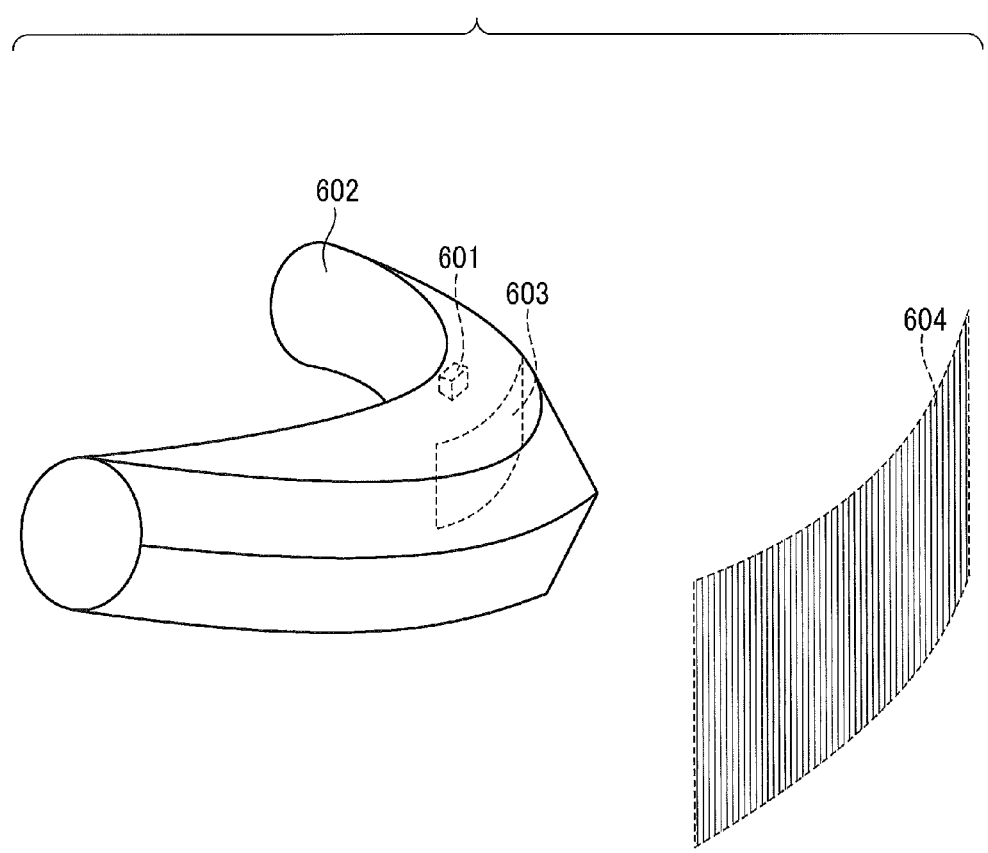
FIG. 38 is a perspective view illustrating the outline of the configuration of a head-mounted display (HMD)

The exposing unit 510, which employs series-connected LEDs according to the thirteenth embodiment for each pixel, not only increases the printing speed of the LED printer 501 but also provides high definition printing.
Fifteenth Embodiment
{Configuration}
FIG. 38 is a perspective view illustrating the outline of the configuration of a head-mounted display (HMD). The HMD includes an image displaying unit 601, a body 602, and a reflector 603. The reflector 603 is positioned forward of the image displaying unit 601 in the light path. The reflector 603 makes a virtual erect image of the image emitted from the image displaying unit 601, so that the user views the magnified virtual image 604. If the reflector 603 is not transmissive, the HMD can be a non-transmissive HMD. If the reflector 603 is a half-mirror, the HMD can be a transmissive HMD.

Figure 39:
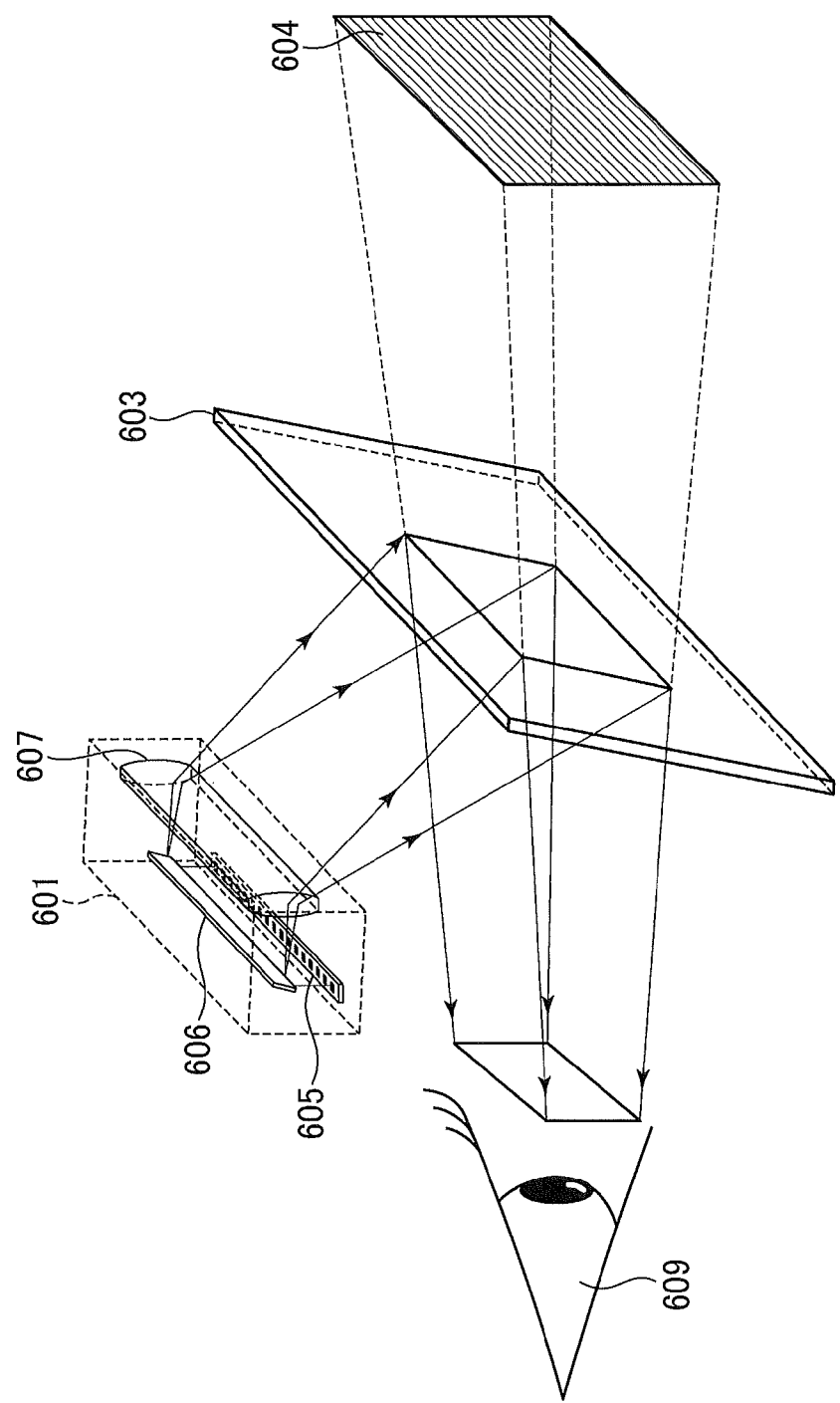
FIG. 39 illustrates the outline of the internal structure of the HMD as an image displaying apparatus according to the fifteenth embodiment.

FIG. 39 illustrates the outline of the internal structure of the HMD as an image displaying apparatus according to the fifteenth embodiment. The LED light emitting apparatus 605 is implemented with the LED array light emitting apparatus 402. A scanning mirror 606 is disposed directly over the LED light emitting apparatus 605 and scans the one dimensional image, thereby realizing a two-dimensional image. A convex lens 607 is disposed in the path of the light reflected by the scanning mirror 606. The scanning mirror 606 is disposed so that the scanning mirror 606 is between the convex lens 607 and the focal plane of the convex lens 607. Thus, adjusting the distance of the lens 607 relative to the scanning mirror 606 allows the magnifying factor of the image to be adjusted.

The scanning mirror 606 and convex lens 607 housed within the HMD image displaying unit 601 cause the light exiting the convex lens 607 to form an erect virtual image. The reflector 603 reflects the light exiting the convex lens 607 to the viewer's eyes 609. As a result, the viewer's eyes see a magnified virtual image 604 formed behind the reflector 603. Although the HMD shown in FIG. 39 employs the convex lens 607 in order to form a magnified erect virtual image, a concave mirror may also be used as a turning mirror.

{Effects of Fifteenth Embodiment}

The HMD image displaying unit that incorporates the LED array light emitting apparatus 402 according to the thirteenth embodiment, has a higher luminance than the prior art for the same amount of injected current while also maintaining the resolution of the conventional LED array light emitting apparatus.

Sixteenth Embodiment

{Configuration and Operation}

Figure 40:
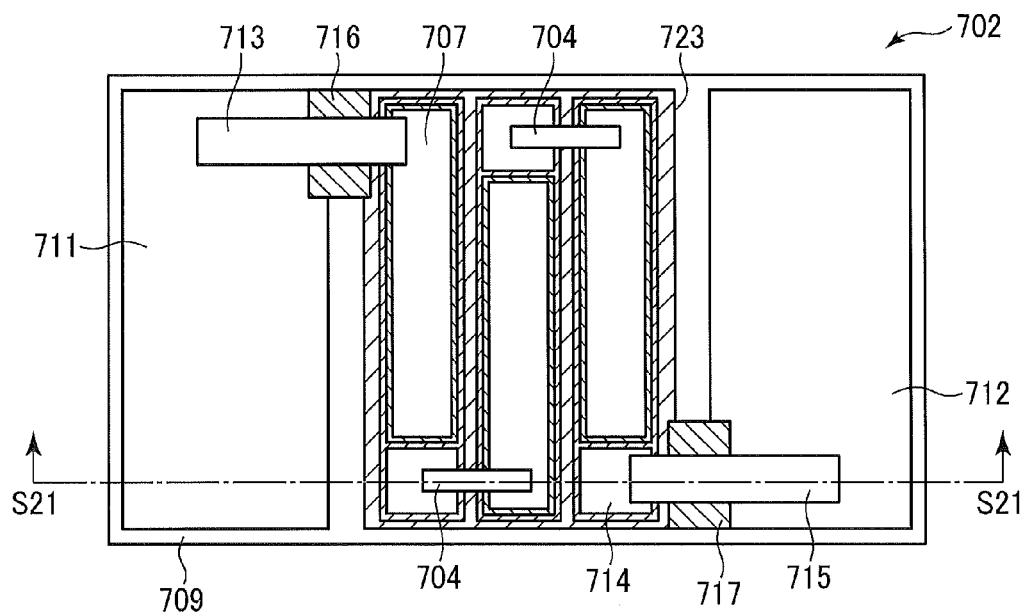
FIG. 40 is a top view of a modification to the sixteenth embodiment.
Figure 41:
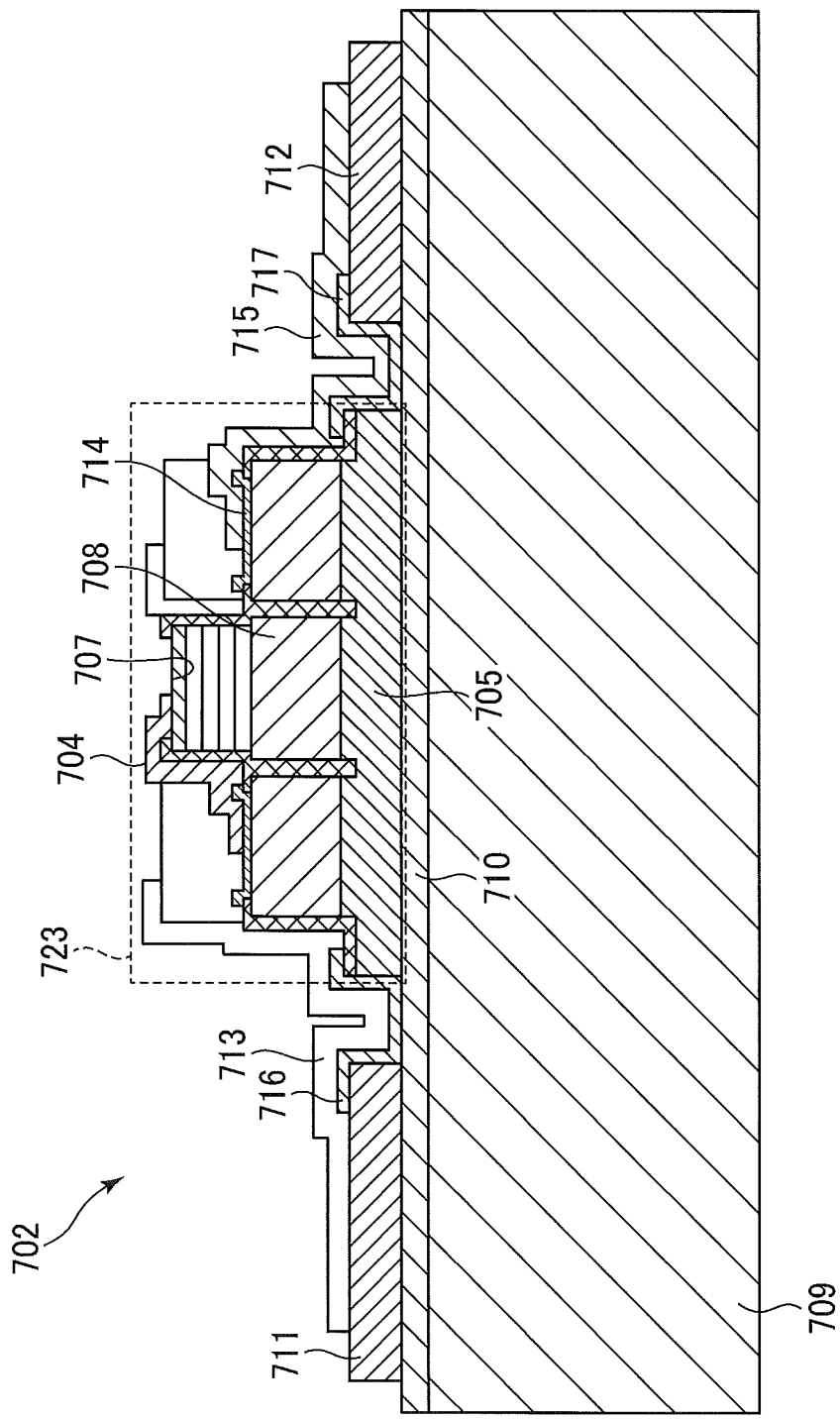
FIG. 41 is a cross-sectional view taken along a line S21-S21 in FIG. 40.
Figure 42:
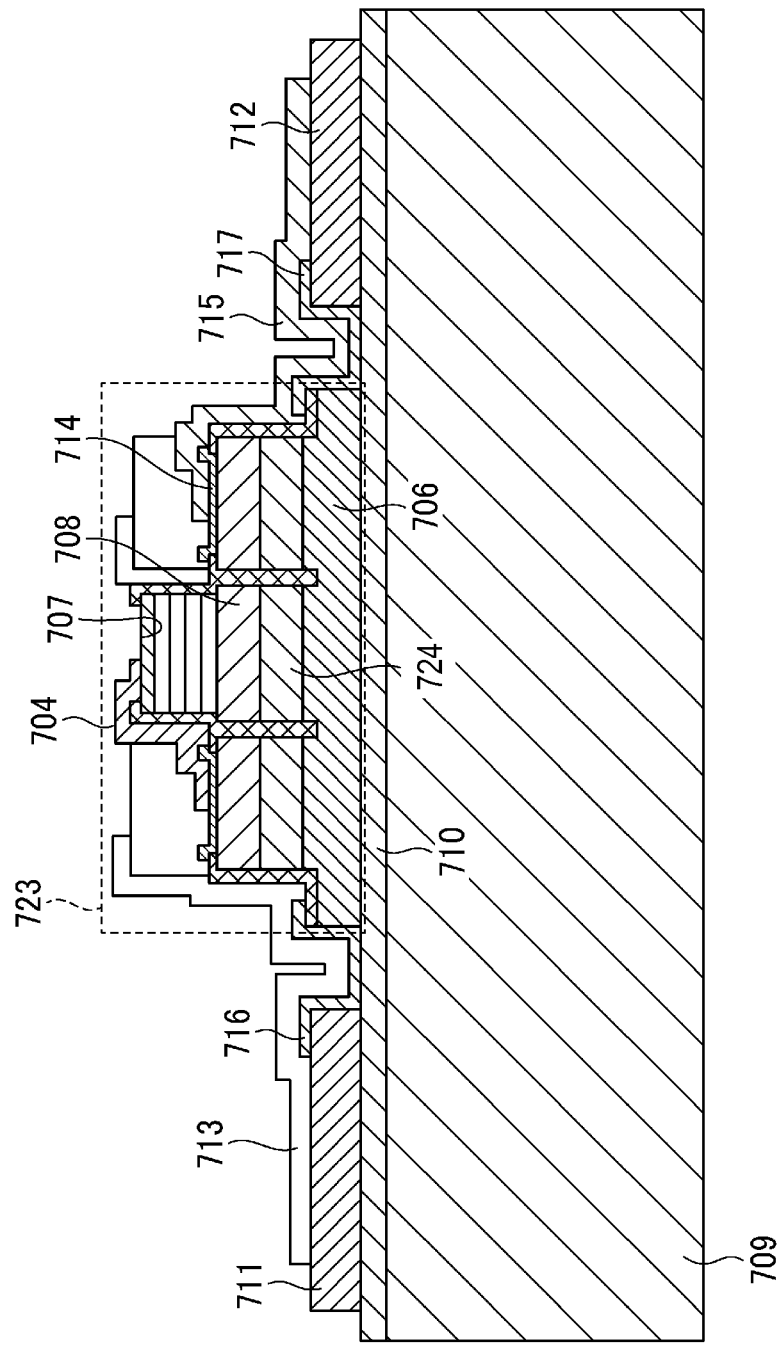
FIG. 42 is a cross-sectional view taken along a line similar to the line S21-S21 in FIG. 41.

FIGS. 40 and 41 illustrate the configuration of LED bare chips 702 that uses an LED thin film 723 for a semiconductor light emitting apparatus according to a sixteenth embodiment. FIG. 40 is a top view, and FIG. 41 is a cross-sectional view taken along a line S21-S21 in FIG. 40. FIG. 42 is a cross-sectional view taken along a line similar to the line S21-S21 in FIG. 41, illustrating the outline of a modification to the sixteenth embodiment.

A description will be given of the configuration of the LED thin film 723 and the LED bare chip 702 with reference to FIGS. 40-42. The LED thin film 723 includes a plurality of LEDs connected in series, and just as in the tenth and eleventh embodiments, is formed of a nitride semiconductor material (FIG. 41) or GaAs semiconductor material (FIG. 42).

Referring to FIGS. 41 and 42, just as in the tenth and eleventh embodiments, the LEDs implemented with the LED thin film 723 are interconnected in series or in parallel by means of junction wirings 704. An insulating bonding layer 705 shown in FIG. 41, LEDs 707, and a cathode contact layer 708 formed on a semiconductor bonding layer 706 may all be formed in the same manner as the tenth and eleventh embodiments.

Referring to FIG. 41, after all of the structures have been formed on, for example, a sapphire substrate (growth substrate) having a thickness larger than about 400 μm, the sapphire substrate may be lapped from its back side into the insulating bonding layer 705 until the remaining insulating bonding layer 705 has a thickness of several nano meters, thereby obtaining the LED thin film 723. The LED thin film 723 preferably has a total thickness not larger than 5 μm. Since the insulating bonding layer 705 is formed of an insulating material, the respective LEDs 707 are electrically independent of one another.

The LED thin film 723 incorporating series-connected LEDs (FIG. 42) may be formed as follows:

For example, a sacrificial layer, which may be etched away later, is epitaxially grown on a growth substrate and then the semiconductor bonding layer 706, and the LED structure are formed on the sacrificial layer. The sacrificial layer is then selectively etched away using an etchant suitable for selective etching, thereby detecting the LED structure from the growth substrate. The sacrificial layer may be an AlAs layer and the etchant may be hydrofluoric acid. The isolation layer 724 is formed between the semiconductor bonding layer 706 and the respective LEDs, so that the respective LEDs are electrically independent of one another. The isolation layer 724 may be formed of the same material as the tenth embodiment.

The insulating bonding layer 705 shown in FIG. 41 and the semiconductor bonding layer 706 shown in FIG. 42 preferably have a surface roughness of 2 nm, expressed in Rpv which is defined as the difference between a typical projection and a recess.

The LED thin film 723 is mounted on the insulating bonding layer 705 and semiconductor bonding layer 706 formed on an insulating coating film 710, which is formed on a host substrate 709. The insulating coating film 710 preferably has a typical surface roughness of 2 nm, expressed in Rpv. The LED thin film 723 may be attached to the insulating coating film 710 by means of, for example, an epoxy adhesive. The insulating coating film 710 may be an inorganic insulating film formed of, for example, SiN, $SiO_2$, or $Al_2O_3$, or an organic insulating film formed of, for example, polyimide, acrylic, nobolak or a fluorine-based material.

An anode electrode connection pad 711 and a cathode electrode connection pad 712 are formed on the host substrate 709 coated with the insulating coating film 710, being formed of a material whose major composition is Au or Al. The anode electrode connection pad 711 and cathode electrode connection pad 712 can be selectively shaped by photolithography.

The anode electrode connection pad 711 is connected to the top LED 707 of plurality of LEDs by means of a bridge wiring 713 (FIG. 41). The cathode electrode connection pad 712 is connected to the cathode electrode of the last LED 707 of plurality of LEDs by means of a bridge wiring 715. The bridge wirings 713 and 715 are formed of a material whose major composition is Au or Al, and are selectively shaped by photolithography.

In order for the bridge wirings 713 and 715 to be electrically isolated from the etched surface or exposed areas of the insulating bonding layer 705 and the semiconductor bonding layer 706, the bridge wirings 713 and 715 are formed on bridge interlayer dielectric films 716 and 717. The bridge interlayer dielectric films 716 and 717 are formed of an inorganic material, for example, SiN, $SiO_2$, or $Al_2O_3$ or an organic insulating material, for example, polyimide or nobolack.

Figure 43:
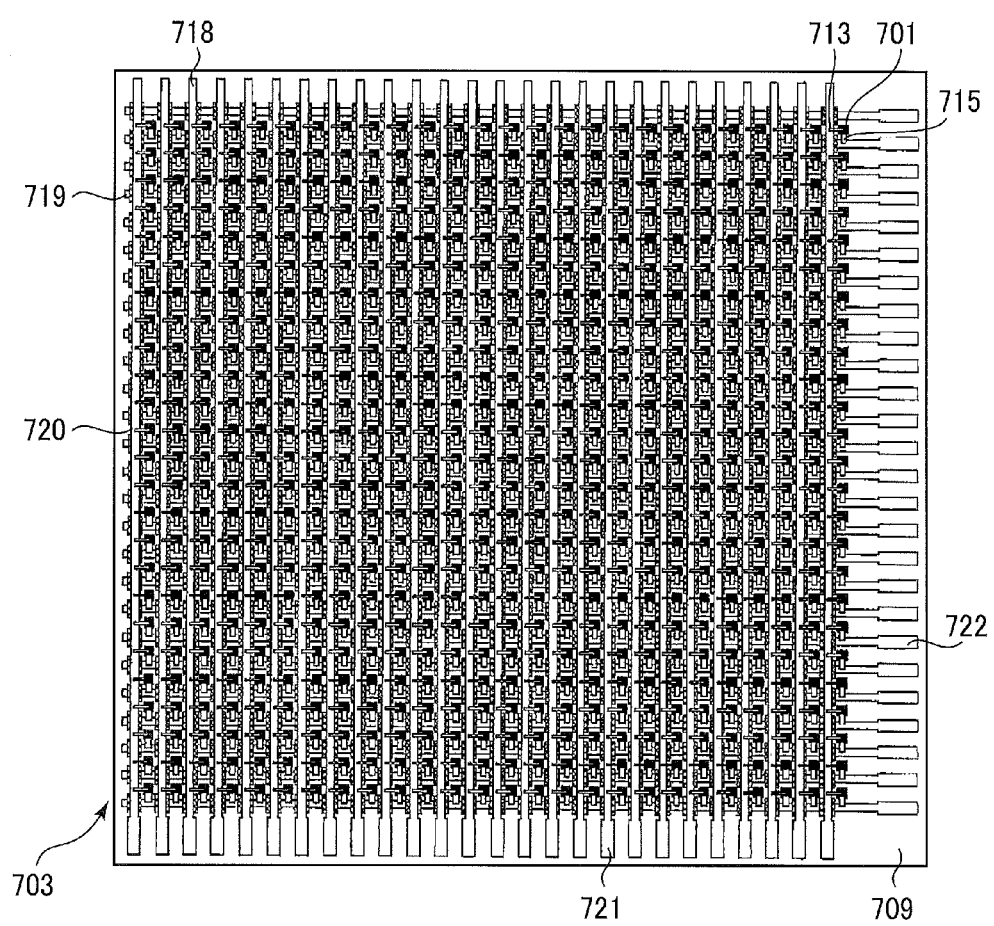
FIG. 43 is a top view of an LED array light emitting apparatus that employs the LED thin film.

FIG. 43 is a top view of an LED array light emitting apparatus 703 that employs the LED thin film 723. Anode common wirings 718 and cathode common wirings 719 are formed to form a matrix of m by n, the anode common wirings 718 representing columns and the cathode common wirings 719 representing rows. A interlayer dielectric film 720 is formed at each intersection of the anode common wiring 719 and the cathode common wiring 719, being formed of an inorganic material, for example, SiN, $SiO_2$, or $Al_2O_3$ or an organic insulating material, for example, polyimide or nobolack. The anode common wirings 718 and cathode common wirings 719 are formed to extend to the vicinity of the perimeter of the host substrate 709 where the common wirings 718 and 719 have a larger area that serves as an anode common wiring 721 and a cathode common wiring connection pad 722, respectively. The LED thin films 723 are disposed in matrix form so that each LED thin film 723 is at a corresponding intersection of the anode common wiring 719 and the cathode common wiring 719 and is connected to the anode common wiring 718 and the cathode common wiring 719 by means of the bridge wirings 713 and 715, respectively. In this manner, the LED array light emitting apparatus 703 is obtained which employs the series-connected LED thin films 723.

The anode common wiring connection pads 721 and cathode common wiring connection pads 722 are connected to the anode output terminals and cathode output terminals of the driver circuit, respectively, thereby driving the LED array light emitting apparatus 703.

The employment of the series-connected LED thin films 723 makes it possible to connect the LED thin films to the anode electrode connection pads 711 and cathode electrode connection pads 712, which have been shaped previously by photolithography on the host substrate, using the bridge wirings 713 and 715. In other words, instead of forming relatively large pad electrodes on the LED thin films 723 formed of a relatively expensive compound semiconductor material, the relatively large anode electrode connection pads 711 and cathode electrode connection pads 712 may be formed on the host substrate 709 formed of a relatively inexpensive material, for example, silicon (Si). Thus, the material cost may be greatly reduced.

As described above, the LED thin film 701 includes a plurality of LEDs connected in series and has a greatly reduced chip size. The LEDs greatly reduced in chip size may be densely integrated in two dimension array form, thereby providing greatly improved high definition light emitting apparatus 703 shown in FIG. 23 as compared to the tenth and eleventh embodiments.

{Effects of Sixteenth Embodiment}

Employing series-connected LEDs as an LED array light emitting apparatus implements an LED array light emitting apparatus with a higher luminance than the prior art for the same amount of injected current.

Employing series-connected LED thin films provides series-connected LED bare chips formed of a relatively expensive semiconductor material in a smaller size.

The bare chip LEDs having a greatly reduced size enables integration of the bare chip LEDs in a two-dimensional array, thereby realizing an LED array light emitting apparatus with a high luminance.

Seventeenth Embodiment

{Configuration and Operation}

Figure 44A:
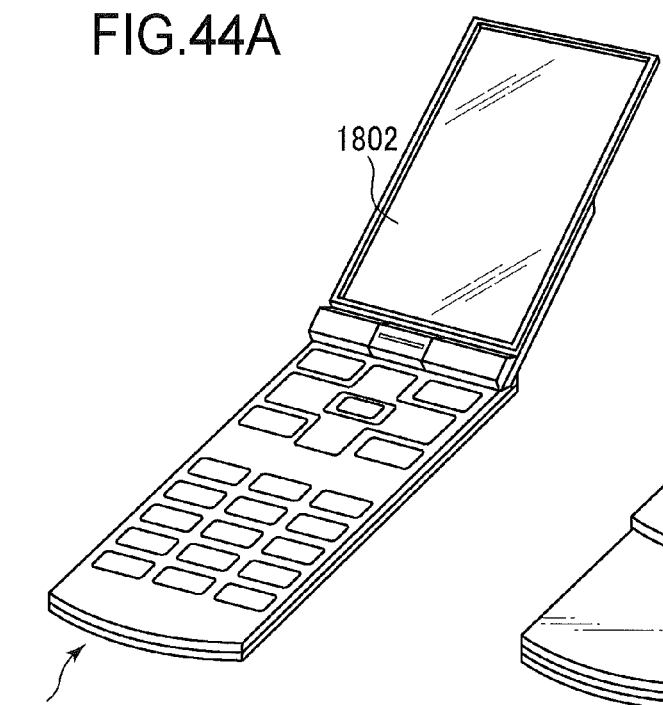
FIGS. 44A and 44B are perspective views, illustrating a mobile terminal implemented with an image displaying apparatus according to a seventeen embodiment.
Figure 44B:
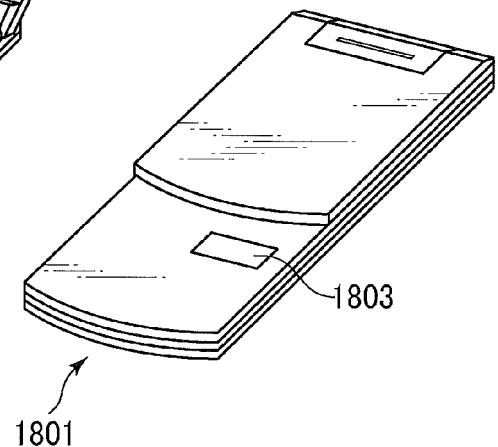

FIGS. 44A and 44B are perspective views, illustrating a mobile terminal 1801 implemented with an image displaying apparatus according to a seventeenth embodiment. The image displaying apparatus employs an LED array light emitting apparatus according to the sixteenth embodiment. One example of the image displaying apparatus for the mobile terminal 1801 includes a main monitor 1802 and an auxiliary monitor 1803. The main monitor 1802 usually displays information about dial operation, address book, edition and content of emails, browsing of the internet contents, and reception of One Seg. The auxiliary monitor 1803 displays time, condition of incoming radio wave, and partial information about incoming calls.

The mobile terminal 1801 is often used outdoors. If the main monitor 1802 and auxiliary monitor 1803 have insufficient luminance, their viewability is poor, necessitating to block environmental light from entering before the user can properly read the displayed information. When the main monitor 1802 and the auxiliary monitor 1803 are a conventional liquid crystal display (LCD), if the back light output is increased in an attempt to increase their luminance, power consumption will also increase, resulting in a significantly increased amount of heat. Employing the image displaying apparatus according to the sixteenth embodiment increases the luminance at greatly reduced amount of injected current. Also, the use of the LED array light emitting apparatus implemented with the series-connected LED thin films 723 according to the sixteenth embodiment enables a densely packed display apparatus with high luminance and high definition.

{Effects of Seventeenth Embodiment}

The seventeenth embodiment uses monitors implemented with the LED array light emitting apparatus according to the sixteenth embodiment, and therefore realizes monitors with a greatly increased high light output.

The use of series-connected LED thin films implements small size semiconductor light emitting chips formed of a relatively expensive semiconductor material.

The seventeenth embodiment realizes LED chips greatly reduced in size, and therefore implements integration in highly packed two dimension array form. This leads to a high definition and high luminance LED array light emitting apparatus, which has high viewability suitable for the main monitor and auxiliary monitor of the mobile terminal.

Eighteenth Embodiment

{Configuration and Operation}

Figure 45:
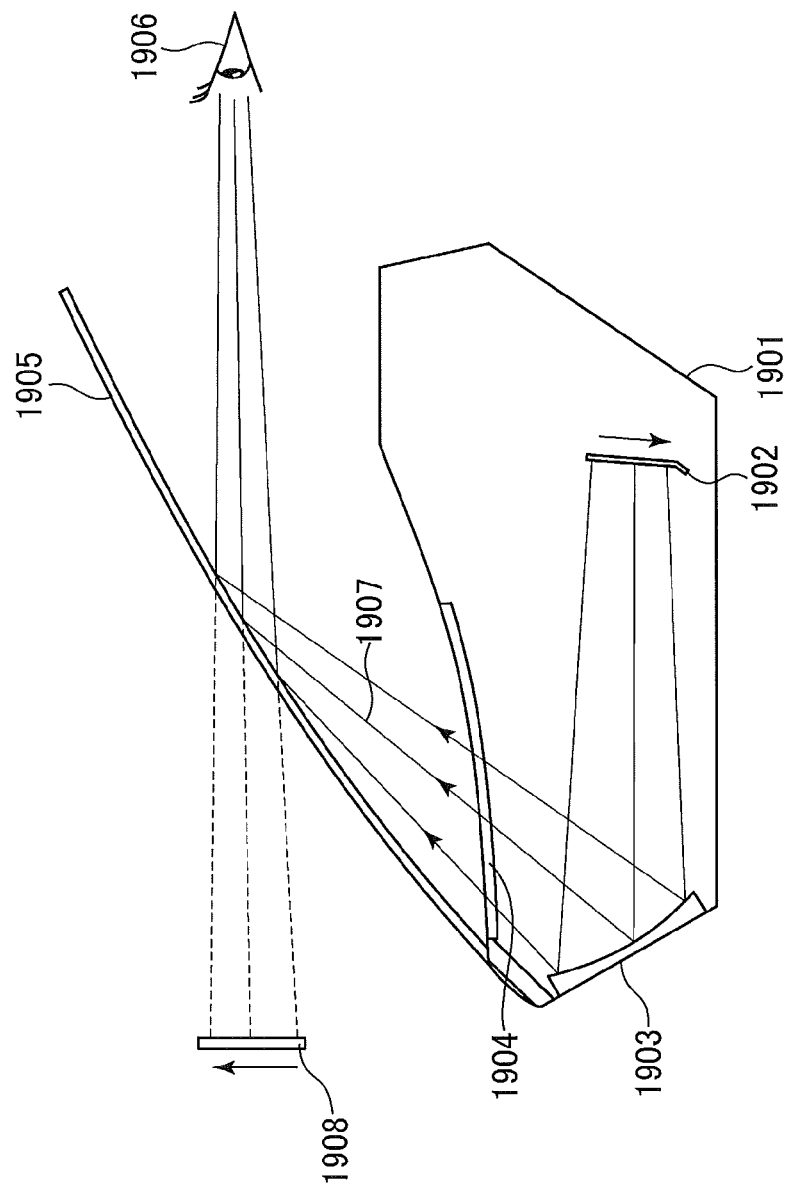
FIG. 45 illustrates the outline of a head-up display (HUD) unit and a light path as an image display apparatus according to an eighteenth embodiment.

FIG. 45 illustrates the outline of a head-up display (HUD) unit and a light path 1907 as an image display apparatus according to an eighteenth embodiment. The HUD unit 1901 includes an LED array light emitting apparatus and displays an image viewed by, for example, a driver on a car. A HUD light source apparatus 1902, which projects an inverted image, is positioned between a concave mirror 1903 as a turning mirror and the focal plane of the concave mirror 1903. The magnification of the concave mirror 1903 is determined by the position of the HUD light source apparatus 1902 relative to the concave mirror 1903 within the focal distance of the concave mirror 1903. The HUD light source apparatus 1902 is an LED array light emitting apparatus which has a plurality of lamp type LED modules arranged in a matrix, each lamp type LED module having the configuration according to any one of the tenth to twelfth embodiments.

A concave mirror 1903 converts the image displayed on the HUD light source apparatus 1902 into an erect virtual image. The erect virtual image passes through a transparent cover 1904 disposed on the HUD unit 1901, and is reflected by a windshield 1905 into the eyes of the viewer. The image is reflected by the concave mirror 1903 to become an erect virtual image before entering the viewer's eyes 1906. For this reason, the HUD projects an inverted image. Since the windshield 1905 reflects a magnified erect virtual image, the driver sees the displayed image 1908 which is a virtual image behind the windshield 1905.

{Effects of Eighteenth Embodiment}

Since the HUD light source apparatus 1902 employs lamp type LED modules according to the tenth to twelfth embodiments, the amount of current required for the desired luminance may be greatly reduced as compared to the conventional LED array light emitting apparatus, hence reduced heat generation and increased luminance without sacrificing light extraction efficiency.

The high density package implemented with the eighteenth embodiment enables a high definition image to be displayed. The eighteenth embodiment is effective in preventing the surrounding integrated circuits from being affected by the generated heat.

Furthermore, the heat sink may be smaller or simplified. Thus, the overall size of a HUD may be made smaller. Conventionally, a HUD is expensive and requires a relatively large instrument panel so that the HUD may be mounted only on luxury cars. However, the HUD 1901 according to the eighteenth embodiment requires a relatively small space and therefore may also be mounted on economy cars having a relatively small instrument panel.

The HUD unit 1901 according to the eighteenth embodiment can be smaller than conventional HUDs, implementing a popup HUD as an add-on in a car.

Using the series-connected thin film LEDs makes it possible to implement small size semiconductor light emitting elements formed of a relatively expensive material, thereby reducing the material cost.

The greatly reduced chip size is suitable for the integration of a high density two dimensional array, implementing a high definition LED array light emitting apparatus. Thus, the use of such an LED array light emitting apparatus provides an image displaying apparatus with good viewability.

A reduction of the amount of current leads to less heat generation, simplifying and miniaturizing the structure of the heat sink so that a much smaller HUD unit can be realized.

Nineteenth Embodiment

{Configuration and Operation}

Figure 46:
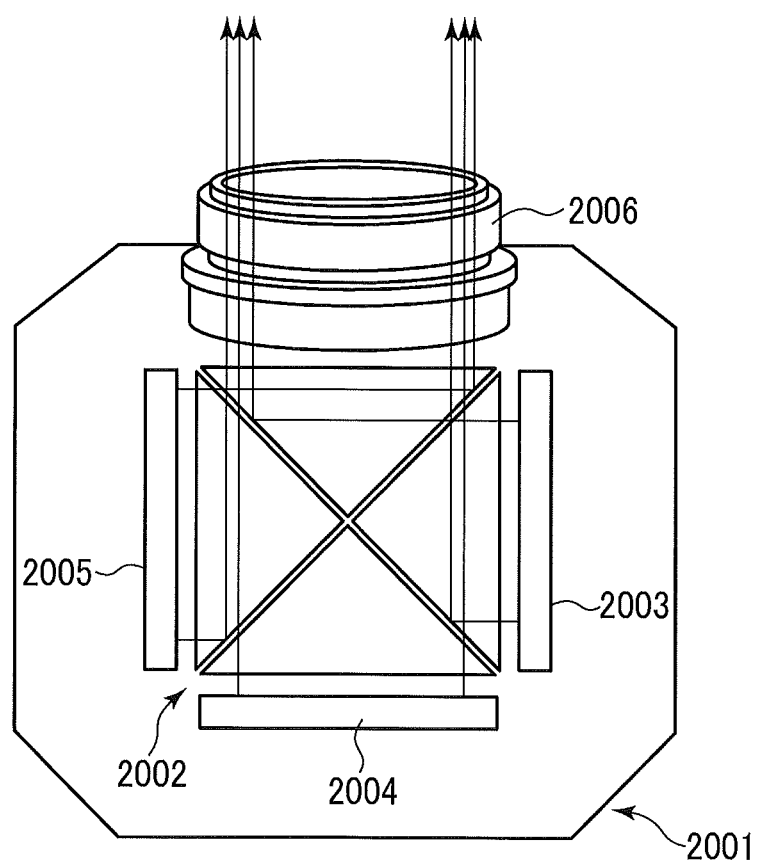
FIG. 46 illustrates the outline of a projector as an image display apparatus according to a nineteenth embodiment.

FIG. 46 illustrates the outline of a projector 2001 as an image display apparatus according to a nineteenth embodiment. The projector 2001 employs an LED array light emitting apparatus, and incorporates a cross dichroic prism 2002 therein. LED array light emitting apparatuses 2003, 2004, and 2005 for red images, blue images, and green images, respectively, are disposed to face the light incident surfaces of the cross dichroic prism 2002. Each LED array light emitting apparatus includes a plurality of lamp type LED modules arranged in a matrix. The lamp type LED module has the configuration of lamp type LED module according to the nineteenth to twelfth embodiments. The cross dichroic prism 2002 guides the images emitted from the LED array light emitting apparatuses 2003, 2004, and 2005 in a direction (upward in FIG. 46) in which the images are projected, thereby synthesizing the images of the respective colors into a full color image. The lens 2006 determines the magnification and focus of the color image emitted from the cross dichroic prism 902, and forms the image on the screen.

{Effects of Nineteenth Embodiment}

The matrix arrangement of the lamp type LED modules according to the tenth to twelfth embodiments provides a desired luminance while reducing the injected current greatly so that the images can be displayed with improved luminance while maintaining the light extraction efficiency of the LEDs.

The projector implemented with the nineteenth embodiment is effective in preventing the surrounding integrated circuits from being affected by the generated heat, requiring a small size and simplified heat sink, hence a projector with greatly reduced in size.

The nineteenth embodiment, which employs lamp type LED modules incorporating series-connected thin film LEDs, makes it possible to implement a high density lamp type LED module suitable for implementing a high luminance, high definition image displaying apparatus. This configuration of a lamp type LED module reduces the amount of use of a relatively expensive semiconductor material, hence reduced material cost.

The invention being thus described, it will be obvious that the same may be varied in many ways. Such variations are not to be regarded as a departure from the scope of the invention, and all such modifications as would be obvious to one skilled in the art are intended to be included within the scope of the following claims.

What is claimed is:

1. A semiconductor light emitting apparatus, comprising:
   a substrate;
   a plurality of first electrode wirings formed on a surface of the substrate;
   at least one second electrode wiring formed on the surface of the substrate; and
   a light emitting section connected between a corresponding one of the plurality of first electrode wirings and the at least one second electrode wiring, the light emitting section including a plurality of light emitting elements connected in series,
   wherein each of the plurality of light emitting elements includes a first electrode and a second electrode;
   wherein the light emitting section includes:
      a first connection that connects between the first electrode wiring and the first electrode of a light emitting element at the most upstream end with respect to current flowing through the light emitting section;
      a second connection that connects between the first electrode of one of two adjacent light emitting elements and the second electrode of the other of the two adjacent light emitting elements; and
      a third connection that connects between the second electrode wiring and the second electrode of a light emitting element at the most downstream end with respect to the current flowing through the light emitting section.

2. The semiconductor light emitting apparatus according to claim 1, wherein the first connection is a bonding wire that connects between the first electrode wiring and the first electrode of the light emitting element at the most upstream end;
   the second connection includes a first die bond pad that is formed on the substrate and a bonding wire that connects between the second electrode of one of two adjacent light emitting elements and the first electrode of the other of two adjacent light emitting elements; and
   the third connection is a second die bond pad that is continuous to the second electrode wiring and connects between the second electrode of the light emitting element at the most downstream end.

3. The semiconductor light emitting apparatus according to claim 1, wherein the first connection is a bonding wire that connects between the first electrode wiring and the first electrode of the light emitting element at the most upstream end;
   the second connection is a bonding wire that connects between the second electrode of one of two adjacent light emitting elements and the first electrode of the other of two adjacent light emitting elements; and
   the third connection is a bonding wire that connects between the second electrode wiring and the second electrode of the light emitting element at the most downstream end.

4. The semiconductor light emitting apparatus according to claim 1, wherein the first connection includes a first junction pad formed on the substrate and a bump, the first junction pad being continuous to the first electrode wiring and the bump connecting between the first junction pad and the first electrode of the light emitting element at the most upstream end;
   the second connection includes a second junction pad formed on the substrate and a first bump, and a second bump, the second bump connecting between the second junction pad and the second electrode of one of two adjacent light emitting elements and the second bump connecting between the second junction pad and the first electrode of the other of two adjacent light emitting elements; and the third connection includes a third junction pad continuous to the second electrode wring and a bump that connects between the third junction pad and the second electrode of the light emitting element at the most downstream end.

5. The semiconductor light emitting apparatus according to claim 1, wherein the first connection is a wiring formed by photolithography and connects between the first electrode wiring and the first electrode of a light emitting element at the most upstream end with respect to current flowing through the light emitting section, the second connection is a wiring formed by photolithography and connects between the first electrode of one of two adjacent light emitting elements and the second electrode of the other of the two adjacent light emitting elements, and the third connection is a wiring formed by photolithography and connects between the second electrode wiring and the second electrode of a light emitting element at the most downstream end with respect to the current flowing through the light emitting section.

6. The semiconductor light emitting apparatus according to claim 1, wherein the second connection is formed of a thin film wiring layer.

7. The semiconductor light emitting apparatus according to claim 6, wherein the plurality of light emitting elements are disposed so that a cathode electrode of one of adjacent light emitting elements and an anode of the other of the adjacent light emitting elements are positioned side by side.

8. The semiconductor light emitting apparatus according to claim 6, wherein the plurality of light emitting elements are aligned in a single row.

9. The semiconductor light emitting apparatus according to claim 6, wherein the plurality of light emitting elements are aligned in a plurality of rows.

10. The semiconductor light emitting apparatus according to claim 6, wherein the plurality of light emitting elements are formed of a nitride semiconductor material.

11. The semiconductor light emitting apparatus according to claim 6, wherein the plurality of light emitting elements are formed of GaAs semiconductor material; and the substrate is formed of a GaAs material;

wherein an isolation layer, formed of a GaAs material, is sandwiched between the light emitting elements and the substrate so that the light emitting elements and the substrate are electrically isolate from each other.

12. An image displaying apparatus incorporating the semiconductor light emitting apparatus according to claim 1, wherein the image displaying apparatus further comprises:

a driver apparatus that drives the semiconductor light emitting apparatus to display an image; and a power supply that supplies electric power to the driver apparatus.

13. The image displaying apparatus according to claim 12, wherein the light emitting section emits light corresponding to a single pixel of the image.

14. The image displaying apparatus according to claim 12, wherein the light emitting section emits light corresponding to a single pixel of the image of a single color.

15. A mobile terminal incorporating the image displaying apparatus according to claim 12.

16. A head-up display apparatus incorporating the image displaying apparatus according to claim 12, wherein the head-up display further comprises:

a projector that projects an image displayed on the image displaying apparatus onto a windshield of a car.

17. An image projector incorporating the image displaying apparatus according to claim 12, wherein the image projector further comprises:

a projector that projects an image displayed on the image displaying apparatus onto a screen.

18. A head-mounted display apparatus incorporating the image displaying apparatus according to claim 12, wherein the image projector further comprises:

a body;

a reflector mounted on the body, the reflector reflecting the image displayed on the image displaying apparatus; and a support that supports the body on a user's head.

19. An image forming apparatus incorporating an exposing apparatus including the semiconductor light emitting apparatus according to claim 1.

* * * * *